(12) United States Patent
Niu et al.

(10) Patent No.: US 11,907,467 B2
(45) Date of Patent: Feb. 20, 2024

(54) TOUCH SENSOR AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Wenxiao Niu, Beijing (CN); Hengzhen Liang, Beijing (CN); Qing Gong, Beijing (CN); Shiheng Mu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 209 days.

(21) Appl. No.: 17/427,423

(22) PCT Filed: Mar. 19, 2020

(86) PCT No.: PCT/CN2020/080190
§ 371 (c)(1),
(2) Date: Jul. 30, 2021

(87) PCT Pub. No.: WO2021/184294
PCT Pub. Date: Sep. 23, 2021

(65) Prior Publication Data
US 2022/0317850 A1 Oct. 6, 2022

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0412* (2013.01); *G06F 3/0446* (2019.05);
(Continued)

(58) Field of Classification Search
CPC .. G06F 3/04164; G06F 3/0412; G06F 3/0446; G06F 2203/04111;
(Continued)

(56) References Cited

U.S. PATENT DOCUMENTS 11,056,672 B2 7/2021 Huang et al.
2010/0182275 A1 7/2010 Saitou
(Continued)

FOREIGN PATENT DOCUMENTS

CN 103941925 A 7/2014
CN 206209663 U 5/2017
(Continued)

OTHER PUBLICATIONS

International Search Report of PCT/CN2020/080188 in Chinese, dated Dec. 16, 2020 with English translation.
(Continued)

*Primary Examiner* — Adam R. Giesy
(74) *Attorney, Agent, or Firm* — Collard & Roe, P.C.

(57) ABSTRACT

A touch sensor and a display apparatus are disclosed. The touch sensor includes a first opening region, first touch electrodes and second touch electrodes. The first touch electrodes respectively extend along a first direction, and at least one of the first touch electrodes includes first touch sub-electrodes arranged side by side in the first direction and electrically connected with each other; the second touch electrodes respectively extend along a second direction, and at least one of the second touch electrodes includes second touch sub-electrodes arranged side by side in the second direction and electrically connected with each other; an area of a first touch sub-electrode in the first region is less than that of a first touch sub-electrode in the third region, or an area of a second touch sub-electrode in the first region is less than that of a second touch sub-electrode in the third region.

19 Claims, 24 Drawing Sheets

(51) Int. Cl.
*H10K 59/40* (2023.01)
*H10K 59/131* (2023.01)

(52) U.S. Cl.
CPC ........... *H10K 59/131* (2023.02); *H10K 59/40* (2023.02); *G06F 2203/04111* (2013.01); *G06F 2203/04112* (2013.01)

(58) Field of Classification Search
CPC ......... G06F 2203/04112; G06F 3/0443; G06F 3/0448; H10K 59/131; H10K 59/40
See application file for complete search history.

(56) References Cited

U.S. PATENT DOCUMENTS

| | | | |
|---|---|---|---|
| 2013/0341651 A1 | 12/2013 | Kim et al. | |
| 2015/0220179 A1 | 8/2015 | Kimura | |
| 2020/0064968 A1* | 2/2020 | Kim | G06F 3/0448 |
| 2021/0096697 A1* | 4/2021 | Do | G06F 3/0448 |
| 2021/0333930 A1 | 10/2021 | Zhao | |
| 2021/0397320 A1* | 12/2021 | Ye | G06F 3/04164 |

FOREIGN PATENT DOCUMENTS

| | | |
|---|---|---|
| CN | 107359185 A | 11/2017 |
| CN | 107885389 A | 4/2018 |
| CN | 108008855 A | 5/2018 |
| CN | 109885200 A | 6/2019 |
| CN | 110007804 A | 7/2019 |
| CN | 110286797 A | 9/2019 |
| WO | 2019/024564 A1 | 2/2019 |

OTHER PUBLICATIONS

Notice of Transmittal of the International Search Report of PCT/CN2020/080188 in Chinese, dated Dec. 16, 2020.
Written Opinion of the International Searching Authority of PCT/CN2020/080188 in Chinese, dated Dec. 16, 2020.
International Search Report of PCT/CN2020/080241 in Chinese, dated Dec. 23, 2020 with English translation.
Notice of Transmittal of the International Search Report of PCT/CN2020/080241 in Chinese, dated Dec. 23, 2020.
Written Opinion of the International Searching Authority of PCT/CN2020/080241 in Chinese, dated Dec. 23, 2020.
Written Opinion of the International Searching Authority of PCT/CN2020/080190, dated Nov. 25, 2020 in English.
International Search Report of PCT/CN2020/080190 in Chinese, dated Nov. 25, 2020 with English translation.
Notice of Transmittal of the International Search Report of PCT/CN2020/080190 in Chinese, dated Nov. 25, 2020.
Written Opinion of the International Searching Authority of PCT/CN2020/080190 in Chinese, dated Nov. 25, 2020.
U.S. Office Action in U.S. Appl. No. 17/428,014 dated May 9, 2023.
Extended European Search Report in European Application No. 20925076.0 dated Mar. 9, 2023.

* cited by examiner

TOUCH SENSOR AND DISPLAY APPARATUS

CROSS REFERENCE TO RELATED APPLICATIONS

This application is the National Stage of PCT/CN2020/080190 filed on Mar. 19, 2020, the disclosure of which is incorporated by reference.

TECHNICAL FIELD

Embodiments of the present disclosure relate to a touch sensor and a display apparatus.

BACKGROUND

An Organic Light Emitting Diode (OLED) display device has characteristics of wide viewing angle, high contrast, fast response speed, wide color gamut, high screen-to-body ratio, self-illumination, lightness, thinness and the like. In addition, compared to an inorganic light emitting display device, an OLED display device has advantages of higher light emitting luminance, lower driving voltage and the like. Due to the characteristics and advantages above, OLED display devices have gradually received people's widespread attention and can be applied to apparatuses with a display function, such as a mobile phone, a display, a laptop, a smart watch, a digital camera, instrument and meter, a flexible wearable apparatus and the like. With further development of a display technology, a display apparatus with a full-screen has become a development trend of the display technology in the future.

SUMMARY

At least an embodiment of the present disclosure provides a touch sensor, which includes: a first opening region, a plurality of first touch electrodes and a plurality of second touch electrodes. A center of the first opening region and a center of the touch sensor do not coincide; the plurality of first touch electrodes respectively extend along a first direction, and at least one of the plurality of first touch electrodes includes a plurality of first touch sub-electrodes arranged side by side in the first direction and electrically connected with each other; the plurality of second touch electrodes respectively extend along a second direction intersecting with the first direction, and at least one of the plurality of second touch electrodes includes a plurality of second touch sub-electrodes arranged side by side in the second direction and electrically connected with each other; the plurality of first touch electrodes are arranged side by side along the second direction, and the plurality of second touch electrodes are arranged side by side along the first direction; and the plurality of first touch sub-electrodes and the plurality of second touch sub-electrodes together at least partially surround the first opening region; the touch sensor has a first region, a second region and a third region which are sequentially laid out in the second direction, the first opening region is positioned in the second region; and an area of a first touch sub-electrode in the first region is less than that of a first touch sub-electrode in the third region, or an area of a second touch sub-electrode in the first region is less than that of a second touch sub-electrode in the third region.

At least an embodiment of the present disclosure provides a touch sensor, which comprises: a first opening region, a plurality of first touch electrode and a plurality of second touch electrodes. A center of the first opening region and a center of the touch sensor do not coincide; the plurality of first touch electrodes respectively extend along a first direction, and at least one of the plurality of first touch electrodes comprises a plurality of first touch sub-electrodes arranged side by side in the first direction and electrically connected with each other; the plurality of second touch electrodes respectively extend along a second direction intersecting with the first direction, and at least one of the plurality of second touch electrodes comprises a plurality of second touch sub-electrodes arranged side by side in the second direction and electrically connected with each other; the plurality of first touch electrodes are arranged side by side along the second direction, and the plurality of second touch electrodes are arranged side by side along the first direction; and the plurality of first touch sub-electrodes and the plurality of second touch sub-electrodes together at least partially surround the first opening region; the touch sensor has a first region, a second region and a third region which are sequentially laid out in the second direction, the first opening region is positioned in the second region; and a distance between a first touch sub-electrode and a second touch sub-electrode that are adjacent in the first region is less than a distance between a first touch sub-electrode and a second touch sub-electrode that are adjacent in the third region.

At least an embodiment of the present disclosure provides a touch sensor, which comprises: a first opening region, a plurality of first touch electrodes, a plurality of second touch electrodes and a plurality of first connecting sub-electrodes. A center of the first opening region and a center of the touch sensor do not coincide; the plurality of first touch electrodes respectively extend along a first direction, and at least one of the plurality of first touch electrodes comprises a plurality of first touch sub-electrodes arranged side by side in the first direction and electrically connected with each other; the plurality of second touch electrodes respectively extend along a second direction intersecting with the first direction, and at least one of the plurality of second touch electrodes comprises a plurality of second touch sub-electrodes arranged side by side in the second direction and electrically connected with each other; the plurality of first touch electrodes are arranged side by side along the second direction, and the plurality of second touch electrodes are arranged side by side along the first direction; and the plurality of first touch sub-electrodes and the plurality of second touch sub-electrodes together at least partially surround the first opening region; the touch sensor has a first region, a second region and a third region which are sequentially laid out in the second direction, the first opening region is positioned in the second region; adjacent second touch sub-electrodes in the first region are electrically connected via a corresponding first number of first connecting sub-electrode; and adjacent second touch sub-electrodes in the third region are electrically connected via a corresponding second number of first connecting sub-electrode, and the second number is greater than the first number.

At least an embodiment of the present disclosure provides a display apparatus, which comprises the touch sensor of any one of above-mentioned embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
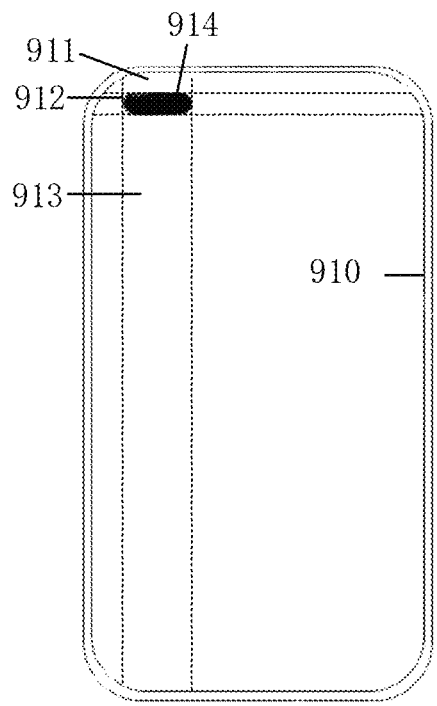
FIG. 1A shows a display apparatus adopting a technical solution in which perforation is carried out on a display screen.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Inventors of the present disclosure notice in research that in an early stage of development of a full-screen technology, in order to implement a full-screen display, research development and design personnel place an under-screen camera and various sensors (photosensitive elements) in a notch region of a display apparatus (e.g., a display screen of a mobile phone), and such display screen is called as a "notch screen". However, the "notch screen" is not a real full-screen display, because the "notch screen" still occupies a large display area of the display screen, resulting in disadvantageous influence on user experience.

The inventors of the present disclosure further notice in research that with development of the full-screen technology, in order to solve the problem of placement of an imaging sensor (e.g., a front camera) and various sensors (e.g., an infrared sensor) of the display apparatus, the technical solution of carrying out perforation in the display screen of the display apparatus can also be adopted, and in such a case, the imaging sensor (e.g., the front camera) and various sensors can be arranged at a position corresponding to a hole in the display screen. The hole in the display screen is positioned in a display region of the display screen, and thus, the hole in the display screen is also called as a hole in a display region (AA Hole) or an opening region of the display region (called as the opening region hereafter).

FIG. 1A shows a display apparatus adopting a technical solution in which perforation is carried out in a display screen. For example, as shown in FIG. 1A, the display screen of the display apparatus has a display region 910, the display region 910 includes an inactive display region 914 and an active display region surrounding the inactive display region 914. For example, the inactive display region 914 is not used for providing a displayed image.

For example, as shown in FIG. 1A, an opening region (which is not shown in FIG. 1A, with reference to FIG. 1B) is positioned in the inactive display region 914. For example, an imaging sensor (e.g., a front camera) and the inactive display region 914 of the display apparatus at least partially overlap in a direction perpendicular to a display surface of the display apparatus (or in a normal direction of the display surface of the display apparatus).

For example, as shown in FIG. 1A, the inactive display region 914 (the opening region) is positioned at a position of the display region 910 close to an upper edge of the display region 910, and the inactive display region 914 (the opening region) divides the display region 910 into a first region 911, a second region 912 and a third region 913 which are laid out side by side in a column direction of the display apparatus; and the inactive display region 914 (the opening region) is positioned in the second region 912, and the inactive display region 914 (the opening region) separates the first region 911 and the third region 913 from each other. For example, as shown in FIG. 1A, the size of the first region 911 in the column direction of the display apparatus is less than (for example, far less than) that of the third region 913 in the column direction of the display apparatus.

The inventors of the present disclosure notice in research that in an application occasion (e.g., a mobile phone game) where the display apparatus needs to be subjected to a landscape mode operation, the requirement of a user for touch performance of the first region 911 (e.g., the bottom left corner of the display screen) is relatively high. Therefore, the first region 911 not only needs to have a display function, but also needs to have a touch function. However, the inventors of the present disclosure further notice in research that due to the small size of the first region 911 in the column direction of the display apparatus, a portion of a touch sensor of the display apparatus positioned in the first region 911 provides a small amount of signals, resulting in limitation to touch performance of the first region 911.

For example, the touch sensor included in the display apparatus shown in FIG. 1A includes a plurality of first touch electrodes arranged side by side in the column direction of the display apparatus and a plurality of second touch electrodes arranged side by side in a row direction of the display apparatus; and each of the plurality of first touch electrodes includes a plurality of first touch sub-electrodes sequentially arranged in the row direction of the display apparatus and electrically connected with each other, and each of the plurality of second touch electrodes includes a plurality of second touch sub-electrodes sequentially arranged in the column direction of the display apparatus and electrically connected with each other. For example, a display panel of the display apparatus further includes data lines and gate lines, the data lines extend along the column direction of the display apparatus, and the gate lines extend along the row direction of the display apparatus.

The inventors of the present disclosure further notice in research that at least one of the plurality of first touch electrodes is separated into two portions by the opening region, at least one of the plurality of second touch electrodes is separated into two portions by the inactive display region 914 (the opening region), and in such a case, touch driving signals and touch sensing signals cannot be normally transmitted on the first touch electrodes and the second touch electrodes which are respectively separated into two portions, resulting in that regions where part of the first touch electrodes and part of the second touch electrodes of the touch sensor are positioned are poor in touch, and user experience is influenced.

The inventors of the present disclosure further notice in research that there may be a plurality of opening regions in the display screen, and the distance between the adjacent opening regions is relatively small, and thus, a touch pattern generally is not set in the region between the adjacent opening regions, so that a portion of the touch sensor included in the display apparatus corresponding to the region between the adjacent opening regions is a touch blind region, resulting in disadvantageous influence on user experience. The inventors of the present disclosure further notice in research that due to the relatively small distance between the adjacent opening regions, even though the touch pattern is set in the region between the adjacent opening regions, the touch sensing signal provided by the touch pattern positioned between the adjacent opening regions generally has a low signal-to-noise ratio, and in such a case, the portion of the touch sensor corresponding to the region between the adjacent opening regions is poor in touch performance.

The inventors of the present disclosure further notice in research that the touch pattern included in the touch sensor of the display apparatus and at least partially surrounding the opening region is relatively narrow in width (i.e., the size in the row direction of the display apparatus is relatively small), and channel impedance (e.g., resistance) is relatively high, resulting in an increase of the difficulty that an electric signal passes through the above-mentioned touch pattern at least partially surrounding the opening region and a risk of poor touch, caused by electrostatic discharge, in the small-size region of the above-mentioned touch pattern at least partially surrounding the opening region. In addition, the touch pattern at least partially surrounding the opening region further has a trustworthiness risk (e.g., an open circuit risk). Exemplary illustration will be carried out below in connection with FIG. 1B.

Figure 1B:
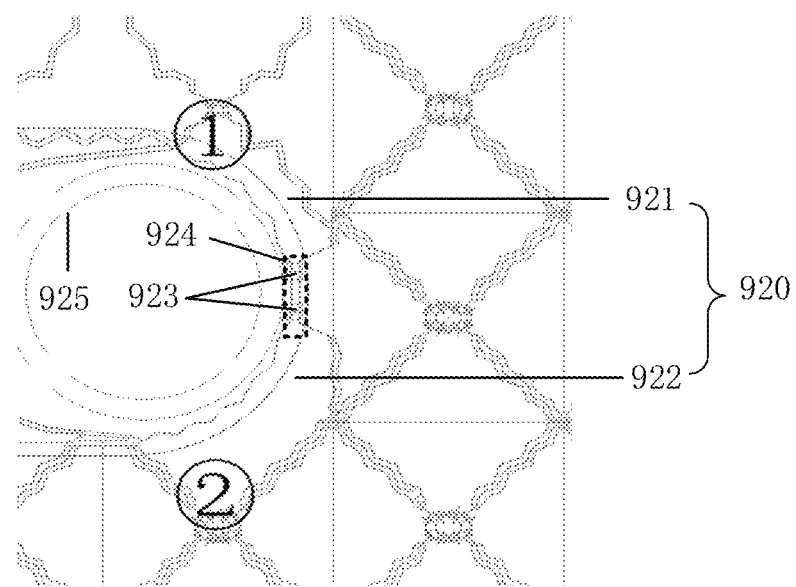
FIG. 1B shows a schematic diagram of a transition touch electrode of a touch sensor included in the display apparatus shown in FIG. 1A partially surrounding an opening region.

FIG. 1B shows a schematic diagram of a transition touch electrode 920, partially surrounding an opening region 925 and included in the touch sensor included in the display apparatus shown in FIG. 1A. For example, as shown in FIG. 1B, the opening region 925 has an arc edge portion adjacent to the transition touch electrode 920, and an arc edge portion in parallel with the arc edge portion of the opening region 925 is formed on one side of the transition touch electrode 920 close to an opening. For example, as shown in FIG. 1B, the transition touch electrode 920 includes a transition touch sub-electrode 921 (i.e., a sub-electrode with the reference sign ①) and a transition touch sub-electrode 922 (i.e., a sub-electrode with the reference sign ②) which are arranged side by side in the column direction of the display apparatus. For example, as shown in FIG. 1B, the transition touch electrode 920 is small in size in the row direction of the display apparatus and particularly in a region 924 of the transition touch electrode 920 overlapping with a connecting sub-electrode 923. For example, the region 924 of the transition touch electrode 920 overlapping with the connecting sub-electrode 923 is relatively narrow in width in the row direction of the display apparatus, and thus, the region 924 of the transition touch electrode 920 overlapping with the connecting sub-electrode 923 is relatively high in channel impedance (e.g., resistance) and poor in charge conductivity; in such a case, it is more difficult for the electric signal to pass through the region 924 of the transition touch electrode 920 overlapping with the connecting sub-electrode 923, and the region 924 of the transition touch electrode 920 overlapping with the connecting sub-electrode 923 has the risk of poor touch caused by electrostatic discharge (e.g., electrostatic breakdown); and in addition, the region 924 of the transition touch electrode 920 overlapping with the connecting sub-electrode 923 also has the trustworthiness risk (e.g., the open circuit risk).

The inventors of the present disclosure further notice in research that the opening region can be formed in the inactive display region 914 in a laser cutting mode. However, the inventors of the present disclosure further notice in research that a material for forming the touch electrode is relatively crisp, and thus, when the opening region is formed in the inactive display region 914 in the laser cutting mode, cracks may be formed; and in addition, a subsequent laminating process may cause further expansion of the cracks. For example, in the case that the cracks are expanded to enter an active touch region of the touch sensor (or a touch function region of the touch sensor), the cracks may cause poor touch. In addition, the inventors of the present disclosure further notice in research that the cracks may also provide a channel for electrostatic charge conduction, then electrostatic charges enter the active touch region (e.g., the active touch region around the opening region) of the touch sensor and are accumulated in the active touch region of the touch sensor, and the accumulated electrostatic charges may cause electrostatic breakdown in the active touch region around the opening region and then results in a poor touch function. The inventors of the present disclosure further notice in research that before emerging from a light emerging side of the display apparatus, light emitted by the display panel included in the display apparatus needs to pass through a plurality of film layers; and an interface between the adjacent film layers reflects part of the light emitted by the display panel into the opening region. For example, in the case that a light collecting surface of the imaging sensor of the display apparatus at least partially overlaps with the opening region, the light reflected into the opening region is incident to the light collecting surface of the imaging sensor, and thus results in reduction of a signal-to-noise ratio of an output image of the imaging sensor.

At least one embodiment of the present disclosure provides a touch structure, a touch sensor and a display apparatus. Nonrestrictive illustration will be carried out on the touch structure, the touch sensor and the display apparatus which are provided according to the embodiments of the present disclosure by several examples or embodiments, as described below, in the case of no mutual conflict, different characteristics in those specific examples or embodiments can be combined with each other so as to obtain new examples or embodiments, and those new examples or embodiments also shall fall within the scope of protection of the present disclosure.

Figure 2:
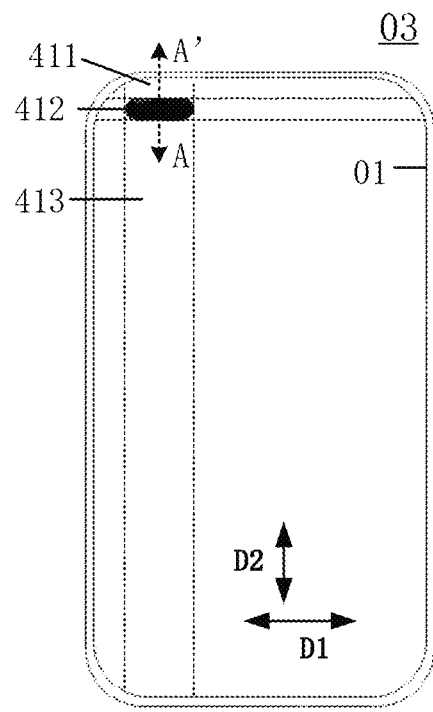
FIG. 2 is a plane schematic diagram of a display apparatus provided by at least one embodiment of the present disclosure.

FIG. 2 is a plane schematic diagram of a display apparatus provided by at least one embodiment of the present disclosure. As shown in FIG. 2, the display apparatus 03 includes any one touch sensor 01 provided by at least one embodiment of the present disclosure.

Figure 3A:
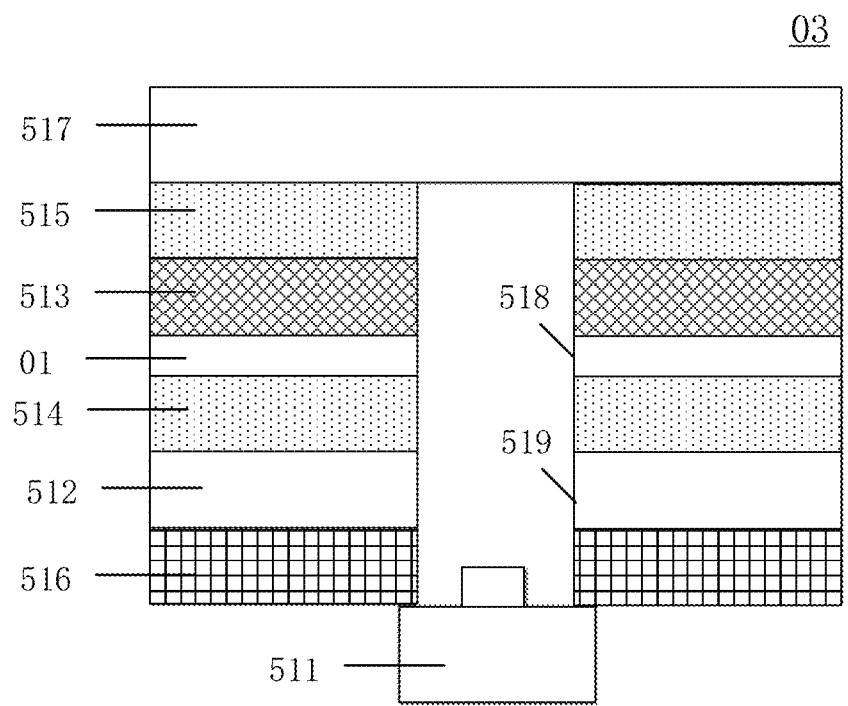
FIG. 3A is a sectional schematic diagram of the display apparatus shown in FIG. 2.

FIG. 3A is a sectional schematic diagram of the display apparatus 03 shown in FIG. 2, and the sectional schematic diagram shown in FIG. 3A corresponds to a line AA' shown in FIG. 2. For example, as shown in FIG. 3A, the display apparatus 03 further includes an imaging sensor 511 and a display panel 512.

For example, the imaging sensor 511 may be an imaging sensor, and can be used for acquiring an image of an external environment which a light collecting surface of the imaging sensor 511 faces, and for example, the imaging sensor 511 may be a Complementary Metal Oxide Semiconductor (CMOS) imaging sensor or a Charge Coupled Device (CCD) imaging sensor. For example, in the case that the display apparatus 03 is a mobile terminal such as a mobile phone and a notebook computer, the imaging sensor 511 can be used for implementing a camera of the mobile terminal such as the mobile phone and the notebook computer; and in addition, the display apparatus 03 can further include optical devices, e.g., a lens, a reflector or an optical waveguide and the like, as required so as to modulate a related optical path. For example, the imaging sensor 511 can include photosensitive pixels arranged in an array. For example, each photosensitive pixel can include a photosensitive detector (e.g., a photodiode and a phototransistor) and a switching transistor (e.g., a switching transistor). For example, the photodiode can convert an optical signal irradiated onto the photodiode into an electric signal, and the switching transistor can be electrically connected with the photodiode so as to control whether the photodiode is in a state of acquiring the optical signal and control time of acquiring the optical signal.

For example, the display panel 512 includes a display side and a non-display side which are opposite to each other, and the display panel 512 is configured to execute a display operation on the display side of the display panel 512, i.e., the display side of the display panel 512 is a light emerging side of the display panel 512 and faces a user. The display side and the non-display side are opposite in a normal direction of a display surface of the display surface 512. For example, the display panel 512 may be an OLED display panel, a Quantum-dot Light Emitting Diode (QLED) display panel or other applicable display panels, and the embodiments of the present disclosure do not make any limit to the specific type of the display panel.

For example, as shown in FIG. 3A, the touch sensor 01, the display panel 512 and the imaging sensor 511 are sequentially arranged in the normal direction of the display surface of the display apparatus 03 (e.g., in a direction perpendicular to the display panel 512), and the imaging sensor 511 is positioned on the non-display side of the display panel 512.

For example, as shown in FIG. 3A, the touch sensor 01 has an opening region 518, and the display panel 512 has an opening region 519; and the imaging sensor 511 is configured to receive and process an optical signal passing through the opening region 518 of the touch sensor 01 and the opening region 519 of the display panel 512. For example, the optical signal may be visible light, infrared light and the like.

For example, as shown in FIG. 3A, the opening region 518 of the touch sensor 01 and the opening region 519 of the display panel 512 at least partially overlap (e.g., fully overlap) in the normal direction of the display surface of the display apparatus 03. It should be noted that in the case that the display apparatus 03 further includes the optical devices for modulating the related optical path, such as the lens, the reflector or the optical waveguide and the like, the opening region 518 of the touch sensor 01 and the opening region 519 of the display panel 512 may not overlap in the normal direction of the display surface of the display apparatus 03.

In some examples, the touch sensor 01 and the display panel 512 may respectively have a plurality of opening regions (i.e., the display apparatus 03 has a plurality of opening regions), and the display apparatus 03 may also include other applicable sensors (e.g., the infrared sensor, a distance sensor or the like); and the imaging sensor 511 receives a signal via a first opening region of the plurality of opening regions of the display apparatus 03, and other sensors respectively receive related signals via other opening regions of the plurality of opening regions of the display apparatus 03.

For example, as shown in FIG. 3A, the display apparatus 03 can further include a polarizer 513. For example, as shown in FIG. 3A, the polarizer 513 is arranged on one side of the touch sensor 01 away from the display panel 512. For example, the polarizer 513 (e.g., a circular polarizer) can relieve problems of contrast deterioration and reduction of display quality caused by reflected light (derived from reflection of the display panel 512 on ambient light). For example, the polarizer 513 and the touch sensor 01 can be in direct contact.

For example, as shown in FIG. 3A, the display apparatus 03 can further include a heat dissipating layer 516. For example, as shown in FIG. 3A, the heat dissipating layer 516 is arranged on one side of the display panel 512 away from the touch sensor 01.

For example, as shown in FIG. 3A, the display apparatus 03 can further include a protective layer 517 (e.g., a cover plate). For example, as shown in FIG. 3A, the protective layer 517 is positioned on one side of the polarizer 513 away from the touch sensor 01. For example, the protective layer 517 can be used for protecting related film layers of the display apparatus from being scratched. For example, the protective layer 517 is a transparent substrate. For example, the transparent substrate may be a glass substrate, a quartz substrate, a plastic substrate (e.g., a polyethylene terephthalate (PET) substrate) or substrates made of other applicable materials.

For example, as shown in FIG. 3A, the display apparatus 03 can further include a first adhesive layer 514 and a second adhesive layer 515. For example, as shown in FIG. 3A, the first adhesive layer 514 is arranged between the display panel 512 and the touch sensor 01, and used for adhering the display panel 512 and the touch sensor 01. The second adhesive layer 515 is arranged between the protective layer 517 and the polarizer 513, and used for adhering the protective layer 517 and the polarizer 513. For example, the first adhesive layer 514 and the second adhesive layer 515 may be optical adhesives.

For example, as shown in FIG. 3A, the polarizer 513, the heat dissipating layer 516, the first adhesive layer 514 and the second adhesive layer 515 respectively have opening regions; the opening region 518 of the touch sensor 01, the opening region 519 of the display panel 512, the opening region of the polarizer 513, the opening region of the heat dissipating layer 516, the opening region of the first adhesive layer 514 and the opening region of the second adhesive layer 515 at least partially overlap (fully overlap) in the normal direction of the display surface of the display apparatus 03.

Several points below need to be illustrated.

(1) Although the touch sensor 01, the display panel 512, the polarizer 513, the heat dissipating layer 516, the first adhesive layer 514 and the second adhesive layer 515 of the display apparatus 03 shown in FIG. 3A all have the opening regions, the embodiments of the present disclosure are not limited thereto. For example, according to practical application demands, part of the touch sensor 01, the display panel 512, the polarizer 513, the heat dissipating layer 516, the first adhesive layer 514 and the second adhesive layer 515 of the display apparatus 03 (e.g., at least one of the touch sensor 01, the first adhesive layer 514 and the second adhesive layer 515) may not have the opening regions.

(2) Although the opening region 518 of the touch sensor 01, the opening region 519 of the display panel 512, the opening region of the polarizer 513, the opening region of the heat dissipating layer 516, the opening region of the first adhesive layer 514 and the opening region of the second adhesive layer 515 of the display apparatus 03 shown in FIG. 3A are all holes, the embodiments of the present disclosure are not limited thereto. For example, according to practical application demands, at least part of the opening region 518 of the touch sensor 01, the opening region 519 of the display panel 512, the opening region of the polarizer 513, the opening region of the heat dissipating layer 516, the opening region of the first adhesive layer 514 and the opening region of the second adhesive layer 515 may be not holes, but light-transmitting regions.

(3) Other components (e.g., a thin film transistor, a control apparatus, an image data encoding/decoding apparatus, a row scanning driver, a column scanning driver, a clock circuit and the like) of the display apparatus 03 can adopt applicable parts, which should be understood by those ordinary skilled in the related art, will not be repeated herein, and should not be regarded as the limitations to the present disclosure.

For example, a production method of the display apparatus 03 shown in FIG. 3A can include step S101 to step S107 below.

In the step S101: a laminated structure of the touch sensor 01 and the polarizer 513 is formed. For example, the touch sensor 01 can be directly provided on the polarizer 513, but the embodiments of the present disclosure are not limited thereto.

Figure 3B:
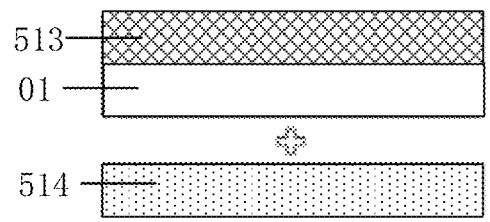
FIG. 3B to FIG. 3E show a process flow of the display apparatus shown in FIG. 3A.

In the step S102: the first adhesive layer 514 is adhered to the surface of the touch sensor 01 away from the polarizer 513 (referring to FIG. 3B).

Figure 3C:
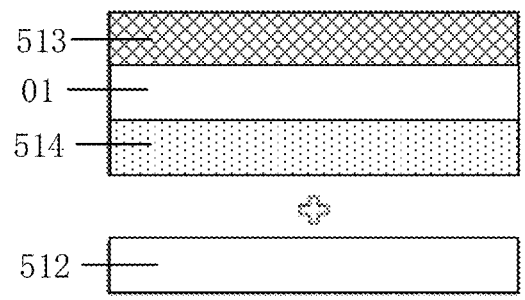

In the step S103: the display panel 512 is adhered to the surface of the first adhesive layer 514 away from the touch sensor 01 (referring to FIG. 3C).

Figure 3D:
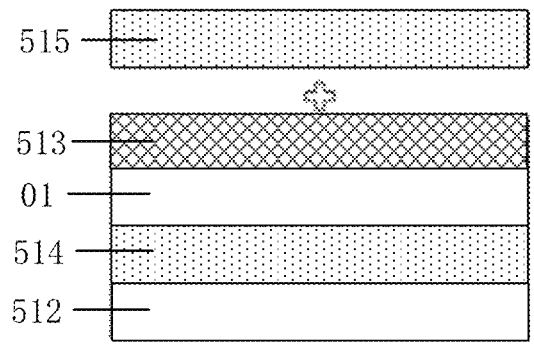

In the step S104: the second adhesive layer 515 is adhered to the surface of the polarizer 513 away from the touch sensor 01 (referring to FIG. 3D).

Figure 3E:
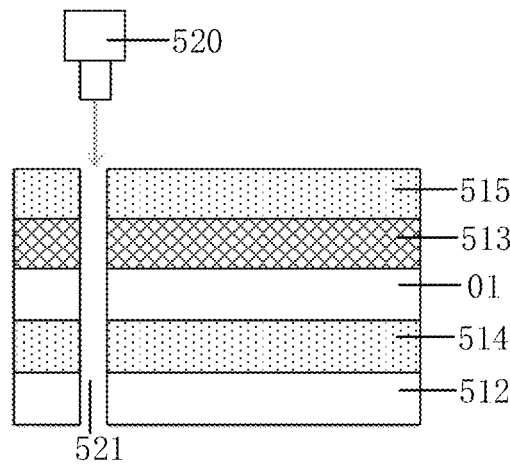

In the step S105: perforation is carried out in a region of a laminated structure of the second adhesive layer 515 corresponding to the opening region of the display apparatus 03, the polarizer 513, the touch sensor 01, the first adhesive layer 514 and the display panel 512 so as to form an opening region 521 of the display apparatus 03 (referring to FIG. 3E).

For example, the opening region 518 of the touch sensor 01 and the opening region 519 of the display panel 512 correspond to the opening region 521 of the display apparatus 03. For example, in the step S105, the region of the laminated structure corresponding to the opening region of the display apparatus 03 can be perforated by using a laser 520 so as to form the opening region 521 of the display apparatus 03.

In the step S106, the protective layer 517 is formed on one side of the second adhesive layer 515 away from the polarizer 513.

In the step S107, the light collecting surface of the imaging sensor 511 at least partially overlap with the opening region 521 of the display apparatus 03 in the normal direction of the display surface of the display apparatus 03.

In some examples, the production method of the display apparatus 03 shown in FIG. 3A further includes a step S108 below.

In the step S108, the heat dissipating layer 516 is formed on the surface of the display panel 512 away from the first adhesive layer 514. For example, the step S108 can be executed after the step S103 is executed and before the step S105 is executed. For example, in the case that the production method of the display apparatus 03 further includes the step S108, the step S105 includes: carrying out perforation on the region of the laminated structure of the second adhesive layer 515 corresponding to the opening region of the display apparatus 03, the polarizer 513, the touch sensor 01, the first adhesive layer 514, the display panel 512 and the heat dissipating layer 516 so as to form the opening region 521 of the display apparatus 03.

For example, as shown in FIG. 2, the touch sensor 01 included in the display apparatus has a first region 411, a second region 412 and a third region 413 which are sequentially laid out in a second direction D2. For example, a size of the third region 413 in the second direction D2 is greater than (e.g., far greater than) that of the first region 411 in the second direction D2. For example, as shown in FIG. 2, two edges of the first region 411 in the second direction D2 respectively coincide with an upper boundary of the touch sensor 01 and an upper boundary of the second region 412; and two edges of the third region 413 in the second direction D2 respectively coincide with a lower boundary of the second region 412 and a lower boundary of the touch sensor 01.

For example, the opening region of the touch sensor 01 is positioned in the second region 412, i.e., the opening region of the touch sensor 01 separates a partial region of the touch senor 01 into the first region 411 and the third region 413 laid out side by side in the second direction D2 and spaced from each other.

For example, the display panel 512 of the display panel 03 further includes data lines and gate lines, the data lines extend along the second direction D2, and the gate lines extend along a first direction D1 intersecting with (e.g., perpendicular to) the second direction D2.

Figure 4:
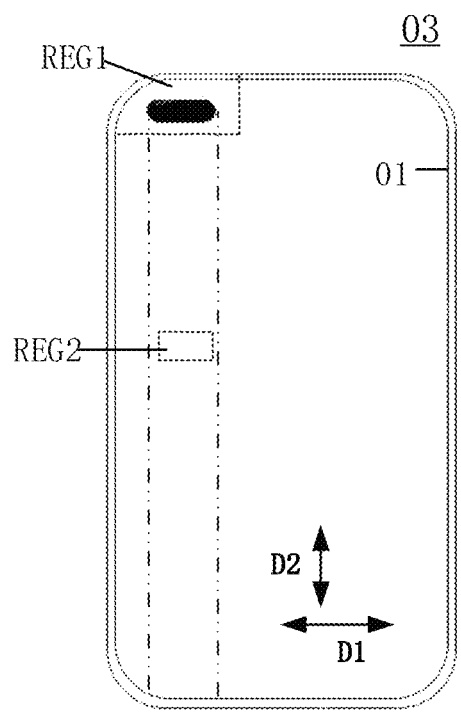
FIG. 4 is another plane schematic diagram of a display apparatus provided by at least one embodiment of the present disclosure.

FIG. 4 is another plane schematic diagram of a display apparatus provided by at least one embodiment of the present disclosure. As shown in FIG. 4, the touch sensor 01 included in the display apparatus 03 includes a region REG1 and a region REG2.

Figure 5:
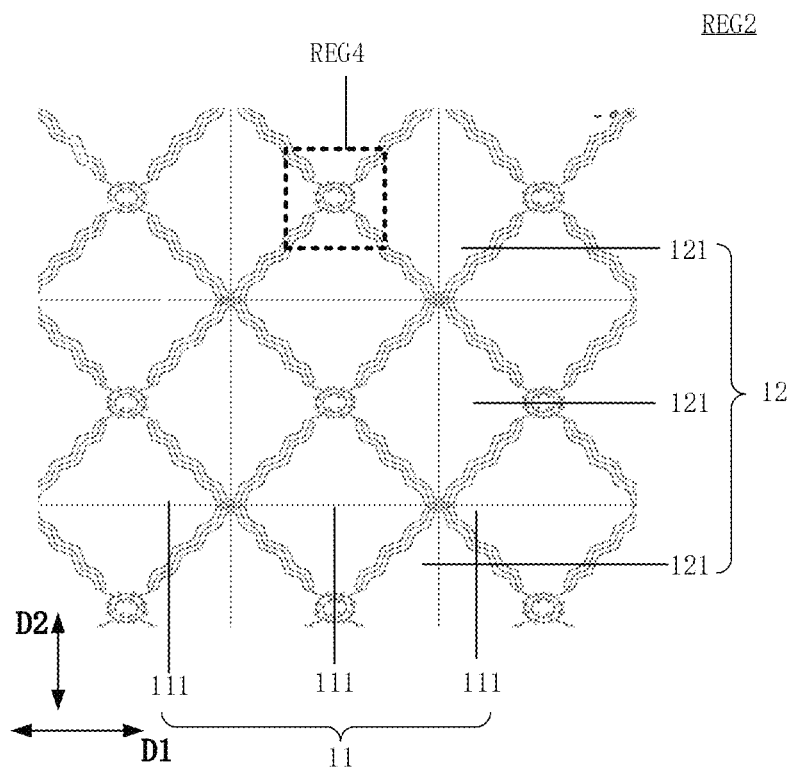
FIG. 5 is a schematic diagram of a partial region of a touch sensor included in the display apparatus shown in FIG. 4.

FIG. 5 is a schematic diagram of the partial region REG2 of the touch sensor 01 included in the display apparatus 03 shown in FIG. 4. For example, a structure of a region of the touch sensor 01 besides the region REG1 and a region in parallel with the region REG1 in the first direction D1 is the same or similar with that of the shown partial region REG2.

For example, as shown in FIG. 5, in the partial region REG2, the touch sensor 01 includes a plurality of first touch electrodes 11 and a plurality of second touch electrodes 12. For example, the first touch electrode 11 may be a touch sensing electrode Rx, the second touch electrode 12 may be a touch driving electrode Tx, but the embodiments of the present disclosure are not limited thereto. For example, the first touch electrode 11 may be the touch driving electrode Tx, and the second touch electrode 12 may be the touch sensing electrode Rx. For example, the display apparatus further includes a touch circuit (e.g., a touch chip) and a plurality of touch signal lines. For example, the touch circuit is electrically connected with the plurality of touch driving electrodes Tx and touch sensing electrodes Rx via the plurality of touch signal lines, and configured to provide touch driving signals to the plurality of touch driving electrodes Tx and receive touch sensing signals from the plurality of touch sensing electrodes Rx via the plurality of touch signal lines.

For example, as shown in FIG. 5, the plurality of first touch electrodes 11 respectively extend along the first direction D1; the plurality of second touch electrodes 12 respectively extend along the second direction D2 intersecting with the first direction D1; and the plurality of first touch electrodes 11 are arranged side by side along the second direction D2, and the plurality of second touch electrodes 12 are arranged side by side along the first direction D1. For example, as shown in FIG. 5, at least one (e.g., every one) of the plurality of first touch electrodes 11 includes a plurality of first touch sub-electrodes 111 arranged side by side along the first direction D1 and electrically connected with each other; and at least one (e.g., every one) of the plurality of second touch electrodes 12 includes a plurality of second touch sub-electrodes 121 sequentially arranged along the second direction D2 and electrically connected with each other. For example, the touch sensor 01 is a capacitive touch sensor. For example, the touch sensor 01 can detect a touch position on the basis of at least one of a mutual capacitance principle and a self-capacitance principle.

Figure 6A:
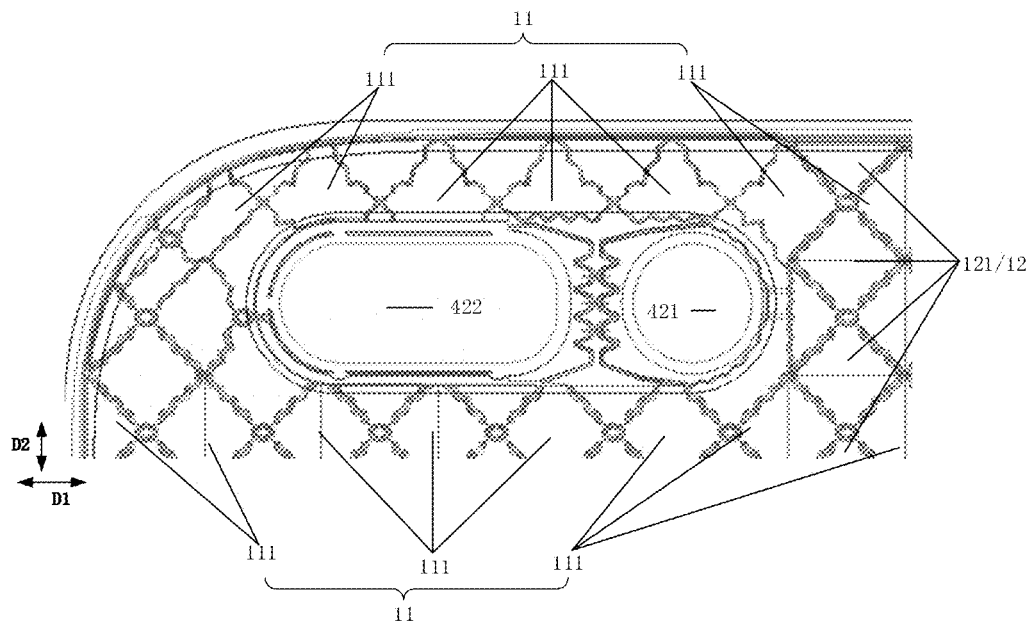
FIG. 6A is a schematic diagram of a partial region included in the touch sensor of the display apparatus shown in FIG. 4.

FIG. 6A is a schematic diagram of the partial region REG1 included in the touch sensor 01 of the display apparatus 03 shown in FIG. 4. For example, as shown in FIG. 6A, in the partial region REG1, the touch sensor 01 includes a plurality of first touch electrodes 11 and a plurality of second touch electrodes 12; the plurality of first touch electrodes 11 respectively extend along the first direction D1; the plurality of second touch electrodes 12 respectively extend along the second direction D2; the plurality of first touch electrodes 11 are arranged side by side along the second direction D2, and the plurality of second touch electrodes 12 are arranged side by side along the first direction D1; each of the plurality of first touch electrodes 11 includes a plurality of first touch sub-electrodes 111 arranged side by side along the first direction D1 and electrically connected with each other; and each of the plurality of second touch electrodes 12 includes a plurality of second touch sub-electrodes 121 sequentially arranged along the second direction D2 and electrically connected with each other.

For example, as shown in FIG. 5 and FIG. 6A, the first touch sub-electrodes 111 and the second touch electrodes 12 included in the touch sensor 01, except for the first touch sub-electrodes 111 and the second touch electrodes 12 located at the edges of the touch sensor 01, have parallelogram-shaped (e.g., rhombus-shaped) overall outlines. It should be noted that an overall outline of each of the first touch sub-electrodes 111 and the second touch electrodes 12 located at the edges of the touch sensor 01 (e.g., the lower edge of the touch sensor 01) is at least part of a parallelogram (e.g., half the parallelogram) or a quadrangle.

Figure 6B:
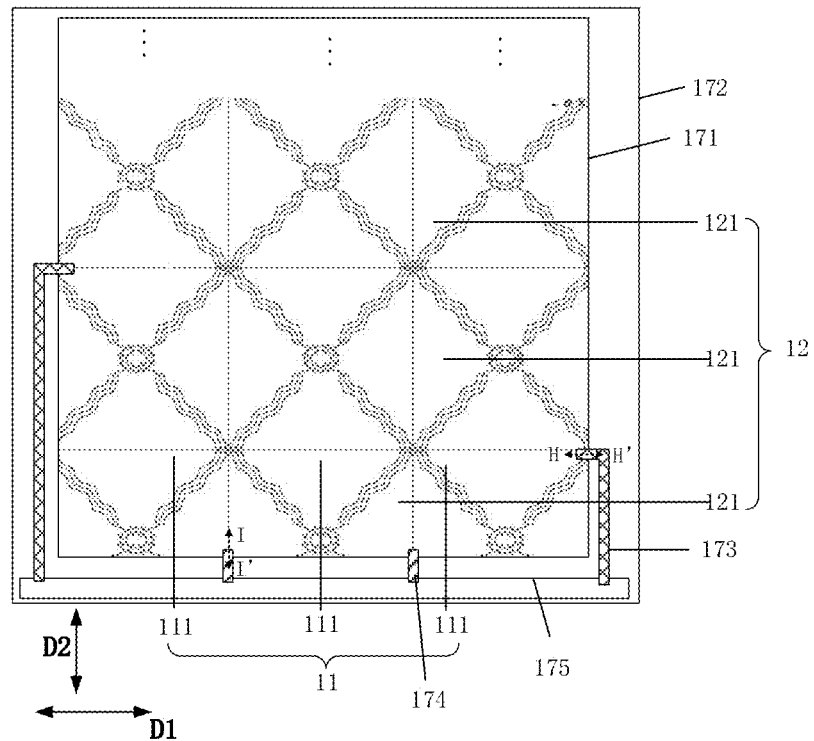
FIG. 6B is a plane schematic diagram of a touch sensor 01 provided by at least one embodiment of the present disclosure.

FIG. 6B is a plane schematic diagram of a touch sensor 01 provided by at least one embodiment of the present disclosure. For example, as shown in FIG. 6B, the touch sensor 01 further includes an intermediate region 171, a peripheral region 172 at least partially surrounding the intermediate region 171, a plurality of first touch signal lines 173 and a plurality of second touch signal lines 174, and for facilitating description, FIG. 6B further shows a touch circuit 175.

For example, as shown in FIG. 6B, a plurality of first touch electrodes 11 and a plurality of second touch electrodes 12 are all positioned in the intermediate region 171.

For example, as shown in FIG. 6B, the plurality of first touch signal lines 173 (e.g., first ends of the plurality of first touch signal lines) are respectively, electrically connected with the plurality of first touch electrodes 11 (e.g., the first touch sub-electrodes 111 at the outermost edges of the plurality of first touch electrodes 11 in the first direction D1), and extend into the peripheral region 172 from the edge of the intermediate region 171 in the first direction D1.

For example, as shown in FIG. 6B, the plurality of second touch signal lines 174 (e.g., first ends of the plurality of second touch signal lines 174) are respectively, electrically connected with the plurality of second touch electrodes 12 (e.g., the second touch sub-electrodes 121 at the outermost edges of the plurality of second touch electrodes 12 in the second direction D2), and extend into the peripheral region 172 from the edge of the intermediate region 171 in the second direction D1.

For example, as shown in FIG. 6B, the plurality of first touch signal lines 173 (e.g., second ends of the plurality of first touch signal lines) are respectively, electrically connected with the touch circuit 175, the plurality of second touch signal lines 174 (e.g., the first ends of the plurality of second touch signal lines 174) are respectively, electrically connected with the touch circuit 175, and by enabling the touch sensor 01 to receive a touch driving signal from the touch circuit 175, a touch sensing signal is provided to the touch circuit 175.

It should be noted that FIG. 6B is used for illustrating the connecting mode of the first touch signal line 173 and the first touch electrode 11 and the connecting mode of the second touch signal line 174 and the plurality of second touch electrodes 12; numbers and structures of the first touch electrodes 11 and the second touch electrodes 12 and shapes of the intermediate region 171 and the peripheral region 172 shown in FIG. 6B are merely exemplary; and in addition, for clarity, FIG. 6B does not show the first touch electrode 11 and the second touch sub-electrode 121 in the first region 411 and the second region 412, and structures of the first touch electrode 11 and the second touch sub-electrode 121 in the first region 411 and the second region 412 can refer to FIG. 6A for example.

Figure 6C:
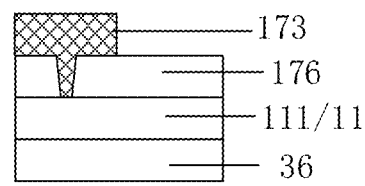
FIG. 6C is a sectional schematic diagram along a line HH' shown in FIG. 6B.
Figure 6D:
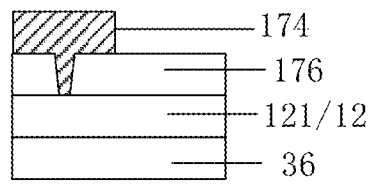
FIG. 6D is a sectional schematic diagram along a line II' shown in FIG. 6B.

FIG. 6C is a sectional schematic diagram along a line HH' shown in FIG. 6B; and FIG. 6D is a sectional schematic diagram along a line II' shown in FIG. 6B. As shown in FIG. 6C and FIG. 6D, the touch sensor 01 further includes a base material 36 and a protective layer 176; the plurality of first touch electrodes 11 and the plurality of second touch electrodes 12 are positioned between the base material 36 and the protective layer 176 in a direction perpendicular to the touch sensor 01; the plurality of first touch signal lines 173 and the plurality of second touch signal lines 174 are positioned on one side of the protective layer 176 away from the base material 36; the plurality of first touch signal lines 173 are respectively, electrically connected with the plurality of first touch electrodes 11 (e.g., the first touch sub-electrodes 111 included in the plurality of first touch electrodes 11) via corresponding via holes positioned in the protective layer 176; and the plurality of second touch signal lines 174 are respectively, electrically connected with the plurality of second touch electrodes 12 (e.g., the second touch sub-electrodes 121 included in the plurality of second touch electrodes 12) via corresponding via holes positioned in the protective layer 176. For example, the plurality of first touch signal lines 173 and the plurality of second touch signal lines 174 can be made of a metal material, but the embodiments of the present disclosure are not limited thereto. For example, the protective layer 176 can be made of a transparent insulating material.

It should be noted that in the direction perpendicular to the touch sensor 01, each of the plurality of first touch electrodes 11 and the plurality of second touch electrodes 12 can include a plurality of film layers, and structures of the plurality of first touch electrodes 11 and the plurality of second touch electrodes 12 in the direction perpendicular to the touch sensor 01 can refer to FIG. 12A, FIG. 12C, FIG. 12D and the like below, and are not repeated herein for simplicity.

Figure 7A:
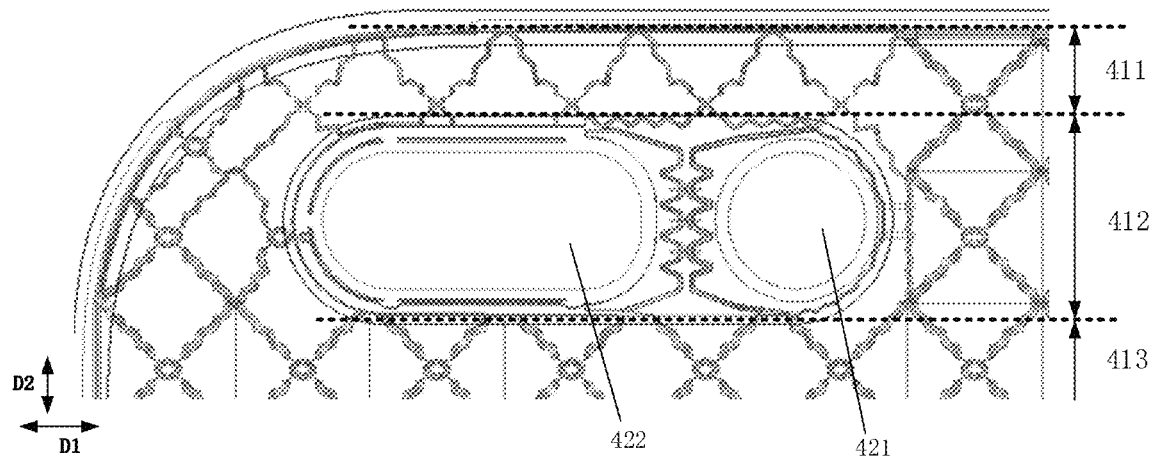
FIG. 7A is another schematic diagram of the partial region included in the touch sensor of the display apparatus shown in FIG. 4.

FIG. 7A is another schematic diagram of the partial region reg1 included in the touch sensor 01 of the display apparatus 03 shown in FIG. 4. It should be noted that the partial region REG1 of the touch sensor 01 of the display apparatus 03 shown in FIG. 7A as well as FIGS. 8-9, FIG. 14A, FIG. 24 and FIG. 30 below has the same structure as the partial region REG1 of the touch sensor 01 of the display apparatus 03 shown in FIG. 6A, and different drawings are used for illustrating structures of different parts of the touch sensor 01 more clearly.

For example, as shown in FIG. 7A, the touch sensor 01 has a first region 411, a second region 412 and a third region 413 which are sequentially arranged in the second direction D2. For example, as shown in FIG. 7A, the second region 412 includes an opening region 422 and an opening region 421. For example, as shown in FIG. 7A, the opening region 422 and the opening region 421 are spaced from each other. For example, as shown in FIG. 7A, the opening region 422 and the opening region 421 are arranged side by side in the first direction D1. For example, the opening region 422 and the opening region 421 are also positioned in the above-mentioned intermediate region 171.

Figure 7B:
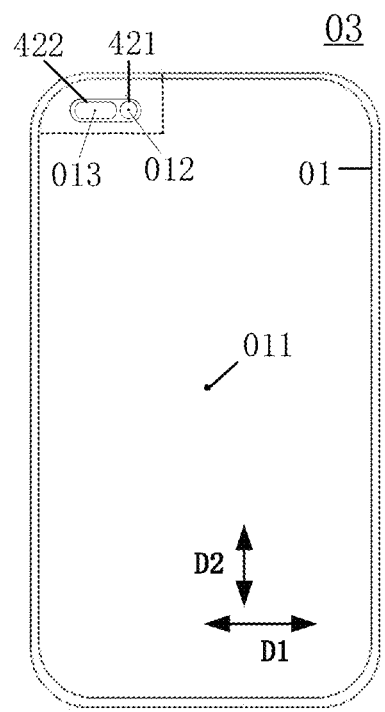
FIG. 7B is yet another plane schematic diagram of a display apparatus provided by at least one embodiment of the present disclosure.

FIG. 7B is yet another plane schematic diagram of a display apparatus provided by at least one embodiment of the present disclosure. For example, as shown in FIG. 7B, a center 012 of the opening region 421 and a center 011 of the touch sensor 01 do not coincide (e.g., spaced from each other). For example, as shown in FIG. 7B, the center 013 of the opening region 422 does not coincide with (e.g., is spaced from) the center 011 of the touch sensor 01.

For example, the center 011 of the touch senor 01 refers to a center of an overall outline (e.g., an outer outline of a surface of the touch sensor 01 in parallel with the first direction D1 and the second direction D2). For example, the overall outline of the touch sensor 01 is of a centrosymmetric structure (e.g., a rectangle structure with four filleted corners), and correspondingly, the center of the touch sensor 01 and the center of the overall outline of the touch sensor 01 are a symmetric center of the centrosymmetric structure (e.g., the rectangle structure with four filleted corners).

For example, the opening region 421 is of a centrosymmetric structure (e.g., a circle structure), and correspondingly, the center 012 of the opening region 421 is a symmetric center (e.g., a circle center) of the centrosymmetric structure (e.g., the circle structure).

For example, the opening region 422 is of a centrosymmetric structure (i.e., a racetrack structure), and correspondingly, the center 013 of the opening region 422 is a symmetric center of the centrosymmetric structure (i.e., the racetrack structure).

In some examples, at least one of the overall outline of the touch sensor 01, the opening region 421 and the opening region 422 is of a non-centrosymmetric structure; and in such a case, a center of the non-centrosymmetric structure surrounds a circle center of a circle of the non-centrosymmetric structure having a smallest size.

For example, as shown in FIG. 6A and FIG. 7A, the plurality of first touch sub-electrodes 111 and the plurality of second touch sub-electrodes 121 together at least partially surround (e.g., fully surround) the opening region 421; and the plurality of first touch sub-electrodes 111 and the plurality of second touch sub-electrodes 121 together at least partially surround (e.g., fully surround) the opening region 422.

For example, the plurality of first touch sub-electrodes 111 and the plurality of second touch sub-electrodes 121 together at least partially surround (e.g., fully surround) the opening region 421, which refers to the fact that the combination structure of the plurality of first touch sub-electrodes 111 and the plurality of second touch sub-electrodes 121 at least partially surrounds (e.g., fully surrounds) the opening region 421; and the plurality of first touch sub-electrodes 111 and the plurality of second touch sub-electrodes 121 together at least partially surround (e.g., fully surround) the opening region 422, which refers to a fact that the combined structure of the plurality of first touch sub-electrodes 111 and the plurality of second touch sub-electrodes 121 at least partially surrounds (e.g., fully surrounds) the opening region 422.

Figure 8:
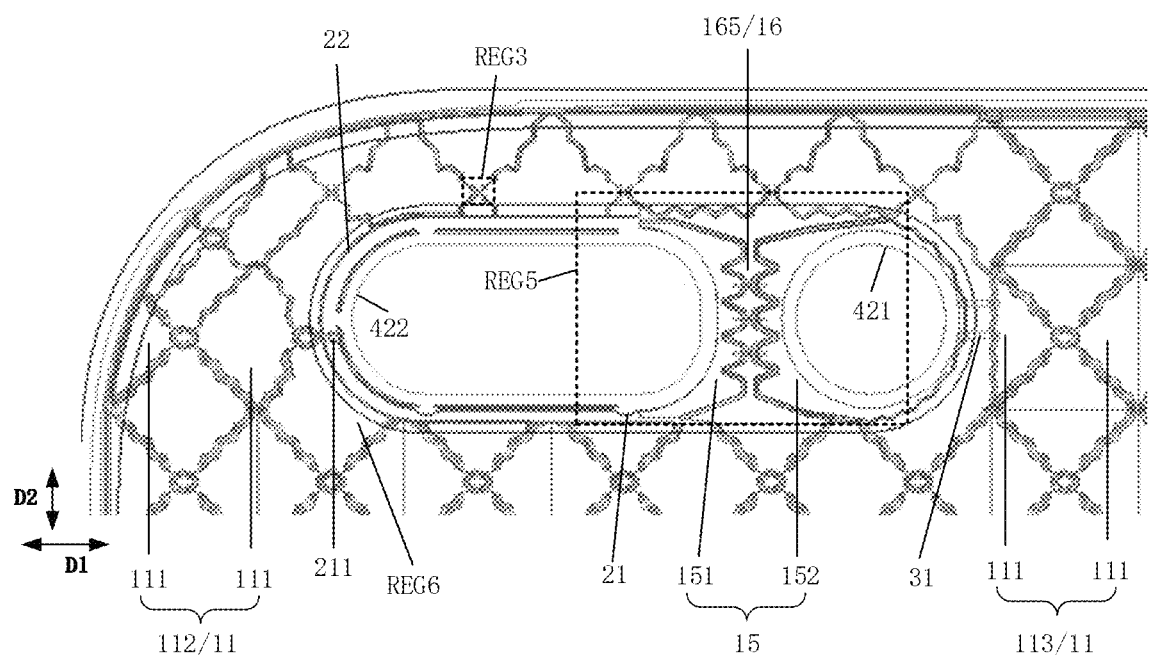
FIG. 8 is yet another schematic diagram of the partial region included in the touch sensor of the display apparatus shown in FIG. 4.
Figure 9:
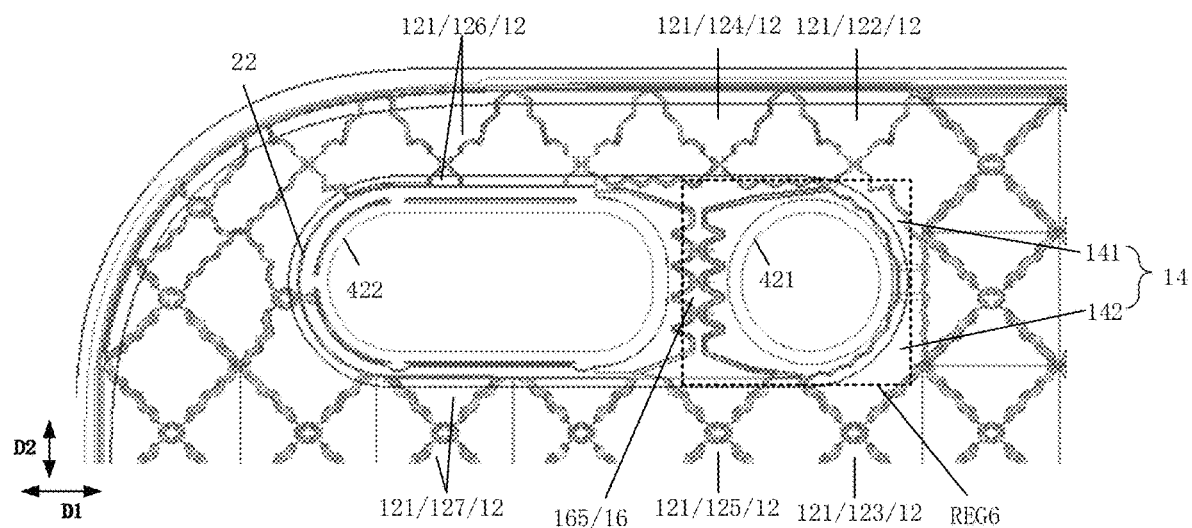
FIG. 9 is still a further schematic diagram of the partial region included in the touch sensor of the display apparatus shown in FIG. 4.

FIG. 8 is yet another schematic diagram of the partial region REG1 included in the touch sensor 01 of the display apparatus 03 shown in FIG. 4; and FIG. 9 is still a further schematic diagram of the partial region REG1 included in the touch sensor 01 of the display apparatus 03 shown in FIG. 4.

For example, as shown in FIG. 8 and FIG. 9, the touch sensor 01 further includes a jumper conductor wire 21, a jumper conductor wire 22, a transition touch electrode 14, a transition touch electrode 15 and a transition touch electrode 16. For example, as shown in FIG. 7A and FIG. 8, the jumper conductor wire 21, the jumper conductor wire 22, the transition touch electrode 15 and the transition touch electrode 16 are all positioned in the second region 412. For example, at least part (e.g., all) of the transition touch electrode 14 is positioned in the second region 412.

For example, as shown in FIG. 8, at least one of a plurality of first touch electrodes 11 is separated into an electrode portion 112 and an electrode portion 113 by the opening region 422 and the opening region 421; each of the electrode portion 112 and the electrode portion 113 includes at least one first touch sub-electrode 111; the electrode portion 112 and the electrode portion 113 are positioned on both sides of the opening region 421 in the first direction D1; the transition touch electrode 15 is positioned between the electrode portion 112 and the electrode portion 113, and the electrode portion 112 and the electrode portion 113 at least are electrically connected via jumper conductor wire 21 and the transition touch electrode 15; and correspondingly, at least one of the plurality of first touch electrodes 11 further includes the transition touch electrode 15.

For example, as shown in FIG. 9, at least one of the plurality of second touch electrodes 12 is separated into two electrode portions by the second region 412, and two portions of at least one of the plurality of second touch electrodes 12 are electrically connected via at least one of the jumper conductor wire and the transition touch electrode.

For example, as shown in FIG. 9, one group of second touch electrodes 12 in the plurality of second touch electrodes 12 (e.g., one group of second touch electrodes 12 in the plurality of second touch electrodes 12 includes at least one second touch electrode 12) is separated into an electrode portion 126 and an electrode portion 127 by the second region 412 (e.g., the opening region 422 in the second region 412), and each of the electrode portion 126 and the electrode portion 127 includes at least one second touch sub-electrode 121; and the electrode portion 126 and the electrode portion 127 are electrically connected with each other via at least one jumper conductor wire 22.

For example, as shown in FIG. 9, one group of second touch electrodes 12 in the plurality of second touch electrodes 12 (e.g., one group of second touch electrodes 12 in the plurality of second touch electrodes 12 includes at least one second touch electrode 12) is separated into an electrode portion 124 and an electrode portion 125 by the second region 412 (e.g., the opening region 421 in the second region 412); each of the electrode portion 124 and the electrode portion 125 includes at least one second touch sub-electrode 121; the transition touch electrode 16 is positioned between the electrode portion 124 and the electrode portion 125 in the second direction D2, and the electrode portion 124 and the electrode portion 125 are electrically connected with each other via the transition touch electrode 16; and correspondingly, each of one group of second touch electrodes 12 in the plurality of second touch electrodes 12 further includes the transition touch electrode 16.

For example, as shown in FIG. 9, one group of second touch electrodes 12 in the plurality of second touch electrodes 12 (e.g., one group of second touch electrodes 12 in the plurality of second touch electrodes 12 includes at least one second touch electrode 12) is separated into an electrode portion 122 and an electrode portion 123 by the second region 412; each of the electrode portion 122 and the electrode portion 123 includes at least one second touch sub-electrode 121; the electrode portion 122 and the electrode portion 123 are positioned on both sides of the second region 412 (e.g., the opening region 421 positioned in the second region 412) in the second direction D2; the transition touch electrode 14 is positioned between the electrode portion 122 and the electrode portion 123 in the second direction D2, and the electrode portion 122 and the electrode portion 123 are electrically connected with each other via the transition touch electrode 14; and correspondingly, each of one group of second touch electrodes 12 in the plurality of second touch electrodes 12 further includes the transition touch electrode 14.

For clarity, specific structures of res of the opening region 422 and the opening region 421, specific structures of the jumper conductor wire 21, the jumper conductor wire 22, the transition touch electrode 14, the transition touch electrode 15 and the transition touch electrode 16, a specific connecting mode of the electrode portion 112 and the electrode portion 113, a specific connecting mode of the electrode portion 126 and the electrode portion 127, a specific connecting mode of the electrode portion 124 and the electrode portion 125 and a specific connecting mode of the electrode portion 122 and the electrode portion 123 will be illustrated in detail after specific structures of the first touch sub-electrode 111 and the second touch electrode 12, the connecting mode of two adjacent first touch sub-electrodes 111 and the connecting mode of two adjacent second touch electrodes 12 are illustrated.

The specific structures of the first touch sub-electrode 111 and the second touch electrode 12, the connecting mode of two adjacent first touch sub-electrodes 111 and the connecting mode of two adjacent second touch electrodes 12 will be exemplarily illustrated below in connection with FIG. 6A to FIG. 10B.

Figure 10A:
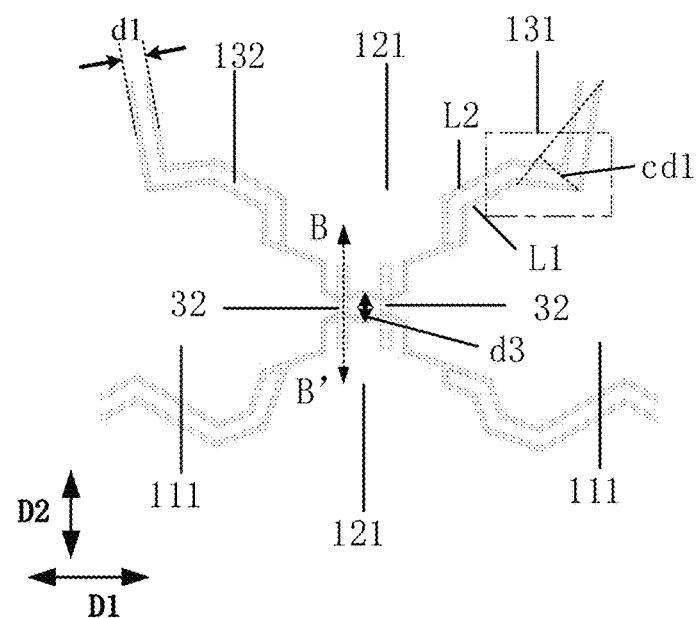
FIG. 10A is a schematic diagram of a partial region included in the touch sensor shown in FIG. 8.
Figure 10B:
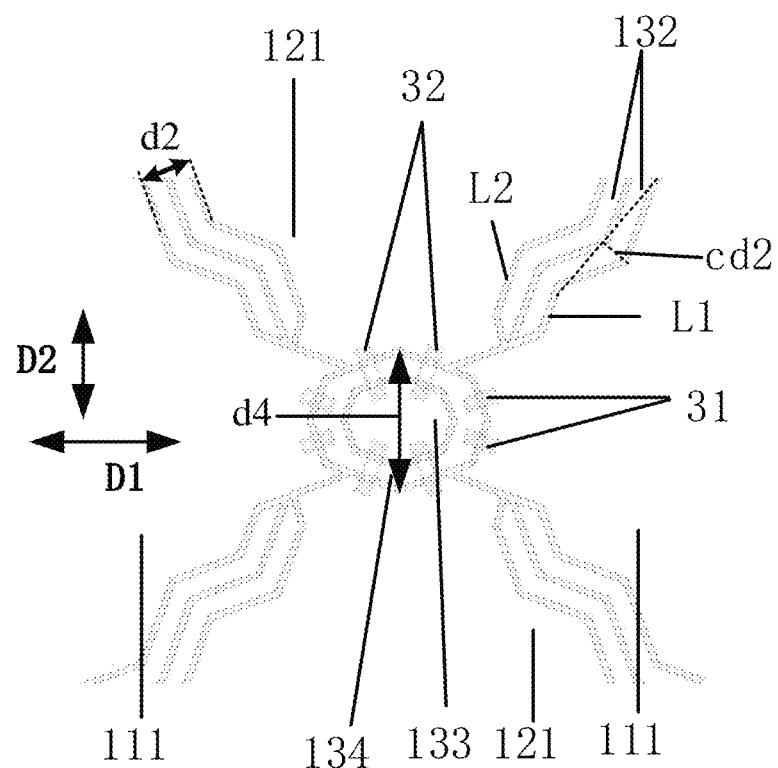
FIG. 10B is a schematic diagram of a partial region included in the touch sensor shown in FIG. 5.

FIG. 10A is a schematic diagram of a partial region REG3 (positioned in the first region 411) included in the touch sensor 01 shown in FIG. 8; and FIG. 10B is a schematic diagram of a partial region REG4 (positioned in the third region 413) included in the touch sensor 01 shown in FIG. 5.

For example, as shown in FIG. 6A, FIG. 10A and FIG. 10B, an area of the first touch sub-electrode 111 in the first region 411 is less than that of the first touch sub-electrode 111 in the third region 413. For example, as shown in FIG. 6A, FIG. 10A and FIG. 10B, an area of the second touch sub-electrode 121 in the first region 411 is less than that of the second touch sub-electrode 121 in the third region 413.

For example, as shown in FIG. 6A, FIG. 10A and FIG. 10B, a distance d1 (refer to FIG. 10A) between the first touch sub-electrode 111 and the second touch sub-electrode 121 that are adjacent in the first region 411 is less than that (refer to FIG. 10B) between the first touch sub-electrode 111 and the second touch sub-electrode 121 that are adjacent in the third region 413. For example, the distance between the first touch sub-electrode 111 and the second touch sub-electrode 121 that are adjacent refers to the distance d2 between two adjacent edges of the first touch sub-electrode 111 and the second touch sub-electrode 121 that are adjacent. For example, the distance between the first touch sub-electrode 111 and the second touch sub-electrode 121 that are adjacent will be exemplarily illustrated in examples shown in FIG. 10A and FIG. 10B, and is not repeated herein for simplicity.

For example, an amount of touch signals of the first region 411 of the touch sensor 01 can be increased by making the distance between the first touch sub-electrode 111 and the second touch sub-electrode 121 that are adjacent in the first region 411 less than that between the first touch sub-electrode 111 and the second touch sub-electrode 121 that are adjacent in the third region 413.

For example, the capacitance C of a parallel-plate capacitor is directly proportional to an expression $\varepsilon S/d$, here $\varepsilon$ is a constant, S represents a directly facing area of two capacitance plates of the parallel-plate capacitor, and d represents a distance between two capacitance plates of the parallel-plate capacitor. For example, it can be known from the expression above that the capacitance C is directly proportional to the area S, and inversely proportional to the distance d. Therefore, in the case of reducing the distance between the first touch sub-electrode 111 and the second touch sub-electrode 121 that are adjacent in the first region 411, the capacitance between the first touch sub-electrode 111 and the second touch sub-electrode 121 that are adjacent can be increased, and correspondingly, an amount of touch signals of the first touch electrode 11 in the first region 411 and an amount of touch signals of the electrode portion of the second touch electrode 12 positioned in the first region 411 can be increased.

For example, by reducing the distance between the first touch sub-electrode 111 and the second touch sub-electrode 121 that are adjacent in the first region 411, the amount of touch signals of the first touch electrode 11 in the first region 411 and the amount of touch signals of the electrode portion of the second touch electrode 12 positioned in the first region 411 can be increased in the case of not increasing the areas of the first touch sub-electrode 111 and the second touch sub-electrode 121 in the first region 411, and thus, the signal-to-noise ratio of a touch signal provided by a portion of the touch sensor 01 positioned in the first region 411 can be increased in the case of not reducing a touch resolution of the portion of the touch sensor 01 positioned in the first region 411.

For example, as shown in FIG. 7A and FIG. 9, at least one of the plurality of second touch electrodes 12 is separated into two electrode portions by the second region 412. For example, as shown in FIG. 7A and FIG. 9, at least one of the plurality of second touch electrodes 12 is separated into the electrode portion 124 and the electrode portion 125 by the second region 412; and for further example, as shown in FIG. 7A and FIG. 9, at least one of the plurality of second touch electrodes 12 is separated into the electrode portion 126 and the electrode portion 127 by the second region 412.

For example, as shown in FIG. 7A and FIG. 9, the electrode portion 124 and the electrode portion 126 are positioned in the first region 411; and the electrode portion 125 and the electrode portion 127 are positioned in the third region 413. For example, as shown in FIG. 7A and FIG. 9, a size of the electrode portion 124 in the second direction D2 is less than that of the electrode portion 125 in the second direction D2; and a size of the electrode portion 126 in the second direction D2 is less than that of the electrode portion 127 in the second direction D2.

For example, the electrode portion 124 includes all the second touch sub-electrodes 121 of the second touch electrode 12 having the above-mentioned electrode portion 124 that are positioned in the first region 411; and the electrode portion 125 includes all the second touch sub-electrodes 121 of the second touch electrode 12 having the above-mentioned electrode portion 125 that are positioned in the third region 413.

For example, the electrode portion 126 includes all the second touch sub-electrodes 121 of the second touch electrode 12 with the electrode portion 126 that are positioned in the first region 411, and the lower edge of the first region 411 corresponds to the lower edge of the lowermost second touch sub-electrode 121 included in the electrode portion 126; and the electrode portion 127 includes all the second touch sub-electrodes 121 of the second touch electrode 12 with the electrode portion 127 that are positioned in the third region 413, and the upper edge of the third region 413 corresponds to the upper edge of the uppermost second touch sub-electrode 121 included in the electrode portion 127.

For example, the sizes (e.g., lengths) of the electrode portion 124 and the electrode portion 126 in the second direction D2 are less than a size (i.e., a length) of the second touch sub-electrode 121 (i.e., the second touch sub-electrode 121 with the parallelogram-shaped overall outline), positioned in the third region 413 and having the maximum size, in the second direction D2; in such a case, the area of the first touch sub-electrode 111 in the first region 411 (e.g., an area of a surface in parallel with the first direction D1 and the second direction D2) is less than those of most first touch sub-electrodes 111 in the third region 413; and the area of the second touch sub-electrode 121 in the first region 411 is less than those of most of second touch sub-electrodes 121 in the third region 413 (e.g., the area of the second touch sub-electrode 121 with the maximum area).

For example, as shown in FIG. 10A and FIG. 10B, the touch sensor 01 further includes a plurality of dummy electrodes 132; and each of the plurality of dummy electrodes 132 is arranged between the first touch sub-electrode 111 and the second touch sub-electrode 121 which are adjacent to each of the plurality of dummy electrodes 132.

It should be noted that the first touch sub-electrode 111 and the second touch sub-electrode 121 which are adjacent to the dummy electrode 132 represent the first touch sub-electrode 111 and the second touch sub-electrode 121 which are the most adjacent to the dummy electrode 132, and in such a case, no other first touch sub-electrodes 111 or other second touch sub-electrodes 121 are arranged between the dummy 132 and the most adjacent first touch sub-electrode 111, no other first touch sub-electrodes 111 or other second touch sub-electrodes 121 are arranged between the dummy 132 and the most adjacent second touch sub-electrode 121, but other dummy electrodes 132 may be arranged between the dummy 132 and the most adjacent first touch sub-electrode 111 or between the dummy 132 and the most adjacent second touch sub-electrode 121.

For example, by arranging the dummy electrode 132 between the first touch sub-electrode 111 and the second touch sub-electrode 121 that are adjacent, the excessively small distance between the first touch sub-electrode 111 and the second touch sub-electrode 121 that are adjacent and the excessively high capacitance (e.g., basic capacitance) between the first touch sub-electrode 111 and the second touch sub-electrode 121 that are adjacent can be avoided, so that the touch sensor 01 can provide a required signal-to-noise ratio. For example, in the case that the capacitance between the first touch sub-electrode 111 and the second touch sub-electrode 121 that are adjacent is excessively high, the ratio of the capacitance change amount caused by a touch operation to the basic capacitance is excessively small, resulting in a low signal-to-noise ratio of the touch signal caused by touch.

It should be noted that the first touch sub-electrode 111 and the second touch sub-electrode 121 that are adjacent represent that no other first touch sub-electrodes 111 or other second touch sub-electrodes 121 are arranged between the first touch sub-electrode 111 and the second touch sub-electrode 121 that are adjacent, but the dummy electrode 132 may be arranged between the first touch sub-electrode 111 and the second touch sub-electrode 121 that are adjacent.

For example, as shown in FIG. 10A and FIG. 10B, the number of the dummy electrodes 132 between the first touch sub-electrode 111 and the second touch sub-electrode 121 that are adjacent in the first region 411 is less than that of the dummy electrodes 132 between the first touch sub-electrode 111 and the second touch sub-electrode 121 that are adjacent in the third region 413.

For example, as shown in FIG. 10A and FIG. 10B, a width of the dummy electrode 132 between the first touch sub-electrode 111 and the second touch sub-electrode 121 that are adjacent in the first region 411 is less than or equal to (e.g., equal to) that of the dummy electrode 132 between the first touch sub-electrode 111 and the second touch sub-electrode 121 that are adjacent in the third region 413; and in such a case, the distance between the first touch sub-electrode 111 and the second touch sub-electrode 121 that are adjacent in the first region 411 can be reduced by reducing the number of the dummy electrodes 132 between the first touch sub-electrode 111 and the second touch sub-electrode 121 that are adjacent in the first region 411.

It should be noted that the embodiments of the present disclosure is not limited to the case of reducing the distance between the first touch sub-electrode 111 and the second touch sub-electrode 121 that are adjacent in the first region 411 by reducing the number of the dummy electrodes 132 between the first touch sub-electrode 111 and the second touch sub-electrode 121 that are adjacent in the first region 411, and in some examples, the distance between the first touch sub-electrode 111 and the second touch sub-electrode 121 that are adjacent in the first region 411 can also be reduced by reducing the width of the dummy electrode 132 between the first touch sub-electrode 111 and the second touch sub-electrode 121 that are adjacent in the first region 411.

For example, the number of the dummy electrode 132 between the first touch sub-electrode 111 and the second touch sub-electrode 121 that are adjacent in the first region 411 is one, the number of the dummy electrodes 132 between the first touch sub-electrode 111 and the second touch sub-electrode 121 that are adjacent in the third region 143 is two, but the embodiments of the present disclosure are not limited thereto.

For example, the dummy electrode 132 includes a plurality of electrode strips sequentially connected. For example, widths of the plurality of electrode strips included in the dummy electrode 132 and sequentially connected are equal to each other, i.e., the dummy electrodes 132 have the uniform width. Exemplary illustration will be carried out below in connection with FIG. 11.

Figure 11:
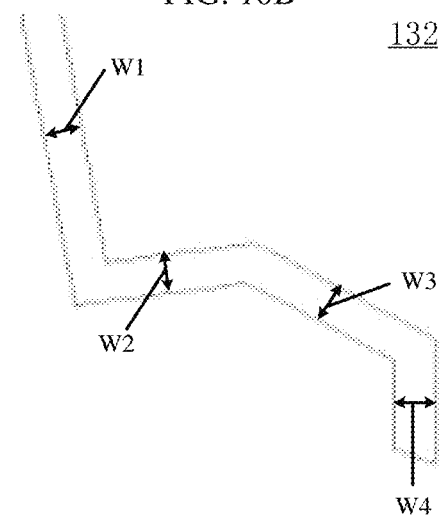
FIG. 11 shows a plane schematic diagram of a dummy electrode positioned in a top left corner of FIG. 10B.

FIG. 11 shows a plane schematic diagram of the dummy electrode 132 positioned on the top left corner of FIG. 10B. As shown in FIG. 11, the dummy electrode 132 includes four electrode strips sequentially connected; and the widths of the four electrode strips (e.g., the widths in a direction perpendicular to an extending direction of the electrode strips) respectively are W1, W2, W3 and W4. For example, W1=W2=W3=W4.

For example, the width of the dummy electrode 132 refers to the width of the electrode strip included in the dummy electrode 132 in the direction perpendicular to the extending direction of the electrode strip. For example, in the case that the widths of the plurality of electrode strips included in the dummy electrode 132 are not exactly equal, the width of the dummy electrode 132 refers to a width average value of the plurality of electrode strips.

For example, as shown in FIG. 10A and FIG. 10B, the adjacent edges of the first touch sub-electrode 111 and the second touch sub-electrode 121 that are adjacent have a consistent (e.g., the same) extending direction at any position. For example, as shown in FIG. 10A and FIG. 10B, the distance between the first touch sub-electrode 111 and the second touch sub-electrode 121 that are adjacent refers to the distance between the adjacent edges of the first touch sub-electrode 111 and the second touch sub-electrode 121 that are adjacent in a direction perpendicular to the above-mentioned consistent extending direction.

For example, as shown in FIG. 10A, the distance between the first touch sub-electrode 111 and the second touch sub-electrode 121 that are adjacent in the first region 411 is d1; as shown in FIG. 10B, the distance between the first touch sub-electrode 111 and the second touch sub-electrode 121 that are adjacent in the third region 413 is d2; and as shown in FIG. 10A and FIG. 10B, d1 is less than d2, i.e., the distance d1 between the first touch sub-electrode 111 and the second touch sub-electrode 121 that are adjacent in the first region 411 is less than the distance d2 between the first touch sub-electrode 111 and the second touch sub-electrode 121 that are adjacent in the third region 413. For example, by reducing the distance d1 between the first touch sub-electrode 111 and the second touch sub-electrode 121 that are adjacent in the first region 411, the problem of reduction of the capacitance value and the amount of touch signals caused by reduction of the areas of the first touch sub-electrode 111 and the second touch sub-electrode 121 in the first region 411 can be relieved.

For example, as shown in FIG. 5, FIG. 8, FIG. 10A and FIG. 10B, the touch sensor 01 further includes a plurality of ring-shaped sub-electrodes (e.g., can also be called as conducting rings) 134, a plurality of intermediate sub-electrodes (e.g., can also be called as bridging islands) 133, a plurality of connecting sub-electrodes 31 and a plurality of connecting sub-electrodes 32.

For example, as shown in FIG. 5, FIG. 8, FIG. 10A and FIG. 10B, the plurality of ring-shaped sub-electrodes 134 and the plurality of intermediate sub-electrodes 133 are positioned (e.g., only positioned) in the second region 412 and the third region 413. For example, as shown in FIG. 5, FIG. 8, FIG. 10A and FIG. 10B, the plurality of connecting sub-electrodes 31 are positioned in the second region 412 and the third region 413. For example, as shown in FIG. 5, FIG. 8, FIG. 10A and FIG. 10B, the plurality of connecting sub-electrodes 32 are positioned in the first region 411 and the third region 413.

For example, as shown in FIG. 8 and FIG. 10A, two adjacent first touch sub-electrodes 111 included in at least one first touch electrode 11 in the first region 411 are of an integrated structure and are directly, electrically connected. For example, two adjacent first touch sub-electrodes 111 included in at least one first touch electrode 11 in the first region 411 are formed from the same material in the same patterning process, and there is no interface between two adjacent first touch sub-electrodes 111 included in at least one first touch electrode 11 in the first region 411.

Figure 12A:
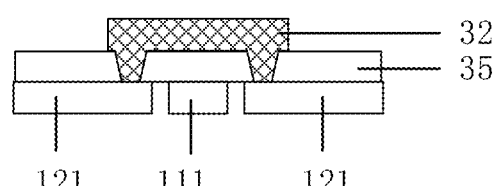
FIG. 12A is a sectional schematic diagram along a line BB' shown in FIG. 10A.

FIG. 12A is a sectional schematic diagram along a line BB' shown in FIG. 10A. For example, as shown in FIG. 8, FIG. 10A and FIG. 12A, both ends of each connecting sub-electrode 32 in the first region 411 are respectively, electrically connected with two adjacent second touch sub-electrodes 121, i.e., two adjacent second touch sub-electrodes 121 in the first region 411 are electrically connected with each other via the corresponding connecting sub-electrode 32. It should be noted that two adjacent second touch sub-electrodes 121 represent that no other first touch sub-electrodes 111 or other second touch sub-electrodes 121 are arranged between the two adjacent second touch sub-electrodes 121.

For example, as shown in FIG. 10A and FIG. 12A, the second touch sub-electrode 121 and the connecting sub-electrode 32 are positioned on different layers in the direction perpendicular to the touch sensor 01, and partially overlap; and in the direction perpendicular to the touch sensor 01, there is an insulating layer 35 between the second touch sub-electrode 121 and the connecting sub-electrode 32, and the connecting sub-electrode 32 is electrically connected with the second touch sub-electrode 121 via a via hole in the insulating layer 35, i.e., the touch sensor 01 is such a sensor with a conduction bridge structure.

For example, as shown in FIG. 5 and FIG. 10B, the plurality of ring-shaped sub-electrodes 134 correspond to the plurality of intermediate sub-electrodes 133 one to one. For example, the plurality of intermediate sub-electrodes 133 are correspondingly arranged in a space surrounded by the plurality of ring-shaped sub-electrodes 134, i.e., each of the plurality of ring-shaped sub-electrodes 134 surrounds one corresponding intermediate sub-electrode 133.

For example, as shown in FIG. 5 and FIG. 10B, in the first direction D1, each of the ring-shaped sub-electrodes 134 is positioned between two adjacent first touch sub-electrodes 111, and correspondingly, each of the plurality of intermediate sub-electrodes 133 is positioned between two adjacent first touch sub-electrodes 111; in the second direction D2, each of the ring-shaped sub-electrodes 134 is positioned between two adjacent second touch sub-electrodes 121, and correspondingly, each of the plurality of intermediate sub-electrodes 133 is positioned between two adjacent second touch sub-electrodes 121. It should be noted that two adjacent first touch sub-electrodes 111 represent that no other first touch sub-electrodes 111 or other second touch sub-electrodes 121 are arranged between the two adjacent first touch sub-electrodes 111.

Figure 12B:
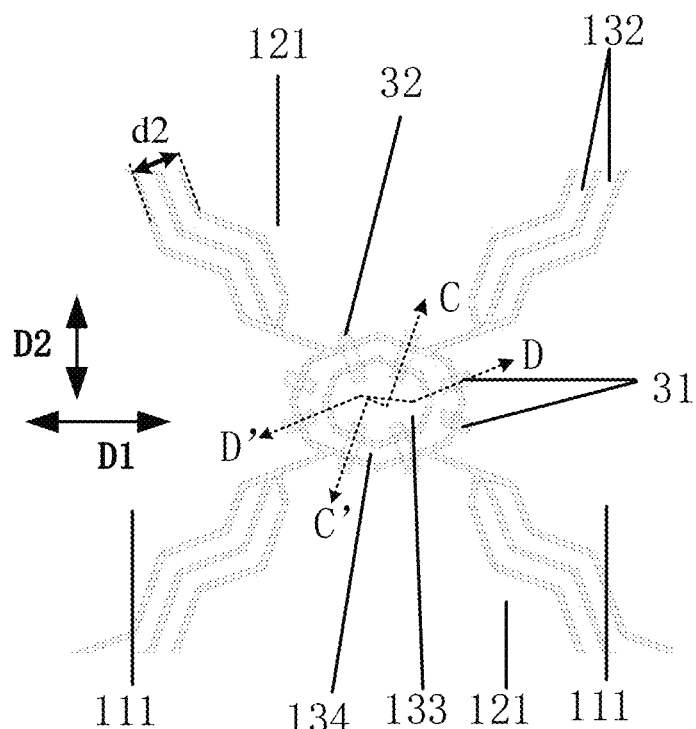
FIG. 12B is another schematic diagram of the partial region included in the touch sensor shown in FIG. 5.

FIG. 12B is another schematic diagram of the partial region REG4 included in the touch sensor 01 shown in FIG. 5; FIG. 12C is a sectional schematic diagram along a line CC' shown in FIG. 12B; and FIG. 12D is a sectional schematic diagram along a line DD' shown in FIG. 12B. It should be noted that a structure of the partial region REG4 included in the touch sensor 01 shown in FIG. 12B is the same with that of the partial region REG4 included in the touch sensor 01 shown in FIG. 10B, and FIG. 12B is used for showing positions of the line CC' and the line DD' more clearly.

For example, as shown in FIG. 5, FIG. 10B, FIG. 12B and FIG. 12C, both ends of each connecting sub-electrode 32 in the third region 413 are respectively, electrically connected with one corresponding second touch sub-electrode 121 and one corresponding intermediate sub-electrode 133; and correspondingly, two adjacent second touch sub-electrodes 121 in the third region 413 are electrically connected with each other via the intermediate sub-electrode 133 (e.g., one intermediate sub-electrode 133) and the connecting sub-electrode 32 (e.g., at least two connecting sub-electrodes 32).

Figure 12C:
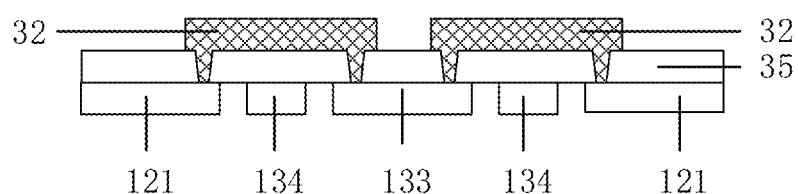
FIG. 12C is a sectional schematic diagram along a line CC' shown in FIG. 12B.

For example, as shown in FIG. 12B and FIG. 12C, each connecting sub-electrode 32 (e.g., a first end of the connecting sub-electrode 32) in the third region 413 and the corresponding intermediate sub-electrode 133 are positioned on different electrode layers in the direction perpendicular to the touch sensor 01, and partially overlap; the connecting sub-electrode 32 (e.g., a second end of the connecting sub-electrode 32) and the corresponding second touch sub-electrode 121 are positioned on different electrode layers in the direction perpendicular to the touch sensor 01, and partially overlap; and in the direction perpendicular to the touch sensor 01, there are insulating layers 35 between the electrode layers where the connecting sub-electrode 32 and the intermediate sub-electrode 133 as well as the second touch sub-electrode 121 are positioned, the connecting sub-electrode 32 (e.g., the first end of the connecting sub-electrode 32) is electrically connected with the corresponding intermediate sub-electrode 133 via a via hole in the insulating layer 35, and the connecting sub-electrode 32 (e.g., the second end of the connecting sub-electrode 32) is electrically connected with the corresponding intermediate sub-electrode 133 via a via hole in the insulating layer 35.

For example, as shown in FIG. 5, FIG. 10B, FIG. 12B and FIG. 12D, each connecting sub-electrode 31 in the third region 413 are electrically connected with one corresponding first touch sub-electrode 111 and one corresponding ring-shaped sub-electrode 134; and correspondingly, in each of a plurality of first touch electrodes 11 in the third region 413, two adjacent first touch sub-electrodes 111 are electrically connected with each other via the ring-shaped sub-electrode 134 (e.g., one ring-shaped sub-electrode 134) and the corresponding connecting sub-electrode 31 (e.g., at least two connecting sub-electrodes 31) between two adjacent first touch sub-electrodes 111.

Figure 12D:
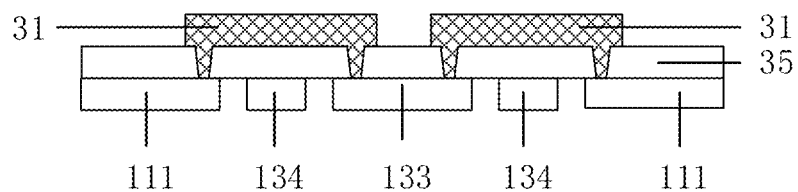
FIG. 12D is a sectional schematic diagram along a line DD' shown in FIG. 12B.

For example, as shown in FIG. 12B and FIG. 12D, each connecting sub-electrode 31 (e.g., a first end of the connecting sub-electrode 31) in the third region 413 and the corresponding intermediate sub-electrode 133 are positioned on different electrode layers in the direction perpendicular to the touch sensor 01, and partially overlap; and in the direction perpendicular to the touch sensor 01, there is an insulating layer 35 between the connecting sub-electrode 31 and the corresponding intermediate sub-electrode 133, and the connecting sub-electrode 31 is electrically connected with the corresponding intermediate sub-electrode 133 via a via hole in the insulating layer 35. For example, as shown in FIG. 12B and FIG. 12D, each connecting sub-electrode 31 (e.g., a second end of the connecting sub-electrode 31) in the third region 413 and the corresponding first touch sub-electrode 111 are positioned on different electrode layers in the direction perpendicular to the touch sensor 01; and in the direction perpendicular to the touch sensor 01, there is an insulating layer 35 between the connecting sub-electrode 31 and the corresponding first touch sub-electrode 111, and the connecting sub-electrode 31 is electrically connected with the corresponding first touch sub-electrode 111 via a via hole in the insulating layer 35.

For example, as shown in FIG. 5, FIG. 8, FIG. 10A and FIG. 10B, by enabling two adjacent second touch sub-electrodes 121 in the first region 411 to be electrically connected with each other directly via the corresponding connecting sub-electrode 32, the ring-shaped sub-electrode 134 and the intermediate sub-electrode 133 can be not arranged between the two adjacent second touch sub-electrodes 121 in the first region 411, so that the distance between the two adjacent second touch sub-electrodes 121 in the first region 411 in the second direction D2 can be reduced (compared to the distance between two adjacent second touch sub-electrodes 121 in the third region 413).

For example, as shown in FIG. 5, FIG. 8, FIG. 10A and FIG. 10B, the distance between two adjacent second touch sub-electrodes 121 in the first region 411 in the second direction D2 is less than that between two adjacent second touch sub-electrodes 121 in the third region 413 in the second direction D2. For example, the distance between two adjacent second touch sub-electrodes 121 in the second direction D2 refers to the distance between a virtual straight line in parallel with the second direction D2 and a virtual connecting line of two intersection points of two adjacent sides of two adjacent second touch sub-electrodes 121 in the second direction D2. For example, as shown in FIG. 10A, the distance between two adjacent second touch sub-electrodes 121 in the first region 411 in the second direction D2 is d3; and as shown in FIG. 10B, the distance between two adjacent second touch sub-electrodes 121 in the third region 413 in the second direction D2 is d4, and d3 is less than d4.

For example, by reducing the distance between two adjacent second touch sub-electrodes 121 in the first region 411 in the second direction D2, more spaces of the first region 411 can be used for arranging the second touch sub-electrode 121 and the first touch sub-electrode 111, and in such a case, the areas (e.g., active electrode areas) of the second touch sub-electrode 121 and the first touch sub-electrode 111 can be increased in the case of not reducing the touch resolution of the portion of the touch sensor 01 positioned in the first region 411, so that the signal-to-noise ratio of the touch signal provided by the portion of the touch sensor 01 positioned in the first region 411 can be further increased.

For example, as shown in FIG. 5, FIG. 8, FIG. 10A and FIG. 10B, two adjacent second touch sub-electrodes 121 in the first region 411 are electrically connected via a corresponding first number of connecting sub-electrodes 32; and two adjacent second touch sub-electrodes 121 in the third region 413 are electrically connected via a corresponding second number of connecting sub-electrodes 32. For example, as shown in FIG. 5, FIG. 8, FIG. 10A and FIG. 10B, the first number is less than the second number. For example, two adjacent first touch sub-electrodes 111 in the third region 413 are electrically connected via a corresponding third number of connecting sub-electrodes 31. For example, the second number is equal to the third number, but the embodiments of the present disclosure are not limited thereto.

For example, as shown in FIG. 5, FIG. 8, FIG. 10A and FIG. 10B, the first number is two, and both the second number and the third number are 4 (i.e., a two-bridge type touch bridge solution is adopted in the first region 411, and an eight-bridge type touch bridge solution is adopted in the third region 413), so that reliability of the touch sensor 01 can be promoted. It should be noted that the first number is not limited to 2, the second number is not limited to 4, and according to practical application demands, the first number and the second number can also be respectively set as one or two or set as other proper number, which is not repeated herein for simplicity.

For example, as shown in FIG. 10A, two adjacent second touch sub-electrodes 121 in the first region 411 are electrically connected via two corresponding connecting sub-electrodes 32 arranged side by side in the first direction D1 (e.g., in parallel with each other), but the embodiments of the present disclosure are not limited thereto.

For example, as shown in FIG. 10B, in the plurality of first touch electrodes 11 in the third region 413, two adjacent first touch sub-electrodes 111 are electrically connected with each other via the ring-shaped sub-electrode 134 between the two adjacent first touch electrodes 111 and the corresponding third number of connecting sub-electrodes 31; the third number is equal to 4; the corresponding third number of connecting sub-electrodes 31 are arranged in two rows and two columns; two connecting sub-electrodes 32 in the same column in the corresponding third number of connecting sub-electrodes 31 are used for electrically connecting one corresponding first touch sub-electrode 111 and one corresponding ring-shaped sub-electrode 134; extending directions of two connecting sub-electrodes 32 in the same column in the corresponding third number of connecting sub-electrodes 31 intersect with each other; and extending directions of two connecting sub-electrodes 32 in the same row in the corresponding third number of connecting sub-electrodes 31 intersect with each other. For example, as shown in FIG. 9 and FIG. 10B, each of the plurality of first touch electrodes 11 includes an applicable number of connecting sub-electrodes 31.

For example, as shown in FIG. 10B, two adjacent second touch sub-electrodes 121 in the third region 413 are electrically connected via four corresponding connecting sub-electrodes 32; the four corresponding connecting sub-electrodes 32 are arranged in two rows and two columns; two connecting sub-electrodes 32 in the same row in the four corresponding connecting sub-electrodes 32 are electrically connected with one corresponding second touch sub-electrode 121 and one corresponding intermediate sub-electrode 133; extending directions of two connecting sub-electrodes 32 in the same column in the four corresponding connecting sub-electrodes 32 intersect with each other; and extending directions of two connecting sub-electrodes 32 in the same row in the four corresponding connecting sub-electrodes 32 intersect with each other.

For example, as shown in FIG. 10A and FIG. 10B, an area of each connecting sub-electrode 32 in the first region 411 is greater than that of each connecting sub-electrode 32 in the third region 413. For example, as shown in FIG. 10A and FIG. 10B, a length of each connecting sub-electrode 32 in the first region 411 is greater than that of each connecting sub-electrode 32 in the third region 413. For example, as shown in FIG. 10A and FIG. 10B, a width of each connecting sub-electrode 32 in the first region 411 is greater than that of each connecting sub-electrode 32 the third region 413.

For example, as shown in FIG. 9, FIG. 10A and FIG. 10B, each of the plurality of second touch electrodes 12 includes the applicable number of connecting sub-electrodes 32.

Figure 13:
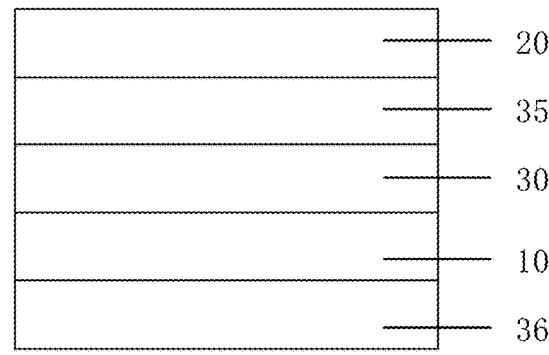
FIG. 13 is a schematic diagram of a laminated structure of a touch sensor included in the display apparatus shown in FIG. 2.

FIG. 13 is a schematic diagram of a laminated structure of the touch sensor 01 included in the display apparatus 03 shown in FIG. 2. As shown in FIG. 13, the touch sensor 01 includes a first electrode layer 10, an insulating layer 35 and a connecting electrode layer 20 sequentially arranged in a direction perpendicular to the touch sensor 01 (e.g., the normal direction of the display surface of the display apparatus).

For example, as shown in FIG. 12A, FIG. 12C, FIG. 12D and FIG. 13, the plurality of first touch sub-electrodes 111, the plurality of second touch sub-electrodes 121, the plurality of ring-shaped sub-electrodes 134 and the plurality of intermediate sub-electrodes 133 are all positioned in the same electrode layer (e.g., the first electrode layer 10), and are in contact with the same film layer (e.g., the insulating layer 35); and the plurality of connecting sub-electrodes 31 and the plurality of connecting sub-electrodes 32 are both positioned in the same electrode layer (e.g., the connecting electrode layer 20), and are in contact with the same film layer (e.g., the insulating layer 35).

For example, the first electrode layer 10 is made of a transparent conducting material. For example, the transparent conducting material can be selected from transparent metal oxide such as Indium Tin Oxide (ITO), Indium Zinc Oxide (MO) or the like. For example, the connecting electrode layer 20 is made of a transparent conducting material or a metal material. For example, the metal material can be selected from silver (Ag), aluminum (Al), molybdenum (Mo), titanium (Ti), aluminum alloy or other suitable materials. For example, the insulating layer 35 can include an inorganic insulating material or an organic insulating material. For example, the inorganic insulating material may be one or a random combination of silicon oxide, silicon nitride and silicon oxynitride; and the organic insulating material may be one or a random combination of polyimide, polyphthalimide, polyphthalamide, acrylic resin, benzocyclobutene or phenolic resin.

For example, as shown in FIG. 13, the touch sensor 01 can further include a second electrode layer 30. For example, the second electrode layer 30 includes the above-mentioned jumper conductor wire 21 and the above-mentioned jumper conductor wire 22 (refer to FIG. 20B below). For example, as shown in FIG. 13, the second electrode layer 30, for example, is arranged between the first electrode layer 10 and the insulating layer 35. For example, the second electrode layer 30 (e.g., a surface of the second electrode layer 30) and the first electrode layer 10 (e.g., a surface of the first electrode layer 10) are in direct contact, so that a manufacturing process of the touch sensor 01 can be simplified. For example, the second electrode layer 30 is made of a metal material.

For example, as shown in FIG. 13, the touch sensor 01 can further include a transparent base material 36. For example, the transparent base material 36 is arranged on one side of the first electrode layer 10 away from the connecting electrode layer 20. For example, the transparent base material 36 can be made of Cyclo Olefin Polymer (COP) or other applicable materials.

In some examples, the touch sensor 01 shown in FIG. 13 can further include the protective layer 176 (which is not shown in FIG. 13) shown in FIG. 6C and FIG. 6D, and the protective layer 176 is positioned on one side of the connecting electrode layer 20 away from the transparent base material 36 (e.g., on the surface of the connecting electrode layer 20 away from the transparent base material 36).

It should be noted that in some examples, the plurality of first touch sub-electrodes 111, the plurality of second touch sub-electrodes 121, the plurality of ring-shaped sub-electrodes 134 and the plurality of intermediate sub-electrodes 133 are all positioned on a plurality of electrode layers, which is not repeated herein for simplicity.

For example, as shown in FIG. 5, FIG. 8, FIG. 10A and FIG. 10B, edges of the first touch sub-electrode 111 and the second touch sub-electrode 121 that are adjacent respectively have corresponding bent structures 131; the first touch sub-electrode 111 and the second touch sub-electrode 121 that are adjacent in the first region 411 intersect with each other and have a first intersecting depth; the first touch sub-electrode 111 and the second touch sub-electrode 121 that are adjacent in the third region 413 intersect with each other and have a second intersecting depth; and the first intersecting depth is greater than the second intersecting depth.

For example, as shown in FIG. 5, FIG. 8, FIG. 10A and FIG. 10B, in the first touch sub-electrode 111 and second touch sub-electrode 121, both of which are adjacent to each other, the edge of the first touch sub-electrode 111 and the edge of the second touch sub-electrode 121 have the same extending direction (at a random position). For example, as shown in FIG. 5, FIG. 8, FIG. 10A and FIG. 10B, in the first touch sub-electrode 111 and second touch sub-electrode 121, both of which are adjacent to each other, the edge of the first touch sub-electrode 111 includes a plurality of first line segments L1 (e.g., straight line segments) sequentially connected, and the edge of the second touch sub-electrode 121 includes a plurality of second line segments L2 (e.g., straight line segments) sequentially connected; the plurality of first line segments L1 and the plurality of second line segments L2 correspond one to one and are opposite to each other; each of the plurality of first line segments L1 has the same extending direction with the corresponding second line segment L2; two adjacent (e.g., any two adjacent) first line segments L1 intersect with each other, and two adjacent (e.g., any two adjacent) second line segments L2 intersect with each other; and the first line segment L1 and second line segment L2 that are adjacent to each other (e.g., any two adjacent) are in parallel with each other.

For example, as shown in FIG. 10A and FIG. 10B, an intersecting depth of the first touch sub-electrode 111 and the second touch sub-electrode 121 refers to: in two adjacent first line segments, a distance from an intersection point of two first line segments to a virtual connecting line between an end point of the first one of the first line segments, which is not in contact with the second one of the first line segments, and an end point of the second one of the first line segments, which is not in contact with the first one of the first line segments; the first intersecting depth cd1 refers to the maximum value of the intersecting depth of the first touch sub-electrode 111 and the second touch sub-electrode 121 that are adjacent in the first region 411; the second intersecting depth cd2 refers to the maximum value of the intersecting depth of the first touch sub-electrode 111 and the second touch sub-electrode 121 that are adjacent in the third region 413; and as shown in FIG. 10A and FIG. 10B, cd1 is less than cd2.

For example, by making the first intersecting depth cd1 greater than the second intersecting depth cd2, an intersecting area of the first touch sub-electrode 111 and the second touch sub-electrode 121 that are adjacent in the first region 411 can be increased, and thus, the amount of touch signals of the first region 411 can be increased.

It should be noted that although the touch sub-electrode 111 and the touch sub-electrode 121 of the touch sensor 01 of the display apparatus 03 shown in FIG. 6A to FIG. 11, FIG. 12A to FIG. 12D and other related drawings are both made of the transparent conductive materials, the embodiments of the present disclosure are not limited thereto. For example, according to practical application demands, at least one of the touch sub-electrode 111 and the touch sub-electrode 121 of the touch sensor 01 of the display apparatus 03 shown in FIG. 6A to FIG. 11, FIG. 12A to FIG. 12D and other related drawings can also be made of a metal mesh.

It should be noted that although the first region 411 of the touch sensor 01 of the display apparatus 03 shown in FIG. 6A to FIG. 11, FIG. 12A to FIG. 12D and other related drawings simultaneously adopt three designs below to increase the amount of touch signals of the first region 411: the two-bridge design, the increase of the intersecting depth of the adjacent touch sub-electrode 111 and touch sub-electrode 121 and reduction of the distance between the adjacent touch sub-electrode 111 and touch sub-electrode 121 (e.g., reduction of the number of the dummy electrodes between the adjacent touch sub-electrode 111 and touch sub-electrode 121), the embodiments of the present disclosure are not limited thereto. For example, according to practical application demands, the first region 411 of the touch sensor 01 of the display apparatus 03 shown in FIG. 6A to FIG. 11, FIG. 12A to FIG. 12D and other related drawings can also adopt any one or any two of the three designs above.

In an example, the amount of touch signals of the first region 411 can be increased only by adopting the two-bridge design. In the above-mentioned example, the touch sensor includes the opening region 421, a plurality of first touch electrodes 11, a plurality of second touch electrodes 12 and a plurality of connecting sub-electrodes 32. The center of the opening region 421 and the center of the touch sensor do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 421; the touch sensor 01 has the first region 411, the second region 412 and the third region 413 which are sequentially laid out in the second direction D2; the opening region 421 is positioned in the second region 412; the adjacent second touch sub-electrodes 121 in the first region 411 are electrically connected via a corresponding first number of connecting sub-electrodes 32; and the adjacent second touch sub-electrodes 121 in the third region 413 are electrically connected via a corresponding second number of connecting sub-electrodes 32, and the second number is greater than the first number.

In another example, the amount of touch signals of the first region 411 can be increased only by reducing the distance between the adjacent touch sub-electrode 111 and touch sub-electrode 121 (e.g., reducing the number of the dummy electrodes between the adjacent touch sub-electrode 111 and touch sub-electrode 121). In the above-mentioned another examples, the touch sensor includes the opening region 421, a plurality of first touch electrodes 11 and a plurality of second touch electrodes 12. The center of the opening region 421 and the center of the touch sensor do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 421; the touch sensor 01 has the first region 411, the second region 412 and the third region 413 which are sequentially laid out in the second direction D2; the opening region 421 is positioned in the second region 412; and a distance between the first touch sub-electrode 111 and the second touch sub-electrode 121 that are adjacent in the first region 411 is less than that between the first touch sub-electrode 111 and the second touch sub-electrode 121 that are adjacent in the third region 413.

In yet another example, the touch sensor 01 provided by at least one embodiment of the present disclosure may also not adopt the technical solution of increasing the amount of touch signals of the first region 411, but just both the first region 411 and the third region 413 on both sides of the opening region 421 include the first touch sub-electrodes 111 and the second touch sub-electrodes 121. In the above-mentioned yet another example, the touch sensor includes the opening region 421, a plurality of first touch electrodes 11 and a plurality of second touch electrodes 12. The center 012 of the opening region 421 and the center 011 of the touch sensor do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 421; the touch sensor 01 has the first region 411, the second region 412 and the third region 413 which are sequentially laid out in the second direction D2; the opening region 421 is positioned in the second region 412; and an area of the first touch sub-electrode 111 in the first region 411 is less than that of the first touch sub-electrode 111 in the third region 413, or an area of the second touch sub-electrode 121 in the first region 411 is less than that of the second touch sub-electrode 121 in the third region 413. For example, by enabling the first region 411 and the third region 413 on both sides of the opening region 421 to both include the first touch sub-electrodes 111 and the second touch sub-electrodes 121, an active touch area of the touch sensor can be increased, so that user experience can be improved.

In some examples, the touch sensor 01 includes the opening region 422, a plurality of first touch electrodes 11, a plurality of second touch electrodes 12, at least one jumper conductor wire 21, and at least one first conducting electrode 211. The center of the opening region 422 and the center of the touch sensor 01 do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 422; at least one of the plurality of first touch electrodes 11 is separated into the electrode portion 112 and the electrode portion 113 by the opening region 422; each of the electrode portion 112 and the electrode portion 113 includes at least one first touch sub-electrode 111; the electrode portion 112 and the electrode portion 113 are positioned on both sides of the opening region 422 in the first direction D1; at least one jumper conductor wire 21 at least partially surrounds the opening region 422; at least one first conducting electrode 211 is respectively and directly connected with the end portion of at least one jumper conductor wire 21 close to the electrode portion 112; the line width of at least one of at least one jumper conductor wire 21 is less than the side length of such a side (connected with at least one of at least one jumper conductor wire 21) of the first conducting electrode 211 connected with the at least one of at least one jumper conductor wire 21; and the electrode portion 112 and the electrode portion 113 are at least electrically connected with each other via the corresponding connecting sub-electrode 31, the corresponding first conducting electrode 211 and the corresponding jumper conductor wire 21.

For example, by arranging at least one first jumper conductor wire 21, two portions of the first touch electrode 11 that are separated by the opening region can be electrically connected with each other, so that poor touch, caused by the opening region, in a region where part of the first touch electrodes 11 are positioned can be avoided.

For example, by arranging the first conducting electrode 211 and making the size (the side length) of the first conducting electrode greater than the line width of the jumper conductor wire 21, the electrode portion 112 and the jumper conductor wire 21 can be electrically connected better.

In some examples, the touch sensor 01 further includes at least one first jumper conductor wire 22. For example, by arranging at least one first jumper conductor wire 22, two portions of the second touch electrode 12 that are separated by the opening region can be electrically connected with each other, so that poor touch, caused by the opening region, in a region where part of the second touch electrodes 12 are positioned, can be avoided.

The connecting mode of the second touch electrode 12 separated into two portions (e.g., the electrode portion 126 and the electrode portion 127) by the opening region 422 will be exemplarily illustrated in connection with FIG. 14A to FIG. 19; and after that, the connecting mode of the first touch electrode 11 separated into two portions (e.g., the electrode portion 112 and the electrode portion 113) by the opening region 422 will be exemplarily illustrated.

Figure 14A:
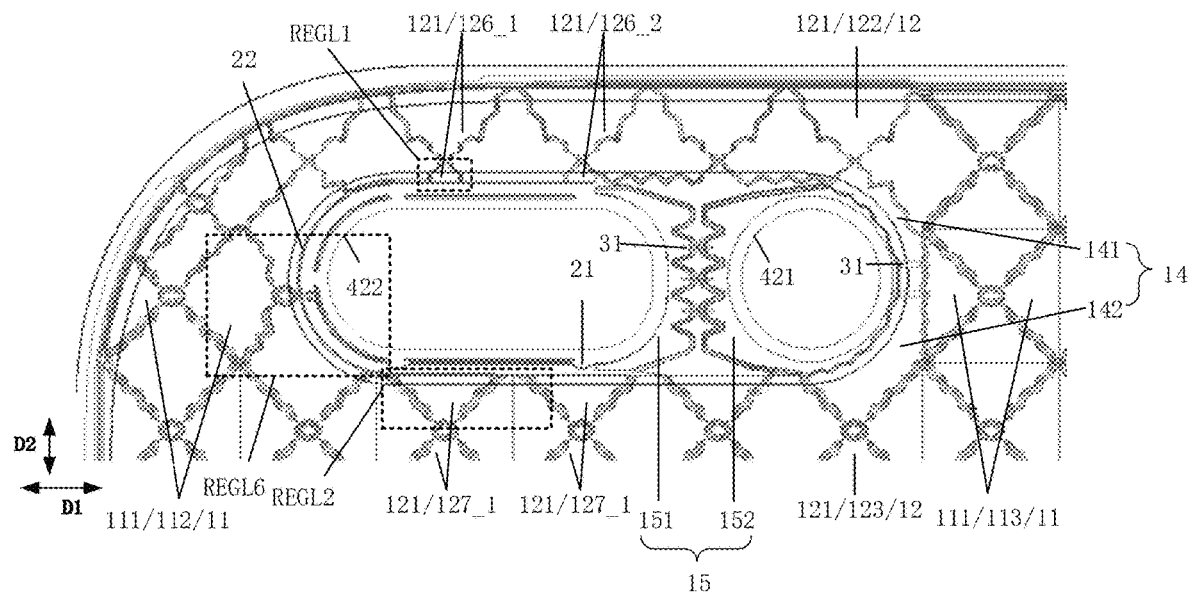
FIG. 14A is one additional schematic diagram of the partial region included in the touch sensor of the display apparatus shown in FIG. 4.
Figure 14B:
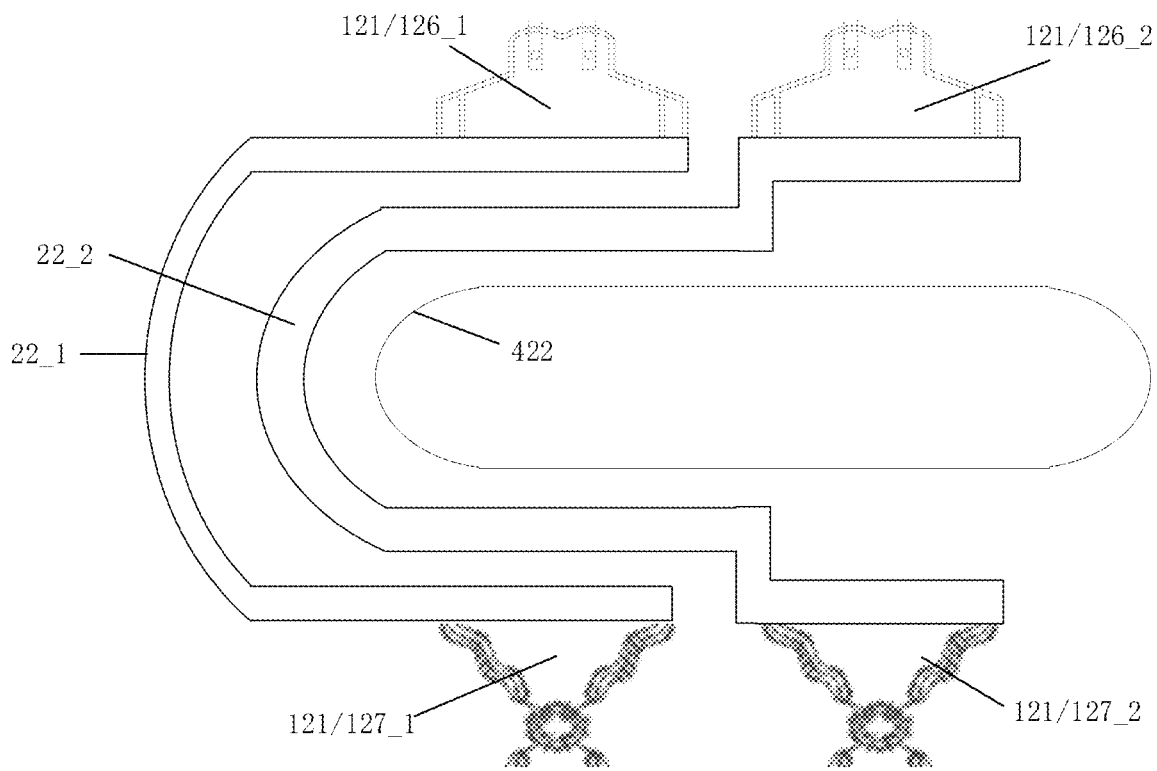
FIG. 14B is a schematic diagram showing that two electrode portions of a first touch electrode provided by at least one embodiment of the present disclosure that are separated by an opening region are electrically connected via a jumper conductor wire.
Figure 15:
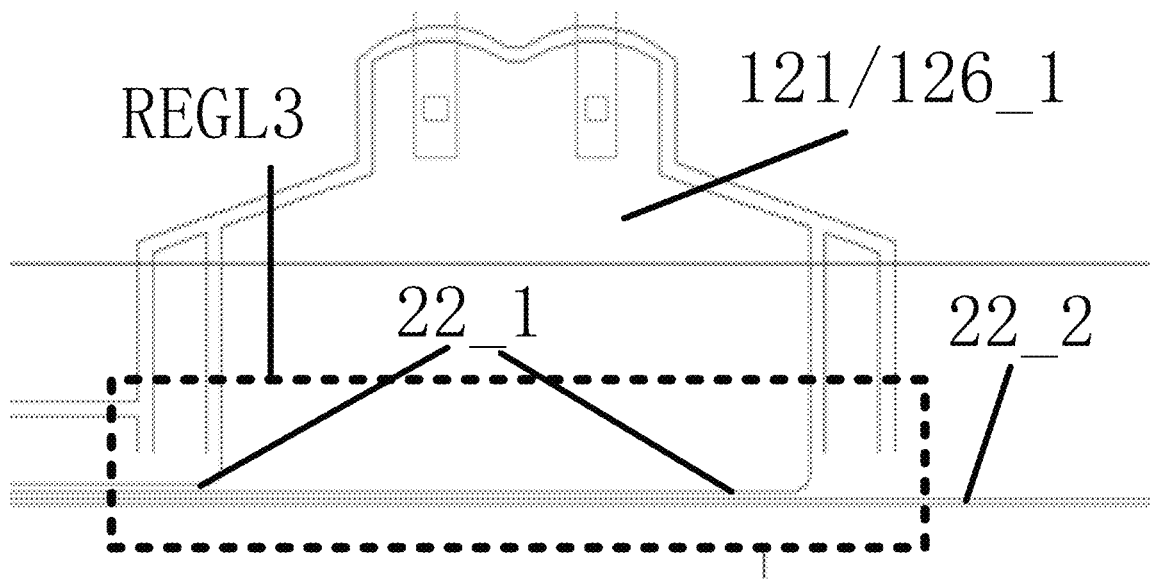
FIG. 15 is a plane schematic diagram of a partial region of the touch sensor shown in FIG. 14A.
Figure 16:
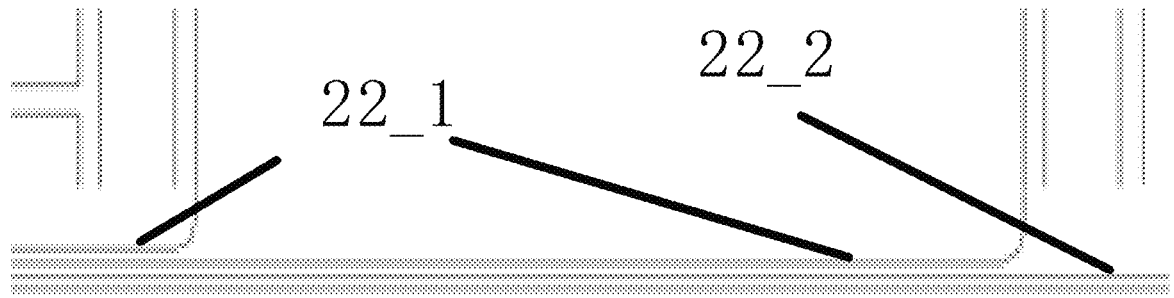
FIG. 16 is a plane schematic diagram of a partial region of the touch sensor shown in FIG. 15.
Figure 17:
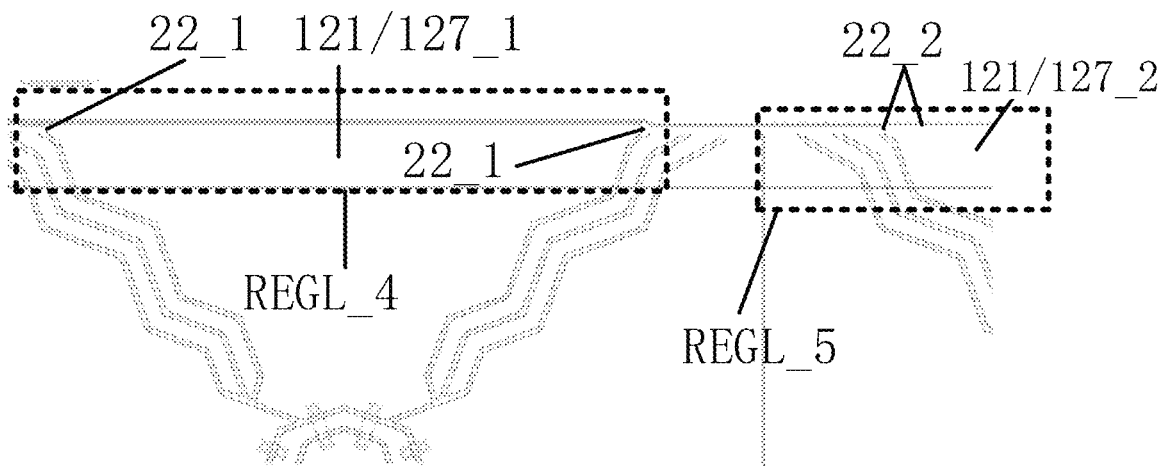
FIG. 17 is a plane schematic diagram of a partial region of the touch sensor shown in FIG. 14A.
Figure 18:
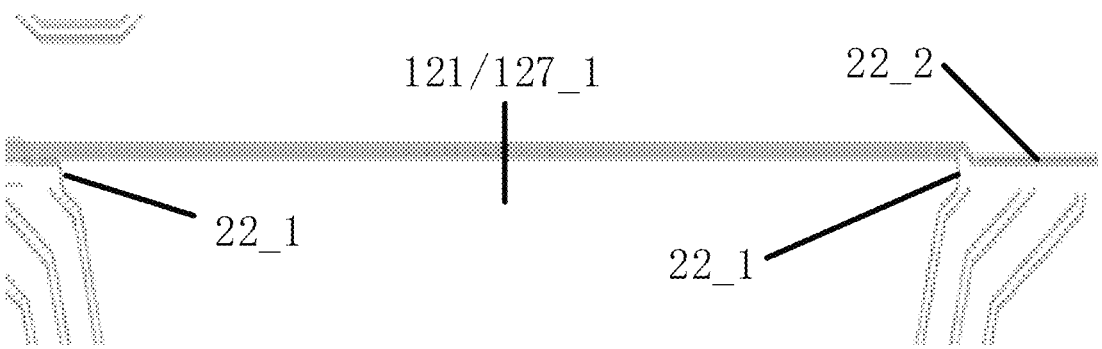
FIG. 18 is a plane schematic diagram of a partial region of the touch sensor shown in FIG. 17.
Figure 19:
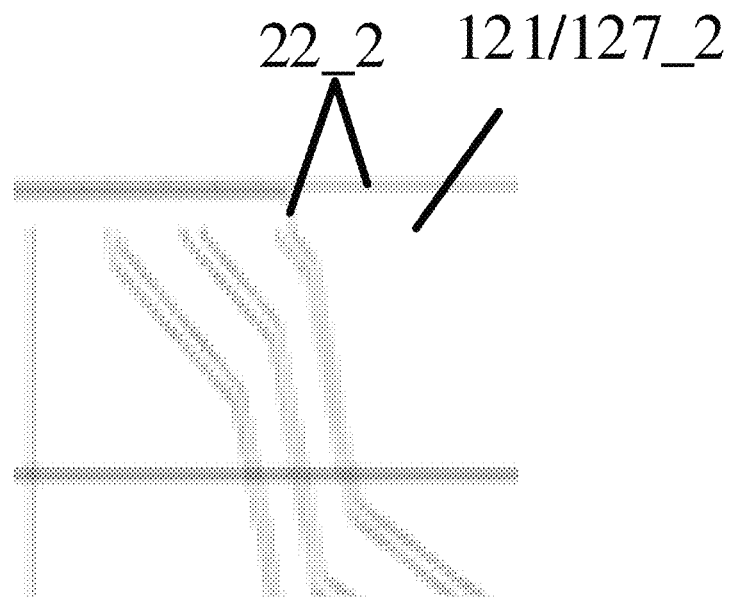
FIG. 19 is a plane schematic diagram of a partial region of the touch sensor shown in FIG. 17.

FIG. 14A is one additional schematic diagram of the partial region REG1 included in the touch sensor 01 of the display apparatus 03 shown in FIG. 4; and FIG. 14B is a schematic diagram for showing that two electrode portions of the first touch electrode 11 provided by at least one embodiment of the present disclosure that are separated by the opening region 422 are electrically connected via the jumper conductor wire. FIG. 15 is a plane schematic diagram of a partial region REGL1 of the touch sensor 01 shown in FIG. 14A; FIG. 16 is a plane schematic diagram of a partial region REGL3 of the touch sensor 01 shown in FIG. 15; FIG. 17 is a plane schematic diagram of a partial region REGL2 of the touch sensor 01 shown in FIG. 14A; FIG. 18 is a plane schematic diagram of a partial region REGL4 of the touch sensor 01 shown in FIG. 17; and FIG. 19 is a plane schematic diagram of a partial region REGL5 of the touch sensor 01 shown in FIG. 17.

For example, as shown in FIG. 14A to FIG. 19, one of the plurality of second touch electrodes 12 is separated into an electrode portion 126_1 and an electrode portion 127_1 by the opening region 422, and another one of the plurality of second touch electrodes 12 is separated into an electrode portion 126_2 and an electrode portion 127_2 by the opening region 422; at least one jumper conductor wire 22 includes a plurality of jumper conductor wires 22 (e.g., a jumper conductor wire 22_1 and a jumper conductor wire 22_2) arranged side by side; the electrode portion 126_1 and the electrode portion 127_1 are electrically connected with each other via the jumper conductor wire 22_1; and the electrode portion 126_2 and the electrode portion 127_2 are electrically connected with each other via the jumper conductor wire 22_2.

For example, as shown in FIG. 14A to FIG. 19, both ends of the jumper conductor wire 22_1 are respectively in direct contact with the electrode portion 126_1 (e.g., at least one second touch sub-electrode 121 included in the electrode portion 126_1) and the electrode portion 127_1 (e.g., at least one second touch sub-electrode 121 included in the electrode portion 127_1), so that a signal on the electrode portion 126_1 can be transferred to the electrode portion 127_1 via the jumper conductor wire 22_1.

For example, as shown in FIG. 14A to FIG. 19, both ends of the jumper conductor wire 22_2 are respectively in direct contact with the electrode portion 126_2 (e.g., at least one second touch sub-electrode 121 included in the electrode portion 126_2) and the electrode portion 127_2 (e.g., at least one second touch sub-electrode 121 included in the electrode portion 127_2), so that a signal on the electrode portion 126_2 can be transferred to the electrode portion 127_2 via the jumper conductor wire 22_2.

For example, as shown in FIG. 14A to FIG. 19, at least one second touch sub-electrode 121 included in the electrode portion 126 and the corresponding jumper conductor wire 22 are positioned on different electrode layers in the direction perpendicular to the touch sensor 01, and the end portion of the corresponding jumper conductor wire 22 close to the electrode portion 126 is in direct contact with the surface of at least one second touch sub-electrode 121 included in the electrode portion 126; and at least one second touch sub-electrode 121 included in the electrode portion 127 and the corresponding jumper conductor wire 22 are positioned on different electrode layers in the direction perpendicular to the touch sensor 01, and the end portion of the corresponding jumper conductor wire 22 close to the electrode portion 127 is in direct contact with the surface of at least one second touch sub-electrode 121 included in the electrode portion 127.

For example, at least one jumper conductor wire 22 (e.g., the jumper conductor wire 22_1 and the jumper conductor wire 22_2) can be made of a metal material, and in such a case, the channel impedance (e.g., resistance) between the electrode portion 126 and the electrode portion 127 can be reduced, so that the electric signal can pass through the at least one jumper conductor wire 22 more easily, and thus, touch performance can be improved.

For example, as shown in FIG. 14A to FIG. 19, a length (e.g., a physical length) of the jumper conductor wire 22_2 is greater than that of the jumper conductor wire 22_1. For example, as shown in FIG. 14A to FIG. 16, a partial region of the jumper conductor wire 22_2 and the jumper conductor wire 22_1 coincide with each other in the second direction D2; compared to the jumper conductor wire 22_1, the portion of the jumper conductor wire 22_2 coinciding with the jumper conductor wire 22_1 in the second direction D2 is closer to the center of the opening region 422 in the second direction D2, i.e., the length of the jumper conductor wire 22 is negatively correlated with a distance, between the jumper conductor wire 22 and the center of the opening region 422 in the second direction D2, in the second direction D2; and the length of jumper conductor wire 22 is negatively correlated with a distance, between the jumper conductor wire 22 and the center of the opening region 422 in the first direction D1, in the first direction D1.

It should be noted that in order to clearly show the jumper conductor wire for electrically connecting two electrode portions of the first touch electrode 11 that are separated by the opening region 422, FIG. 14B magnifies a partial structure (e.g., magnifies the line width of the jumper conductor wire), and thus, FIG. 14B is merely used for showing the jumper conductor wire 22 for electrically connecting two electrode portions of the first touch electrode 11 that are separated by the opening region 422 and an arranging mode of a plurality of jumper conductor wires 22, but is not intended to limit the shape of the jumper conductor wire 22, the shape of the second touch sub-electrode 121 and the like.

For example, as shown in FIG. 14A, FIG. 10A and FIG. 10B, two adjacent first touch sub-electrodes 111 included in the electrode portion 126 and two adjacent first touch sub-electrodes 111 included in the electrode portion 127 are respectively, electrically connected with each other at least via the corresponding connecting sub-electrodes 32.

The connecting mode of the first touch electrode 11 separated into two electrode portions (e.g., the electrode portion 112 and the electrode portion 113) by the opening region 422 will be exemplarily illustrated below in connection with FIG. 14A, FIG. 20A and FIG. 20B.

Figure 20A:
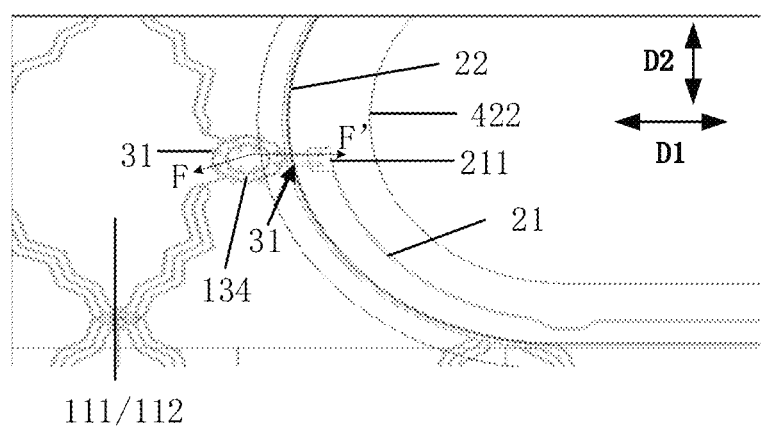
FIG. 20A is a plane schematic diagram of a partial region of the touch sensor shown in FIG. 14A.

FIG. 20A is a plane schematic diagram of a partial region REGL6 of the touch sensor shown 01 in FIG. 14A; FIG. 20B is a sectional schematic diagram along an line FF' in FIG. 20A; and FIG. 20C is another sectional schematic diagram along the line FF' in FIG. 20A. For example, for example, as shown in FIG. 14A and FIG. 20A, at least one of the plurality of first touch electrodes 11 is separated into two electrode portions (e.g., the electrode portion 112 and the electrode portion 113) by the opening region 422; the touch sensor 01 further includes at least one jumper conductor wire 21, and at least one jumper conductor wire 21 at least partially surrounds (e.g., partially surrounds) the opening region 422; and the electrode portion 112 and the electrode portion 113 are electrically connected with each other via at least one jumper conductor wire 21 and a transition touch electrode 15.

For example, by arranging at least one first jumper conductor wire 21 and the transition touch electrode 15, two electrode portions of the first touch electrode 11 that are separated by the opening region can be electrically connected with each other, so that poor touch, caused by the opening region, in a region where part of the first touch electrodes 11 are positioned can be avoided.

For example, as shown in FIG. 14A and FIG. 20A, the transition touch electrode 15 is at least partially positioned between the opening region 422 and the opening region 421, and includes a transition touch sub-electrode 151 and a transition touch sub-electrode 152 arranged side by side in the first direction D1 and electrically connected with each other. For example, the transition touch electrode 15 further includes a connecting sub-electrode 31 for electrically connecting the transition touch sub-electrode 151 and the transition touch sub-electrode 152.

For example, as shown in FIG. 14A and FIG. 20A, the transition touch sub-electrode 151 at least partially surrounds the opening region 422, and the transition touch sub-electrode 152 at least partially surrounds (e.g., fully surrounds) the opening region 421. For example, as shown in FIG. 14A, the transition touch sub-electrode 151 is arranged on one side of the opening region 422 close to the opening region 421, and partially surrounds the opening region 422.

For example, as shown in FIG. 14A and FIG. 20A, the electrode portion 112 and the transition touch sub-electrode 151 are electrically connected with each other at least via at least one jumper conductor wire 21 and the corresponding connecting sub-electrode 31; the transition touch sub-electrode 151 and the transition touch sub-electrode 152 are electrically connected with each other via the corresponding connecting sub-electrode 31; and the transition touch sub-electrode 152 and the electrode portion 113 are electrically connected with each other via the corresponding connecting sub-electrode 31.

Figure 20B:
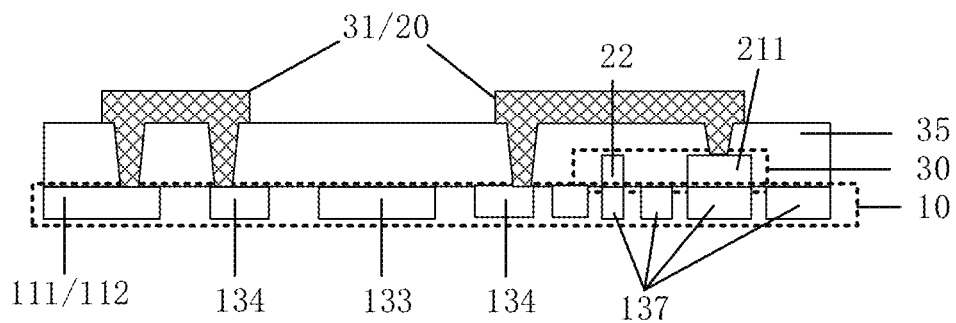
FIG. 20B is a sectional schematic diagram along a line FF' in FIG. 20A.
Figure 20C:
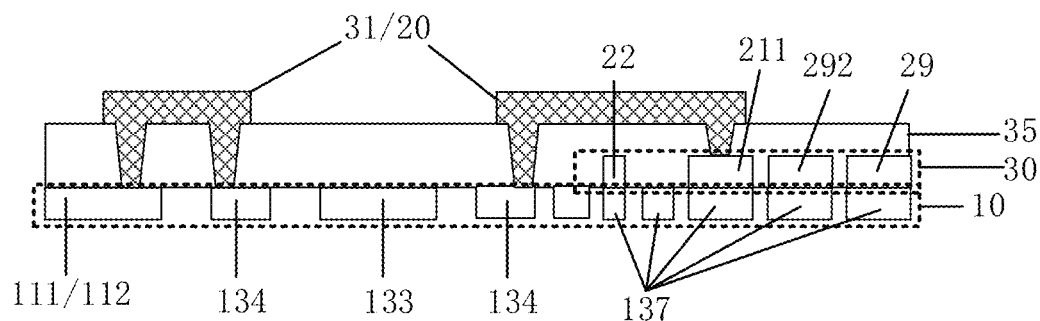
FIG. 20C is another sectional schematic diagram along the line FF' in FIG. 20A.
Figure 36:
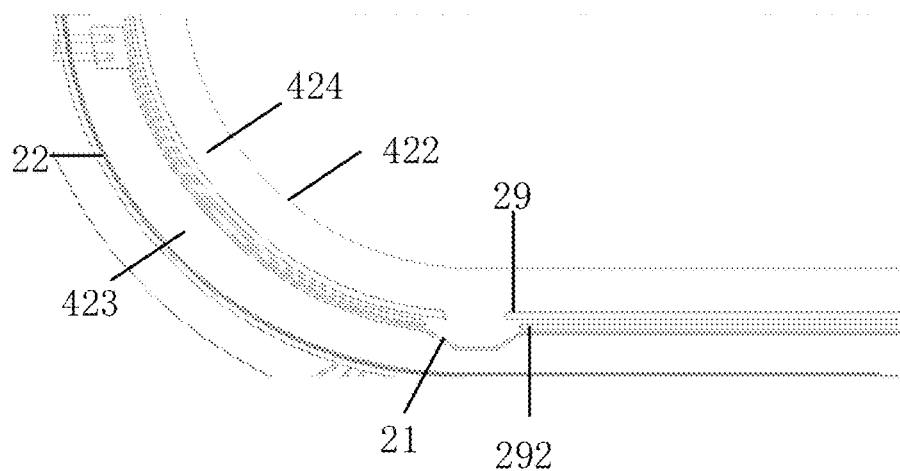
FIG. 36 is a plane schematic diagram of a partial region of the touch sensor shown in FIG. 35.

In some examples, the touch sensor 01 shown in FIG. 20A can further include a crack blocking ring 29 and a crack blocking ring 292 (which is not shown in FIG. 20A) as shown in FIG. 36, and in such a case, the sectional schematic diagram along the line FF' in FIG. 20A is as shown in FIG. 20B, and is not repeated herein for simplicity.

The electrical connecting mode of the electrode portion 112 and the transition touch sub-electrode 151 will be exemplarily illustrated below in connection with FIG. 14A, FIG. 20A and FIG. 20B.

For example, as shown in FIG. 20A and FIG. 20B, the touch sensor further includes a first conducting electrode 211, and the first conducting electrode 211 is directly connected with the end portion of the jumper conductor wire 21 close to the electrode portion 112. for example, the first conducting electrode 211 (e.g., a conducting block) and the jumper conductor wire 21 are made of the same material, positioned in the same electrode layer (e.g., the second electrode layer 30), and in contact with the same film layer (e.g., the insulating layer 35); and for example, the first conducting electrode 211 and the jumper conductor wire 21 are of an integrated structure. For example, the first conducting electrode 211 and the jumper conductor wire 21 are of an integrated structure, i.e., the first conducting electrode 211 and the jumper conductor wire 21 are formed in the same patterning process, and there is no interface therebetween.

For example, as shown in FIG. 20A, one side (i.e., the side close to the jumper conductor wire 21) of two sides of the first conducting electrode 211 opposite in the second direction D2 is directly connected with the end portion (i.e., the end portion close to the first conducting electrode 211) of the jumper conductor wire 21 connected with the first conducting electrode 211.

For example, a ratio of a side length of two sides of the first conducting electrode 211 opposite in the first direction D1 to a line width of the jumper conductor wire 21 connected with the first conducting electrode 211 is 16 to 400.

For example, as shown in FIG. 20A and FIG. 20B, the electrode portion 112 and the first conducting electrode 211 are electrically connected with each other via the corresponding connecting sub-electrode 31 and ring-shaped sub-electrode 134. It should be noted that in some examples, the ring-shaped sub-electrode 134 can also be used as one portion of the electrode portion 112. Herein, for describing the transferring process of the signal more clearly, the ring-shaped sub-electrode 134 and the electrode portion 112 are described as two parts, but the embodiments of the present disclosure are not limited thereto.

For example, as shown in FIG. 20A and FIG. 20B, the ring-shaped sub-electrode 134 and at least one first touch sub-electrode 111 included in the electrode portion 112 are electrically connected via the connecting sub-electrode 31 corresponding to at least one first touch sub-electrode 111 included in the electrode portion 112 and the ring-shaped sub-electrode 134; and the ring-shaped sub-electrode 134 and the corresponding first conducting electrode 211 are electrically connected via the corresponding connecting sub-electrode 31 (i.e., the connecting sub-electrode 31 corresponding to the ring-shaped sub-electrode 134 and the corresponding first conducting electrode 211).

For example, as shown in FIG. 20A and FIG. 20B, the first conducting electrode 211 and the corresponding connecting sub-electrode 31 are positioned on different electrode layers and partially overlap; and in the direction perpendicular to the touch sensor 01, there is the insulating layer 35 between the first conducting electrode 211 and the corresponding connecting sub-electrode 31, and the first conducting electrode 211 and a first end of the corresponding connecting sub-electrode 31 are electrically connected with each other via the via hole in the insulating layer 35. For example, as shown in FIG. 20A, the first conducting electrode 211 is electrically connected with two connecting sub-electrodes 31 arranged side by side in the second direction D2.

For example, as shown in FIG. 20A and FIG. 20B, a second end of the corresponding connecting sub-electrode 31 and the corresponding ring-shaped sub-electrode 134 are electrically connected with each other via the via hole in the insulating layer 35. For example, as shown in FIG. 20A and FIG. 20B, the ring-shaped sub-electrode 134 electrically connected with the first conducting electrode 211 is electrically connected with the electrode portion 112 (e.g., at least one first touch sub-electrode 111 included in the electrode portion 112) via the corresponding connecting sub-electrode 31 and the via hole in the insulating layer 35.

For example, as shown in FIG. 14A, FIG. 20A and FIG. 20B, a signal on the electrode portion 112 (e.g., at least one first touch sub-electrode 111 included in the electrode portion 112) can be transferred to the transition touch sub-electrode 151 sequentially via the connecting sub-electrode 31, the ring-shaped sub-electrode 134, the connecting sub-electrode 31, the first conducting electrode 211 and the jumper conductor wire 21.

For example, as shown in FIG. 20A and FIG. 20B, the number of the connecting sub-electrodes 31 (i.e., the connecting sub-electrodes 31 for electrically connecting the ring-shaped sub-electrode 134 and the corresponding first conducting electrode 211) corresponding to the ring-shaped sub-electrode 134 and the corresponding first conducting electrode 211 is greater than or equal to 2; the connecting sub-electrodes 31 corresponding to the ring-shaped sub-electrode 134 and the corresponding first conducting electrode 211 are arranged side by side in the second direction D2; and a distance between two sides of two outermost connecting sub-electrodes 31 away from each other in the second direction D2 in the connecting sub-electrodes 31 corresponding to the ring-shaped sub-electrode 134 and the corresponding first conducting electrode 211 is less than that between two sides of the corresponding first conducting electrode 211 opposite in the second direction D2.

For example, the distance (i.e., the width of the connecting sub-electrode 31 in the second direction D2) between two opposite sides of at least one of the connecting sub-electrodes 31 corresponding to the ring-shaped sub-electrode 134 and the corresponding first conducting electrode 211 in the second direction D2 is 20 microns to 200 microns. For example, a distance between adjacent sides of two adjacent connecting sub-electrodes 31 in the connecting sub-electrodes 31 corresponding to the ring-shaped sub-electrode 134 and the corresponding first conducting electrode 211 in the second direction D2 is 5 microns to 100 microns. For example, a distance between two sides of at least one first conducting electrode 211 opposite in the first direction D1 is 0.08 millimeter to 2.0 millimeters; and the distance between two sides of at least one first conducting electrode 211 opposite in the second direction D2 is 0.08 millimeter to 2.0 millimeters.

For example, as shown in FIG. 20A and FIG. 20B, the jumper conductor wire 22 partially overlaps with the connecting sub-electrode 31 (i.e., the connecting sub-electrodes 31 for electrically connecting the ring-shaped sub-electrode 134 and the corresponding first conducting electrode 211) corresponding to the ring-shaped sub-electrode 134 and the corresponding first conducting electrode 211 in the direction perpendicular to the touch sensor 01.

For example, as shown in FIG. 20B, the first electrode layer 10 of the touch sensor further includes a plurality of dummy electrodes 137 spaced from each other.

For example, as shown in FIG. 14A and FIG. 20A, the end portion of the jumper conductor wire 21 away from the electrode portion 112 is directly connected with the transition touch sub-electrode 151. For example, the end portion of the jumper conductor wire 21 away from the electrode portion 112 is in direct contact with the transition touch sub-electrode 151. For example, the end portion of the jumper conductor wire 21 away from the electrode portion 112 and a first transition touch sub-electrode 151 are positioned on different electrode layers in the direction perpendicular to the touch sensor 01; and the end portion of the jumper conductor wire 21 away from the electrode portion 112 is in direct contact with the surface of the first transition touch sub-electrode 151.

For example, as shown in FIG. 14A and FIG. 20A, compared to the jumper conductor wire 21, the jumper conductor wire 21 is farther away from the edge of the opening region 422, and in such a case, the jumper conductor wire 21 and the jumper conductor wire 22 can be positioned in the same electrode layer, and in contact with the same film layer (e.g., the insulating layer 35) without causing a short circuit of the first touch electrode 11 and the second touch electrode 12, and thus, the structure and the manufacturing process of the touch sensor 01 can be simplified.

For example, at least one jumper conductor wire 21 can be made of a metal material, and in such a case, the channel impedance (e.g., resistance) between the electrode portion 112 and the transition touch sub-electrode 151 can be reduced, so that the electric signal can pass through the at least one jumper conductor wire 21 more easily, and thus, touch performance can be improved.

In an example, as shown in FIG. 20B, the jumper conductor wire 21, the jumper conductor wire 22 and the first conducting electrode 211 are positioned in the same electrode layer, so that the structure and the manufacturing process of the touch sensor 01 can be simplified, but the embodiments of the present disclosure are not limited thereto. In another example, the jumper conductor wire 21, the jumper conductor wire 22 and the first conducting electrode 211 can also be respectively positioned on a plurality of electrode layers.

The electrical connecting mode of the transition touch sub-electrode 151 and the transition touch sub-electrode 152 will be exemplarily illustrated below in connection with FIG. 14A, FIG. 29A and FIG. 29B.

Figure 29A:
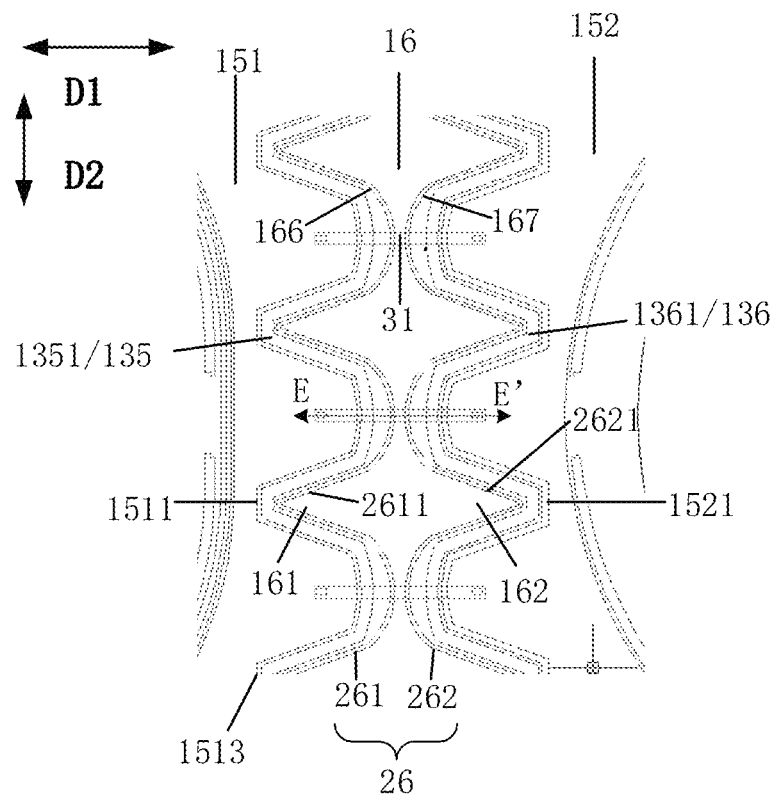
FIG. 29A is a plane schematic diagram of a partial region of the touch sensor shown in FIG. 28.
Figure 29B:
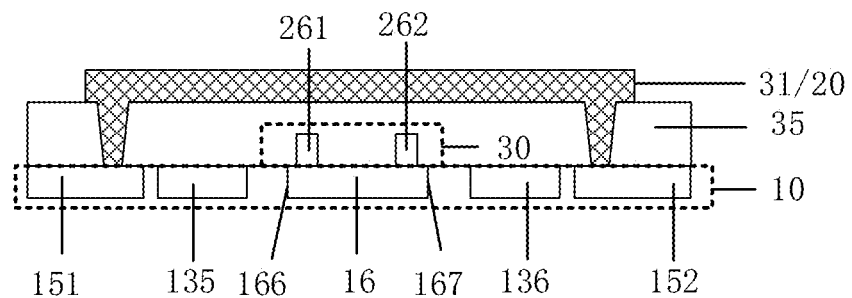
FIG. 29B is a sectional schematic diagram along a line EE' shown in FIG. 29A.

For example, as shown in FIG. 14A, FIG. 29A and FIG. 29B, the transition touch sub-electrode 151 and the transition touch sub-electrode 152 are electrically connected via the corresponding connecting sub-electrode 31; the transition touch sub-electrode 151 and the corresponding connecting sub-electrode 31 are positioned on different electrode layers and partially overlap; and in the direction perpendicular to the touch sensor 01, there is the insulating layer 35 between the transition touch sub-electrode 151 and the corresponding connecting sub-electrode 31, and the transition touch sub-electrode 151 and the first end of the corresponding connecting sub-electrode 31 are electrically connected with each other via the via hole in the insulating layer 35. For example, as shown in FIG. 14A, FIG. 29A and FIG. 29B, the transition touch sub-electrode 152 and the corresponding connecting sub-electrode 31 are positioned on different electrode layers and partially overlap; and in the direction perpendicular to the touch sensor 01, there is the insulating layer 35 between the transition touch sub-electrode 152 and the corresponding connecting sub-electrode 31, and the transition touch sub-electrode 152 and the second end of the corresponding connecting sub-electrode 31 are electrically connected with each other via the via hole in the insulating layer 35.

For example, as shown in FIG. 29B, the transition touch sub-electrode 151 and the transition touch sub-electrode 152 are positioned in the same electrode layer, and in contact with the same film layer (e.g., the insulating layer 35), so that the structure and the manufacturing process of the touch sensor 01 can be simplified, but the embodiments of the present disclosure are not limited thereto, the transition touch sub-electrode 151 and the transition touch sub-electrode 152 can also be respectively positioned on different electrode layers. For example, both the transition touch sub-electrode 151 and the transition touch sub-electrode 152 are positioned on the first electrode layer 10. For example, the transition touch sub-electrode 151 is positioned in the same electrode layer with the transition touch sub-electrode 152, the plurality of first touch sub-electrodes 111, the plurality of second touch sub-electrodes 121, the plurality of ring-shaped sub-electrodes 134 and the plurality of intermediate sub-electrodes 133.

For example, as shown in FIG. 14A, FIG. 29A and FIG. 29B, a signal on the transition touch sub-electrode 151 can be transferred to the transition touch sub-electrode 152 via the connecting sub-electrode 31.

For example, as shown in FIG. 14A, FIG. 29A and FIG. 29B, a dummy electrode 135 is arranged between the transition touch sub-electrode 151 and the transition touch electrode 16, and a dummy electrode 136 is arranged between the transition touch sub-electrode 152 and the transition touch electrode 16, i.e., the touch sensor further includes the dummy electrode 135 and the dummy electrode 136. For example, by arranging the dummy electrode 135 and the dummy electrode 136, a distance between the transition touch sub-electrode 151 and the transition touch electrode 16 and a distance between the transition touch sub-electrode 152 and the transition touch electrode 16 can be controlled better, so that a signal-to-noise ratio of a touch sensing signal provided by the transition touch electrode 15 and the transition touch electrode 16 can be controlled better.

For example, as shown in FIG. 29, the dummy electrode 135 includes a plurality of bent structures 1351, and a plurality of first protruding portions 161 are arranged in the corresponding bent structures 1351; and the dummy electrode 136 includes a plurality of bent structures 1361, and a plurality of second protruding portions 162 are arranged in the corresponding bent structures 1361.

The electrical connecting mode of the transition touch sub-electrode 152 and the electrode portion 113 will be exemplarily illustrated below in connection with FIG. 14A, FIG. 26A and FIG. 26B.

For example, as shown in FIG. 14A, the transition touch sub-electrode 152 fully surrounds the opening region 421. for example, by enabling the transition touch sub-electrode 152 to fully surround the opening region 421, the transition touch sub-electrode 152 and the electrode portion 113 can be electrically connected with each other in the case of not additionally arranging the jumper conductor wire between the transition touch sub-electrode 152 and the electrode portion 113.

Figure 26A:
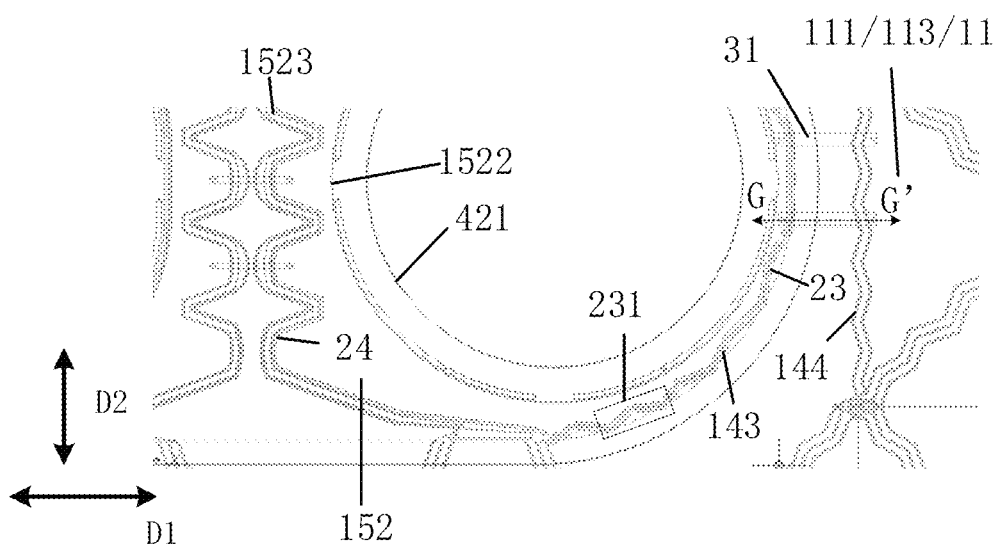
FIG. 26A is a plane schematic diagram of a partial region shown in FIG. 24.
Figure 26B:
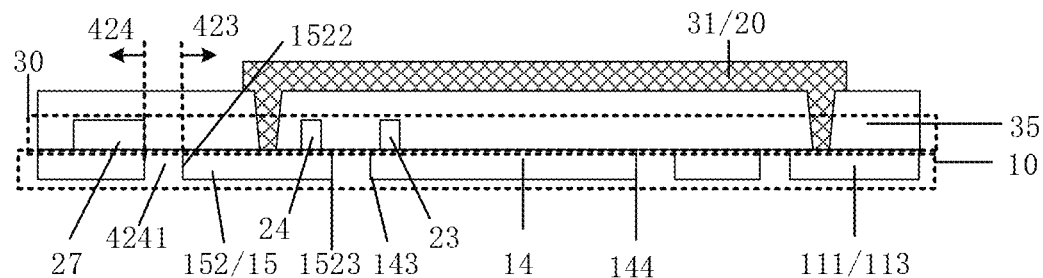
FIG. 26B is a sectional schematic diagram along a line GG' shown in FIG. 26A.

For example, as shown in FIG. 14A, FIG. 26A and FIG. 26B, the electrode portion 113 (i.e., the first touch sub-electrode 111 which is included in the electrode portion 113 and is the closest to the electrode portion 112) and the transition touch sub-electrode 152 are electrically connected with each other via the corresponding connecting sub-electrode 31 (e.g., two connecting sub-electrodes 31 arranged side by side in the second direction D2).

For example, as shown in FIG. 14A, FIG. 26A and FIG. 26B, the transition touch sub-electrode 152 and the corresponding connecting sub-electrode 31 are positioned on different electrode layers and partially overlap; and in the direction perpendicular to the touch sensor 01, there is the insulating layer 35 between the transition touch sub-electrode 152 and the above-mentioned corresponding connecting sub-electrode 31, and the transition touch sub-electrode 152 and the first end of the above-mentioned corresponding connecting sub-electrode 31 are electrically connected with each other via the via hole in the insulating layer 35. For example, as shown in FIG. 14A, FIG. 26A and FIG. 26B, the electrode portion 113 (e.g., the first touch sub-electrode 111 which is included in the electrode portion 113 and is the closest to the electrode portion 112) and the above-mentioned corresponding connecting sub-electrode 31 are positioned on different electrode layers and partially overlap; and in the direction perpendicular to the touch sensor 01, there is the insulating layer 35 between the electrode portion 113 (e.g., the first touch sub-electrode 111 which is included in the electrode portion 113 and is the closest to the electrode portion 112) and the above-mentioned corresponding connecting sub-electrode 31, and the electrode portion 113 (e.g., the first touch sub-electrode 111 which is included in the electrode portion 113 and is the closest to the electrode portion 112) and the second end of the above-mentioned corresponding connecting sub-electrode 31 are electrically connected with each other via the via hole in the insulating layer 35.

For example, as shown in FIG. 14A, FIG. 26A and FIG. 26B, a signal on the transition touch sub-electrode 152 can be transferred to the electrode portion 113 via the connecting sub-electrode 31.

For example, as shown in FIG. 14A, FIG. 20A, FIG. 20B, FIG. 26A, FIG. 26B, FIG. 29A and FIG. 29B, the signal on the electrode portion 112 (e.g., the first touch sub-electrode 111 which is included in the electrode portion 112 and is the closest to the electrode portion 113) can be transferred to the electrode portion 113 (e.g., the first touch sub-electrode 111 which is included in the electrode portion 113 and is the closest to the electrode portion 112) sequentially via the connecting sub-electrode 31, the ring-shaped sub-electrode 134, the connecting sub-electrode 31, the first conducting electrode 211, the jumper conductor wire 21, the transition touch sub-electrode 151, the connecting sub-electrode 31, the transition touch sub-electrode 152 and the connecting sub-electrode 31.

It should be noted that the disclosure is not limited to the case that the electrode portion 112 and the electrode portion 113 are electrically connected with each other via the jumper conductor wire 21, the transition touch electrode 15 and the corresponding connecting sub-electrode 31, and in some examples (e.g., the touch sensor only includes the opening region 422, but does not include the opening region 421, or the transition touch electrode 15 is not arranged between the opening region 422 and the opening region 421), the electrode portion 112 and the electrode portion 113 can be electrically connected with each other via the jumper conductor wire 21 and the corresponding connecting sub-electrode 31 instead of the transition touch electrode 15.

For example, as shown in FIG. 14A, FIG. 10A and FIG. 10B, two adjacent first touch sub-electrodes 111 included in the electrode portion 112 and two adjacent first touch sub-electrodes 111 included in the electrode portion 113 are respectively, electrically connected with each other via the corresponding connecting sub-electrodes 31 and ring-shaped sub-electrodes 133.

Although the touch sensor 01 of the display apparatus 03 shown in FIG. 14A to FIG. 19, FIG. 20A, FIG. 20B and other related drawings is simultaneously provided with the jumper conductor wire 21 and the jumper conductor wire 22, the embodiments of the present disclosure are not limited thereto. For example, according to practical application demands, the touch sensor 01 of the display apparatus 03 shown in FIG. 14A to FIG. 19, FIG. 20A, FIG. 20B and other related drawings can also be only provided with any one of the jumper conductor wire 21 and the jumper conductor wire 22; and in such a case, two portions of the first touch electrode 11 disconnected by the opening region can be electrically connected, or two portions of the second touch electrode 12 disconnected by the opening region can be electrically connected.

In some examples, as shown in FIG. 8 and FIG. 9, the touch sensor includes the opening region 422, the opening region 421, a plurality of first touch electrodes 11 and a plurality of second touch electrodes 12. The opening region 422 and the opening region 421 are spaced; the center 013 of the opening region 422 and the center 011 of the touch sensor do not coincide, and the center 012 of the opening region 421 and the center 011 of the touch sensor do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 421 and the opening region 421; at least one of the plurality of first touch electrodes 11 includes a transition touch electrode 15; each of one group of second touch electrodes 12 in the plurality of second touch electrodes 12 includes the transition touch electrode 16; the transition touch electrode 15 is at least partially positioned between the opening region 422 and the opening region 421, and includes the transition touch sub-electrode 151 and the transition touch sub-electrode 152 arranged side by side in the first direction D1 and electrically connected with each other; the transition touch sub-electrode 151 at least partially surrounds the opening region 422, and the transition touch sub-electrode 152 at least partially surrounds the opening region 421; and the transition touch electrode 16 is at least partially positioned between the transition touch sub-electrode 151 and the transition touch sub-electrode 152, and extends along the second direction D2.

For example, by arranging the transition touch electrode 15 and the transition touch electrode 16 between the opening region 422 and the opening region 421, the touch sensor 01 can identify a touch operation executed in a region of the touch sensor 01 positioned between the opening region 422 and the opening region 421, so that the user experience is improved. The structures of the transition touch electrode 15 and the transition touch electrode 16 will be exemplarily illustrated below in connection with FIG. 21 to FIG. 23.

Figure 21:
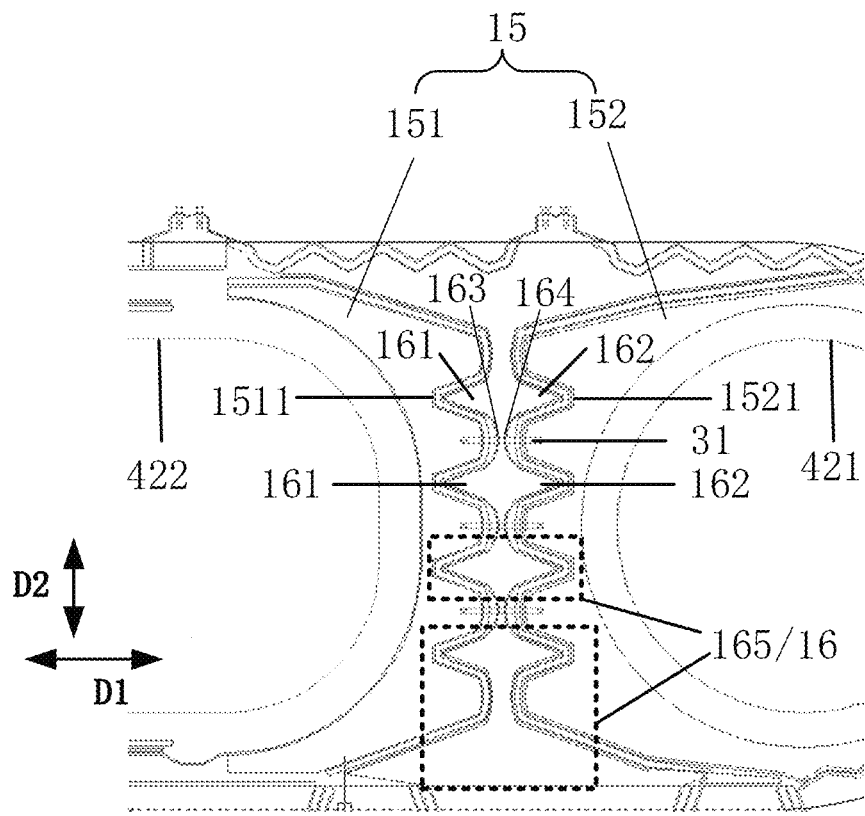
FIG. 21 is a plane schematic diagram of a partial region of the touch sensor shown in FIG. 8.

FIG. 21 is a plane schematic diagram of a partial region REG 5 of the touch sensor shown in FIG. 8. For example, as shown in FIG. 21, a first edge of the opening region 422 facing the opening region 421 is of a first shape, and an edge of the transition touch sub-electrode 151 facing the first edge integrally is also of the first shape; and a second edge of the opening region 421 facing the opening region 422 is of a second shape, and an edge of the transition touch sub-electrode 152 facing the second edge integrally is also of the second shape. For example, as shown in FIG. 21, the first shape is different from the second shape, but the embodiments of the present disclosure are not limited thereto, and in some examples, the first shape is the same with the second shape.

For example, as shown in FIG. 21, the opening region 422 is of a racetrack shape, and the opening region 421 is of a circle shape; and correspondingly, the first shape is a portion of the racetrack shape, and the second shape is a portion of the circle shape. It should be noted that the shape of the opening region 422 and the shape of the opening region 421 are not limited to the racetrack shape and the circle shape respectively, and according to practical application demands, the shape of the opening region 422 and the shape of the opening region 421 may be both of the racetrack shape, the circle shape or other applicable shapes.

For example, as shown in FIG. 21, an edge of the transition touch electrode 16 close to the transition touch sub-electrode 151 includes a plurality of first protruding portions 161 protruding towards the transition touch sub-electrode 151; an edge of the transition touch electrode 16 close to the transition touch sub-electrode 152 includes a plurality of second protruding portions 162 protruding towards the transition touch sub-electrode 152; an edge of the transition touch sub-electrode 151 close to the transition touch electrode 16 includes a plurality of first sunk portions 1511; an edge of the transition touch sub-electrode 152 close to the transition touch electrode 16 includes a plurality of second sunk portions 1521; the plurality of first protruding portions 161 are correspondingly arranged in the plurality of first sunk portions 1511; the plurality of second protruding portions 162 are correspondingly arranged in the plurality of second sunk portions 1521; and in such a case, the plurality of first protruding portions 161 included in the edge of the transition touch electrode 16 close to the transition touch sub-electrode 151 are surrounded by the transition touch sub-electrode 151, and the plurality of second protruding portions 162 included in the edge of the transition touch electrode 16 close to the transition touch sub-electrode 152 are surrounded by the transition touch sub-electrode 152.

For example, by correspondingly arranging the plurality of first protruding portions 161 in the plurality of first sunk portions 1511, a region between the shape of the opening region 422 and the opening region 421 can be more effectively utilized and a mutual capacitance between the transition touch electrode 16 and the transition touch sub-electrode 151 can be increased, and by correspondingly arranging the plurality of second protruding portions 162 in the plurality of second sunk portions 1521, the region between the shape of the opening region 422 and the opening region 421 can be more effectively utilized and the mutual capacitance between the transition touch electrode 16 and the transition touch sub-electrode 151 can be increased; and in such a case, a signal-to-noise ratio of a touch sensing signal provided by a portion of the touch sensor 01 positioned between the opening region 422 and the opening region 421 can be increased, and touch performance of the portion of the touch sensor 01 positioned between the opening region 422 and the opening region 421 can be improved.

For example, as shown in FIG. 21, the plurality of first protruding portions 161 are sequentially arranged in the second direction D2; the plurality of second protruding portions 162 are sequentially arranged in the second direction D2; the edge of the transition touch electrode 16 close to the transition touch sub-electrode 151 further includes a plurality of third sunk portions 163; and the edge of the transition touch electrode 16 close to the transition touch sub-electrode 152 further includes a plurality of fourth sunk portions 164. For example, as shown in FIG. 21, the plurality of third sunk portions 163 and the plurality of fourth sunk portions 164 correspond one to one. For example, as shown in FIG. 21, the bottom of each of the plurality of third sunk portions 163 overlap with the bottom of the fourth sunk portion 164 corresponding to each of the plurality of third sunk portions 163 in the first direction D1.

For example, as shown in FIG. 21, there is one third sunk portion 163 between two adjacent (e.g., any two adjacent) first protruding portions 161, and there is one fourth sunk portion 164 between two adjacent (e.g., any two adjacent) second protruding portions 162.

For example, as shown in FIG. 21, a distance between the bottom of the third sunk portion 163 and the bottom of the fourth sunk portion 164 in the first direction D1 is less than a size of any one of the plurality of first protruding portions 161 and the plurality of second protruding portions 162 in the first direction D1; and in such a case, the sizes of the first protruding portion 161 and the second protruding portion 162 in the first direction D1 can be increased in the case that an area of the region between the opening region 422 and the opening region 421 is fixed, so that the mutual capacitance between the transition touch electrode 16 and the transition touch sub-electrode 151 and the mutual capacitance between the transition touch electrode 16 and the transition touch sub-electrode 152 can be increased, the signal-to-noise ratio of the touch sensing signal provided by the portion of the touch sensor 01 positioned between the opening region 422 and the opening region 421 can be further increased, and touch performance (e.g., the touch sensitivity) of the portion of the touch sensor 01 positioned between the opening region 422 and the opening region 421 can be improved.

For example, the plurality of first protruding portions 161 and the plurality of second protruding portions 162 correspond one to one; and a distance between a vertex of each of the plurality of first protruding portions 161 and a vertex of the corresponding second protruding portion 162 in the first direction D1 is less than a minimum distance between the edge of the opening region 422 and the edge of the opening region 421 in the first direction D1.

For example, the minimum distance between the edge of the opening region 422 and the edge of the opening region 421 in the first direction D1 refers to the distance between a point, the closest to the opening region 421, at the edge of the opening region 422 and a point, the closest to the opening region 422, at the edge of the opening region 421 in the first direction D1.

It should be noted that the distance between the two points in the first direction D1 refers to the distance between virtual straight lines which respectively pass through the two points and are perpendicular to the first direction D1.

For example, the distance between the vertex of each of the plurality of first protruding portions 161 and the vertex of the corresponding second protruding portion 162 in the first direction D1 refers to the distance between a virtual straight line which passes through the vertex of each of the plurality of first protruding portions 161 and is perpendicular to the first direction D1 and a virtual straight line which passes through the vertex of the corresponding second protruding portion 162 and is perpendicular to the first direction D1.

For example, the distance between the vertex of each of the plurality of first protruding portions 161 and the vertex of the corresponding second protruding portion 162 in the first direction D1 is less than a distance between two points of at least one of a plurality of first touch sub-electrodes 111 in the first direction D1 that are farthest away from each other in the first direction D1 or a distance between two points of at least one of a plurality of second touch sub-electrodes 121 in the first direction D1 that are farthest away from each other in the first direction D1.

For example, the size of any one of the plurality of first protruding portions 161 and the plurality of second protruding portions 162 in the first direction D1 is greater than three times of the distance between the bottom of the corresponding third sunk portion 163 and the bottom of the corresponding fourth sunk portion 164 in the first direction D1.

Figure 22A:
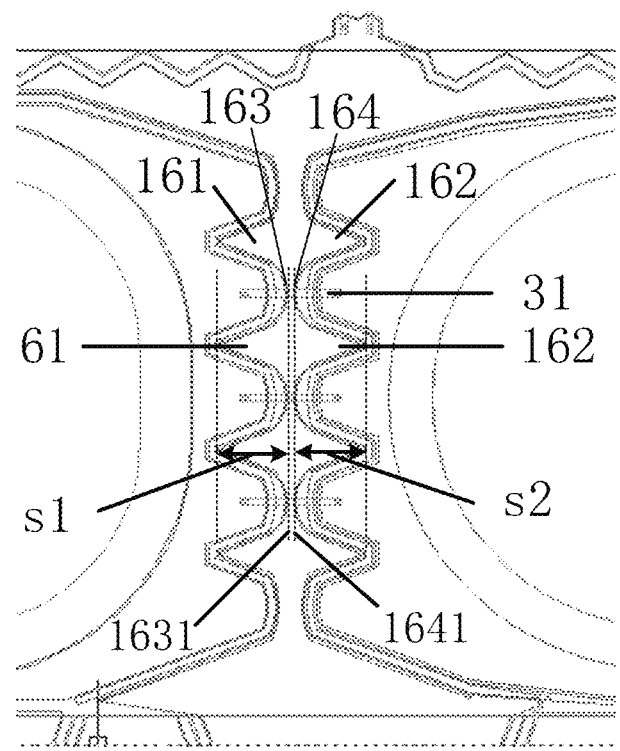
FIG. 22A shows an enlarged diagram of a transition touch electrode of the touch sensor shown in FIG. 21.

For example, FIG. 22A shows an enlarged diagram of the transition touch electrode 16 of the touch sensor 01 shown in FIG. 21. As shown in FIG. 22A, the bottoms of the plurality of third sunk portions 163 are all positioned on a first virtual straight line 1631 in parallel with the second direction D1, the bottoms of the plurality of fourth sunk portions 164 are all positioned on a second virtual straight line 1641 in parallel with the second direction D1, and the first virtual straight line 1631 is in parallel with the second virtual straight line 1641; and in such a case, the distance d_c between the bottom of the third sunk portion 163 and the bottom of the fourth sunk portion 164 in the first direction D1 refers to the distance between the first virtual straight line 1631 and the second virtual straight line 1641 in the first direction D1, a size s1 of the first protruding portion 161 in the first direction D1 refers to the distance between the top of the first protruding portion 161 and the first virtual straight line 1631 (or the bottom of the first protruding portion 161) in the first direction D1, and a size s2 of the second protruding portion 162 in the first direction D1 refers to the distance between the top of the second protruding portion 162 and the second virtual straight line 1641 (or the bottom of the second protruding portion 162) in the first direction D1.

For example, the plurality of first protruding portions 161 are the same in size, and the plurality of second protruding portions 162 are the same in size. For example, the size of the plurality of first protruding portions 161 and the size of the plurality of second protruding portions 162 are the same (e.g., are both a first size). For example, the first size is 3 to 12 (e.g., 5, 8 or 10) times of the distance d_c between the bottom of the third sunk portion 163 and the bottom of the fourth sunk portion 164 in the first direction D1.

For example, as shown in FIG. 21 and FIG. 22A, the transition touch sub-electrode 151 and the transition touch sub-electrode 152 are electrically connected with each other via the corresponding connecting sub-electrode 31 (refer to FIG. 29B below). For example, as shown in FIG. 21 and FIG. 22A, the connecting sub-electrode 31 for electrically connecting the transition touch sub-electrode 151 and the transition touch sub-electrode 152 overlaps with the bottom of the corresponding third sunk portion 163 and the bottom of the corresponding fourth sunk portion 164, and in such a case, a size of the connecting sub-electrode 31 in the first direction D1 can be shortened, so that influence of the connecting sub-electrode 31 on display quality of the display apparatus 03 can be reduced.

For example, as shown in FIG. 21, the transition touch sub-electrode 151 and the transition touch sub-electrode 152 are electrically connected with each other via a plurality of connecting sub-electrodes 31 arranged side by side in the second direction D2. For example, as shown in FIG. 21, the transition touch electrode 16 includes a plurality of transition touch sub-electrodes 165 arranged side by side in the second direction D2 and electrically connected with each other. For example, the plurality of transition touch sub-electrodes 165 are of an integrated structure, i.e., the plurality of transition touch sub-electrodes 165 are formed from the same material in the same patterning process, and there is no interface between the adjacent transition touch sub-electrodes 165.

For example, as shown in FIG. 21, two transition touch sub-electrodes 165 are respectively arranged on both sides of each of the plurality of connecting sub-electrodes 31 for electrically connecting the transition touch sub-electrode 151 and the transition touch sub-electrode 152. For example, as shown in FIG. 21, each of the plurality of transition touch sub-electrodes 165 includes at least one first protruding portion 161 and at least one second protruding portion 162; the at least one first protruding portion 161 and the at least one second protruding portion 162 correspond one to one; and any two adjacent transition touch sub-electrodes 165 are directly connected.

It should be noted that the disclosure is not limited to the case that the transition touch sub-electrode 151 and the transition touch sub-electrode 152 are electrically connected with each other via three connecting sub-electrodes 31; for example, the number of the connecting sub-electrodes 31 for electrically connecting the transition touch sub-electrode 151 and the transition touch sub-electrode 152 is greater than or equal to 1 and less than or equal to the number of the plurality of fourth sunk portions 164; and for another example, according to practical application demands, the transition touch sub-electrode 151 and the transition touch sub-electrode 152 can be electrically connected with each other via one, five or other applicable numbers of connecting sub-electrodes 31.

For example, the distance from the vertex of any one of the plurality of first protruding portions 161 and the plurality of second protruding portions 162 to the bottom of any one of the plurality of first protruding portions 161 and the plurality of second protruding portions 162 (i.e., the size of any one of the plurality of first protruding portions 161 and the plurality of second protruding portions 162 in the first direction D1) is greater than three times of the distance between the bottom of the third sunk portion 163 and the bottom of the corresponding fourth sunk portion 164 in the first direction D1.

For example, the bottom of the first protruding portion 161 refers to a virtual connecting line (e.g., the first virtual straight line 1631) of the bottoms of two third sunk portions 163 positioned on both sides of the first protruding portion 161 in the second direction D2. For example, the bottom of the second protruding portion 162 refers to a virtual connecting line (e.g., the second virtual straight line 1641) of the bottoms of two four sunk portions 164 positioned on both sides of the second protruding portion 162 in the second direction D2.

For example, the distance from the vertex of at least one of the plurality of first protruding portions 161 to the bottom of at least one of the plurality of first protruding portions 161 is 0.5 millimeter to 1.0 millimeter, and the distance from the vertex of at least one of the plurality of second protruding portions 162 to the bottom of at least one of the plurality of second protruding portions 162 is 0.5 millimeter to 1.0 millimeter.

For example, the distance (the distance between extending directions perpendicular to the edge of the transition touch sub-electrode 151) between the edge of the transition touch sub-electrode 151 close to the transition touch electrode 16 and the edge of the transition touch electrode 16 close to the transition touch sub-electrode 151 is 40 microns to 90 microns.

For example, the number of the plurality of first protruding portions 161 is 3 to 12, and the number of the plurality of second protruding portions is 3 to 12.

Figure 22B:
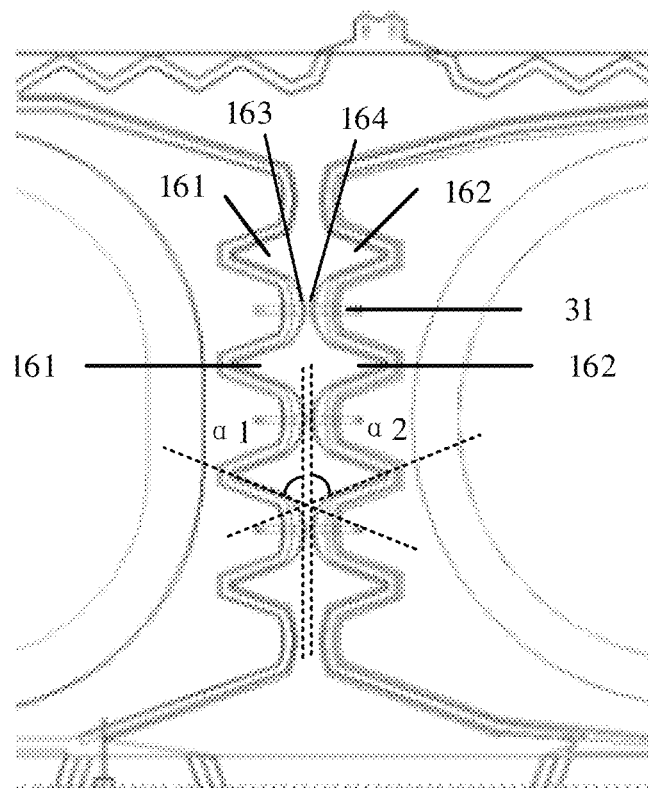
FIG. 22B shows another enlarged diagram of the transition touch electrode of the touch sensor shown in FIG. 21.

FIG. 22B shows another enlarged diagram of the transition touch electrode of the touch sensor shown in FIG. 21. For example, as shown in FIG. 22B, an inclination angle α1 of side edges (or side surfaces) of the plurality of first protruding portions 161 with respect to the second direction D2 is 30° to 85°, and an inclination angle α2 of side edges (or side surfaces) of the plurality of second protruding portions 162 with respect to the second direction D2 is 30° to 85°. For example, the side surfaces of the plurality of first protruding portions 161 and the plurality of second protruding portions 162 include circular conical surfaces, but the embodiments of the present disclosure are not limited thereto.

For example, the ratio of the distance between the center 013 of the opening region 422 and the center 012 of the opening region 421 in the first direction D1 to the distance between two points of the first touch sub-electrode 111 with the maximum area in the plurality of first touch sub-electrodes 111 (or the second touch sub-electrode 121 with the maximum area in the plurality of second touch sub-electrodes 121) in the first direction D1 that are farthest away from each other in the first direction D1 is 2 to 3.

Figure 23:
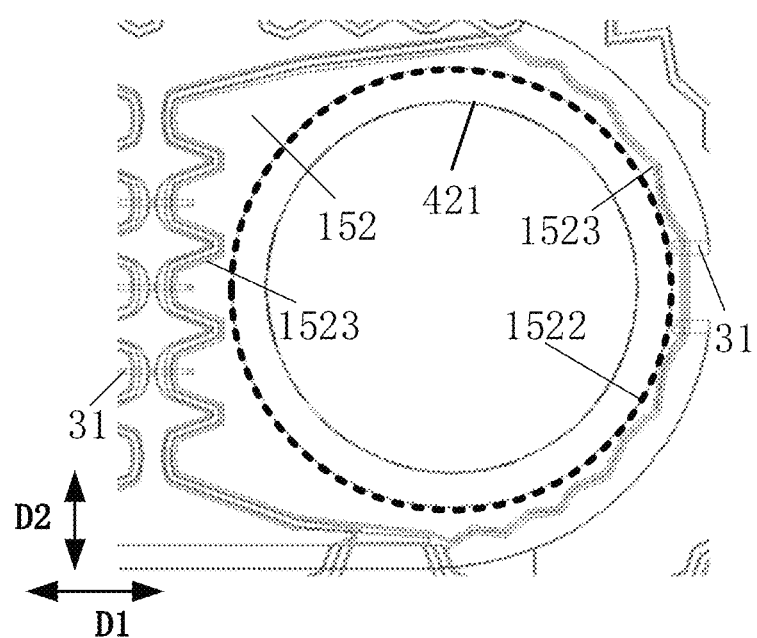
FIG. 23 is a plane schematic diagram of a partial region of the touch sensor shown in FIG. 9.

FIG. 23 is a plane schematic diagram of a partial region REG5 of the touch sensor 01 shown in FIG. 9. For example, as shown in FIG. 23, the transition touch sub-electrode 152 fully surrounds the opening region 421; the transition touch sub-electrode 152 has an inner edge 1522 and an outer edge 1523; and the inner edge 1522 of the transition touch sub-electrode 152 fully surrounds the opening region 421.

For example, as shown in FIG. 23, the inner edge 1522 of the transition touch sub-electrode 152 is the same in shape with the opening region 421. For example, both the inner edge 1522 of the transition touch sub-electrode 152 and the opening region 421 are of a circle shape.

For example, by enabling the transition touch sub-electrode 152 to fully surround the opening region 421, an area (e.g., an active electrode area) of the transition touch sub-electrode 152 can be increased, so that the amount of signals and touch performance of the touch sensor 01 can be improved.

For example, the transition touch sub-electrode 151, the transition touch sub-electrode 152 and the transition touch electrode 16 may be positioned in the same electrode layer (e.g., the first electrode layer 10), and in contact with the same film layer (e.g., the insulating layer 35), so that the structure and the manufacturing process of the touch sensor 01 can be simplified, but the embodiments of the present disclosure are not limited thereto, and for example, the transition touch sub-electrode 151, the transition touch sub-electrode 152 and the transition touch electrode 16 may also be positioned on more than two electrode layers.

In an example, the transition touch sub-electrode 151, the transition touch sub-electrode 152, the transition touch electrode 16, the plurality of first touch sub-electrodes 111, the plurality of second touch sub-electrodes 121, the plurality of ring-shaped sub-electrodes 134 and the plurality of intermediate sub-electrodes 133 are all made of a transparent conducting material; and in such a case, the transition touch sub-electrode 151, the transition touch sub-electrode 152, the transition touch electrode 16, the plurality of first touch sub-electrodes 111, the plurality of second touch sub-electrodes 121, the plurality of ring-shaped sub-electrodes 134 and the plurality of intermediate sub-electrodes 133 can be prepared by the same process (e.g., the patterning process), and in contact with the same surface of the same film layer (e.g., all in contact with the surface of the base material 36 close to the first electrode layer 10).

In another example, a region where the transition touch sub-electrode 151, the transition touch sub-electrode 152 and the transition touch electrode 16 are positioned is the region between the shape of the opening region 422 and the opening region 421, and a region of the display apparatus corresponding to the region between the shape of the opening region 422 and the opening region 421 is not used for display, and thus, the transition touch sub-electrode 151, the transition touch sub-electrode 152 and the transition touch electrode 16 can be made of a metal material; the plurality of first touch sub-electrodes 111, the plurality of second touch sub-electrodes 121, the plurality of ring-shaped sub-electrodes 134 and the plurality of intermediate sub-electrodes 133 are made of a transparent conducting material; and in such a case, a patterning process for forming the transition touch sub-electrode 151, the transition touch sub-electrode 152 and the transition touch electrode 16 and a patterning process for forming the plurality of first touch sub-electrodes 111, the plurality of second touch sub-electrodes 121, the plurality of ring-shaped sub-electrodes 134 and the plurality of intermediate sub-electrodes 133 are completed at different moments.

For example, the electrode layer where the transition touch sub-electrode 151, the transition touch sub-electrode 152 and the transition touch electrode 16 are positioned overlaps with the electrode layer where the plurality of first touch sub-electrodes 111, the plurality of second touch sub-electrodes 121, the plurality of ring-shaped sub-electrodes 134 and the plurality of intermediate sub-electrodes 133 are positioned in the direction perpendicular to the touch sensor 01. For another example, the electrode layer where the transition touch sub-electrode 151, the transition touch sub-electrode 152 and the transition touch electrode 16 are positioned and the electrode layer where the plurality of first touch sub-electrodes 111, the plurality of second touch sub-electrodes 121, the plurality of ring-shaped sub-electrodes 134 and the plurality of intermediate sub-electrodes 133 are positioned are the same electrode layer, i.e., the transition touch sub-electrode 151, the transition touch sub-electrode 152, the transition touch electrode 16, the plurality of first touch sub-electrodes 111, the plurality of second touch sub-electrodes 121, the plurality of ring-shaped sub-electrodes 134 and the plurality of intermediate sub-electrodes 133 are in contact with the same surface of the same film layer (e.g., all in contact with the surface of the base material 36 close to the first electrode layer 10), but a material for manufacturing the transition touch sub-electrode 151, the transition touch sub-electrode 152 and the transition touch electrode 16 is different from a material for manufacturing the plurality of first touch sub-electrodes 111, the plurality of second touch sub-electrodes 121, the plurality of ring-shaped sub-electrodes 134 and the plurality of intermediate sub-electrodes 133.

In some examples, the touch sensor 01 includes the opening region 421, a plurality of first touch electrodes 11, a plurality of second touch electrodes 12 and a conducting structure 23. The center of the opening region 421 and the center of the touch sensor 01 do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 422; each of one group of second touch electrodes 12 in the plurality of second touch electrodes 12 further includes the transition touch electrode 14; the transition touch electrode 14 extends in the second direction D2, and partially surrounds the opening region 421 along the second direction D2; a virtual straight line 1451 passing through the center of the opening region 421 and extending along the first direction D1 respectively intersects with two sides of the transition touch electrode 14 at a first position 1452 and a second position 1453 opposite in the first direction D1, and a distance between the first position 1452 and the second position 1453 is less than the maximum width of at least one of the plurality of second touch sub-electrodes 121 in the first direction D1; and the conducting structure 23 is positioned on the surface of the transition touch electrode 14, at least partially surrounds the edge of the opening region 421, and is electrically connected with the transition touch electrode 14.

For example, by arranging a first conducting structure 23 on the surface of the transition touch electrode 14 and enabling the first conducting structure 23 to be electrically connected (e.g., connected in parallel in the second direction D2) with the transition touch electrode 14, the channel impedance of a region where the transition touch electrode 14 is positioned (e.g., the resistance of the region where the transition touch electrode 14 is positioned) can be reduced, and the reliability (e.g., possibility of reducing an open circuit) of the region where the transition touch electrode 14 is positioned can be promoted. For example, by reducing the channel impedance of the transition touch electrode 14, the charge conductivity of the transition touch electrode 14 can be improved, so that the electric signal (charges) passes through the transition touch electrode 14 more easily, and thus, touch performance of a region of the touch sensor 01 corresponding to the transition touch electrode 14 can be improved, and the possibility of poor touch, caused by electrostatic discharge (ESD) and electrostatic breakdown, in the region where the transition touch electrode 14 is positioned can be reduced.

Exemplary illustration will be carried out below in connection with FIG. 24 to FIG. 28, FIG. 29A and FIG. 29B.

Figure 24:
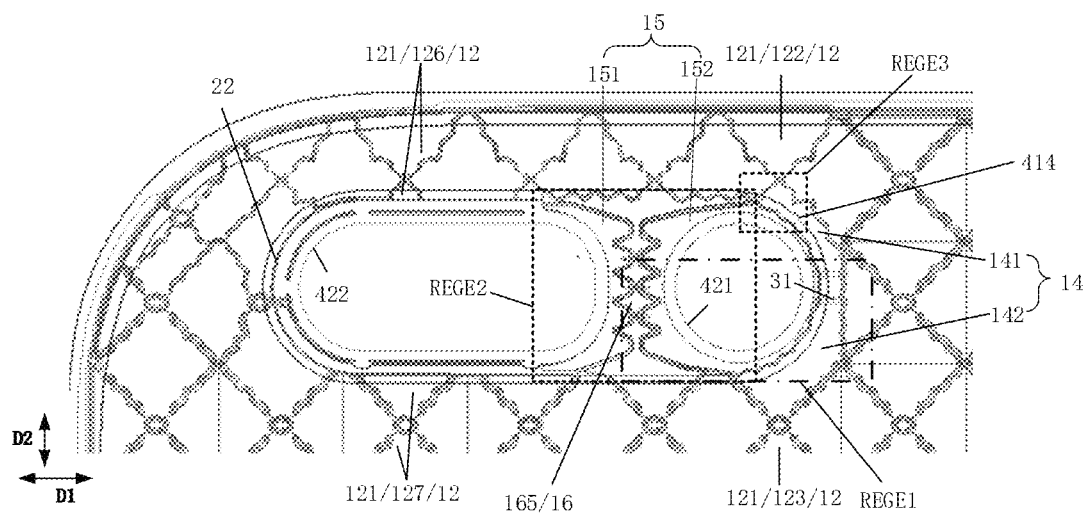
FIG. 24 is one more schematic diagram of the partial region included in the touch sensor of the display apparatus shown in FIG. 4.
Figure 25:
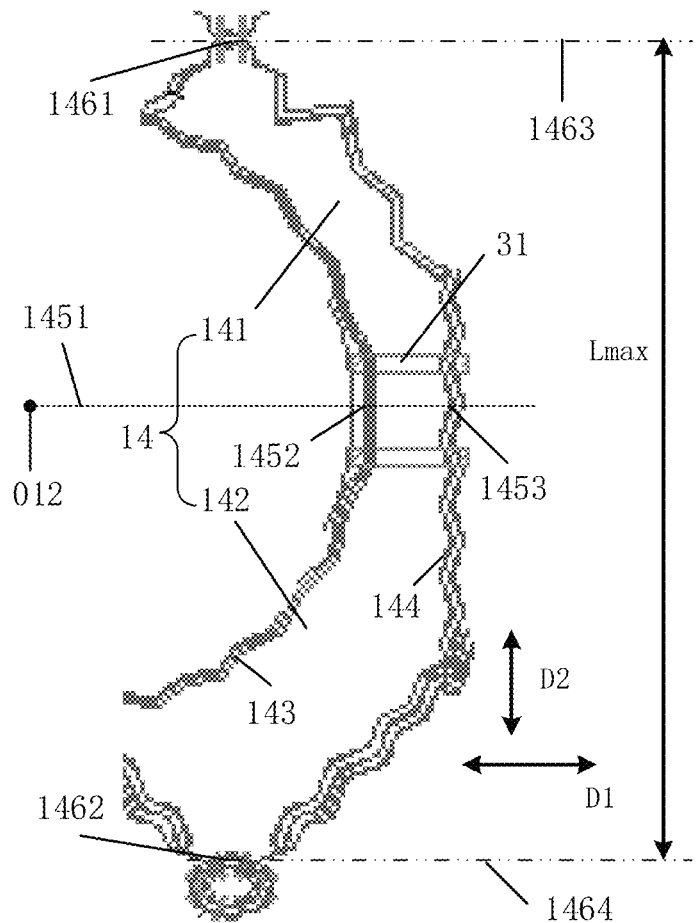
FIG. 25 is a plane schematic diagram of a transition touch electrode shown in FIG. 24.
Figure 27:
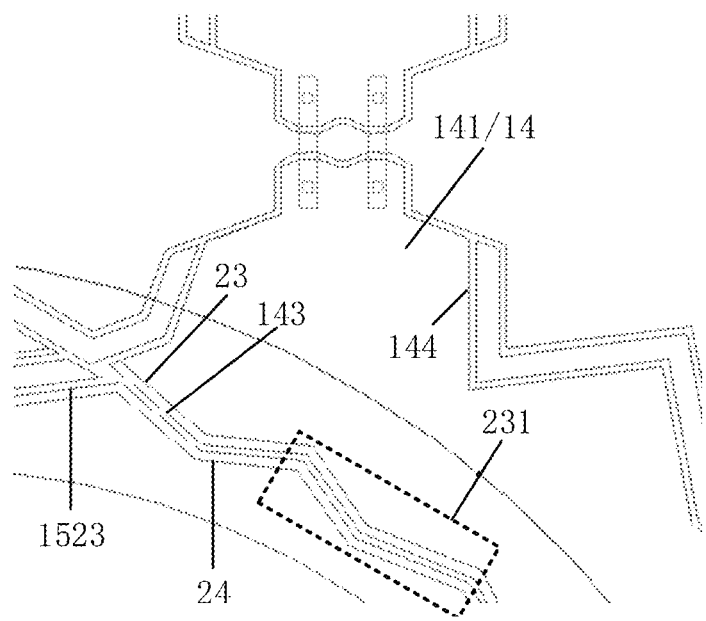
FIG. 27 is a plane schematic diagram of a partial region shown in FIG. 24.

FIG. 24 is one more schematic diagram of the partial region REG1 included in the touch sensor 01 of the display apparatus 03 shown in FIG. 4; FIG. 25 is a plane schematic diagram of the transition touch electrode 14 shown in FIG. 24; FIG. 26A is a plane schematic diagram of a partial region REGE1 shown in FIG. 24; and FIG. 26B is a sectional schematic diagram along a line GG' shown in FIG. 26A. FIG. 27 is a plane schematic diagram of a partial region REGE3 shown in FIG. 24.

For example, as shown in FIG. 24 to FIG. 26A, the touch sensor 01 (e.g., at least one of the plurality of second touch electrodes 12 included in the touch sensor 01) includes the transition touch electrode 14, which at least partially surrounds the edge of the opening region 421 and partially surrounds the opening region 421 along the second direction D2. For example, the transition touch electrode 14 and the edge of the opening region 421 partially overlap in the second direction D2.

For example, the transition touch electrode 14 extends in the second direction D2. For example, extension of the transition touch electrode 14 in the second direction D2 does not represent that the transition touch electrode 14 is in parallel with the second direction D2, but refers to such a case that a length of the transition touch electrode 14 in the second direction D2 is greater than a width of the transition touch electrode 14 in the first direction D1.

For example, as shown in FIG. 24 to FIG. 26A, the virtual straight line 1451 passing through the center of the opening region 421 and extending along the first direction D1 respectively intersects with two sides of the transition touch electrode 14 at the first position 1452 and the second position 1453 opposite to each other in the first direction D1, and the distance between the first position 1452 and the second position 1453 is less than the maximum width of at least one of the plurality of second touch sub-electrodes 121 (e.g., each of the plurality of second touch sub-electrodes 121) in the first direction D1.

For example, the maximum width of at least one of the plurality of second touch sub-electrodes 121 in the first direction D1 refers to the distance between two points of at least one of the plurality of second touch sub-electrodes 121 in the first direction D1 that are farthest away from each other in the first direction D1. It should be noted that the distance between the two points in the first direction D1 refers to the distance between the virtual straight lines which respectively pass through the two points and are perpendicular to the first direction D1.

For example, the distance between the first position 1452 and the second position 1453 is relatively small, and the width of the transition touch electrode 14 in the first direction D1 is relatively small, and thus, in the case of not arranging the conducting structure 23, the channel impedance of a portion of the touch sensor 01 is relatively high corresponding to the transition touch electrode 14 (compared to the channel impedance of the second touch sub-electrode 121).

For example, the resistance of the transition touch electrode 14 is higher than that of at least one of the plurality of second touch sub-electrodes 121 (e.g., each of the plurality of second touch sub-electrodes 121).

For example, the maximum length of the transition touch electrode 14 in the second direction D2 is greater than that of at least one of the plurality of second touch sub-electrodes 121 (e.g., each of the plurality of second touch sub-electrodes 121) in the second direction D2, so that the resistance of the transition touch electrode 14 is further improved.

For example, as shown in FIG. 25, the maximum length of the transition touch electrode 14 in the second direction D2 refers to the distance between two points (e.g., a point 1461 and a point 1462) of the transition touch electrode 14 in the second direction D2 that are farthest away from each other in the second direction D2.

It should be noted that the distance between the two points (e.g., the point 1461 and the point 1462) in the second direction D2 refers to the distance between virtual straight lines (e.g., a virtual straight line 1463 and a virtual straight line 1464) which respectively pass through the two points (e.g., the point 1461 and the point 1462) and are perpendicular to the second direction D2.

For example, the maximum length of at least one of the plurality of second touch sub-electrodes 121 in the second direction D2 refers to the distance between two points of at least one of the second touch sub-electrodes 121 in the second direction D2 that are farthest away from each other in the second direction D2.

For example, as shown in FIG. 24 to FIG. 26A, the transition touch electrode 14 includes a transition touch sub-electrode 141 and a transition touch sub-electrode 142. For example, as shown in FIG. 24 to FIG. 26A, the transition touch sub-electrode 141 and the transition touch sub-electrode 142 are arranged side by side in the second direction D2. For example, as shown in FIG. 24 to FIG. 26A, the transition touch sub-electrode 141 and the transition touch sub-electrode 142 are directly connected. For example, the transition touch sub-electrode 141 and the transition touch sub-electrode 142 are of an integrated structure, i.e., the transition touch sub-electrode 141 and the transition touch sub-electrode 142 are formed from the same material in the same patterning process, and there is no interface between the transition touch sub-electrode 141 and the transition touch sub-electrode 142.

For example, as shown in FIG. 24 to FIG. 26A, the opening region 421 includes an arc edge portion adjacent to the transition touch electrode 14; and an overall outline of one side of the transition touch electrode 14 close to the opening region 421 is an arc edge portion in parallel with the arc edge portion of the opening region 421. For example, the overall outline of one side of the transition touch electrode 14 close to the opening region 421 being the arc edge portion in parallel with the arc edge portion of the opening region 421 refer to a case that: the overall outline (e.g., a smoothed outline) of one side of the transition touch electrode 14 close to the opening region 421 is of an arc shape, and the arc shape has the same shape and the same extending trend with the arc edge portion of the opening region 421.

For example, as shown in FIG. 24, FIG. 26A and FIG. 26B, the first conducting structure 23 is arranged on the surface of the transition touch electrode 14. For example, as shown in FIG. 26B, the first conducting structure 23 is in direct contact with the transition touch electrode 14, i.e., the first conducting structure 23 is electrically connected with the transition touch electrode 14. For example, as shown in FIG. 24, FIG. 26A and FIG. 26B, the first conducting structure 23 is electrically connected (e.g., connected in parallel in the second direction D2) with the transition touch electrode 14.

For example, by arranging the first conducting structure 23 on the surface of the transition touch electrode 14 and enabling the first conducting structure 23 to be electrically connected (e.g., connected in parallel in the second direction D2) with the transition touch electrode 14, the channel impedance of the region where the transition touch electrode 14 is positioned can be reduced (e.g., the resistance of the region where the transition touch electrode 14 is positioned can be reduced), and the charge conductivity of the region where the transition touch electrode 14 is positioned can be improved. In such case, the channel impedance of the far end (i.e., one end away from a touch circuit or a touch chip) of the second touch electrode 12 including the transition touch electrode 14 is relatively low.

For example, a square resistance of the first conducting structure 23 is lower than that of the transition touch electrode 14, so that the channel impedance of the region where the transition touch electrode 14 is positioned can be further reduced (e.g., the resistance of the region where the transition touch electrode 14 is positioned can be further reduced). In addition, as shown in FIG. 24 and FIG. 26A, the first conducting structure 23 extends along the second direction D2, and in such a case, the first conducting structure 23 can enable the charges to be uniformly distributed on the transition touch electrode 14 in the second direction D2, so that the first conducting structure 23 can assist the charges (the electric signal) in passing through the transition touch electrode 14.

For example, as shown in FIG. 24, FIG. 26A and FIG. 26B, the first conducting structure 23 and the connecting sub-electrode 31 (e.g., two connecting sub-electrodes 31)

partially overlap in the direction perpendicular to the touch sensor 01, and two end portions of the first conducting structure 23 in the second direction D2 are respectively positioned on both sides of the connecting sub-electrode 31 (e.g., two connecting sub-electrodes 31) in the second direction D2; and in such a case, the first conducting structure 23 assists the charges in passing through a region of the transition touch electrode 14 overlapping with the connecting sub-electrode 31 in the direction perpendicular to the touch sensor 01, so that the possibility of poor touch in the region of the transition touch electrode 14 overlapping with the connecting sub-electrode 31 in the direction perpendicular to the touch sensor 01 can be reduced.

For example, the first conducting structure 23 can reduce the possibility of poor touch caused by electrostatic discharge (e.g., electrostatic breakdown).

For example, the first conducting structure 23 can be made of a metal material, and the transition touch electrode 14 can be made of a transparent conducting material, so that the square resistance of the first conducting material 23 can be lower than that of the transition touch electrode 14.

For example, as shown in FIG. 24 to FIG. 27, the transition touch electrode 14 is at least partially arranged between the opening region 421 and a second portion 113; the transition touch electrode 14 has a first side 143 away from the second portion 113 and a second side 144 close to the second portion 113 in the first direction D1; and the first conducting structure 23 is arranged at an edge of the transition touch electrode 14 positioned on the first side 143. For example, by arranging the first conducting structure 23 at the edge of the transition touch electrode 14 positioned on the first side 143 (i.e., the edge of the transition touch electrode 14 away from the second portion 113), shielding of the first conducting structure 23 from light emitted by the active display region of the display apparatus can be reduced in the case that the first conducting structure 23 is made of a metal material, so that the display effect can be improved.

For example, as shown in FIG. 26A and FIG. 26B, the touch sensor 01 further includes a second conducting structure 24, and the second conducting structure 24 is at least arranged on the surface of a portion of the transition touch electrode 15 at least positioned between the opening region 421 and the transition touch electrode 14. For example, the second conducting structure 24 is in direct contact with the portion of the transition touch electrode 15 at least positioned between the opening region 421 and the transition touch electrode 14, i.e., the second conducting structure 24 is electrically connected with the portion of the transition touch electrode 15 at least positioned between the opening region 421 and the transition touch electrode 14. For example, as shown in FIG. 24 and FIG. 26A, the second conducting structure 24 is electrically connected (e.g., connected in parallel) with the portion of the transition touch electrode 15 at least positioned between the opening region 421 and the transition touch electrode 14, so that the channel impedance (e.g., resistance) of a region where the portion of the transition touch electrode 15 at least positioned between the opening region 421 and the transition touch electrode 14 can be reduced.

For example, as shown in FIG. 24, FIG. 26A and FIG. 26B, the second conducting structure 24 is arranged on the surface of the transition touch sub-electrode 152, at least partially surrounds the opening region 421, and is electrically connected (e.g., connected in parallel) with the transition touch sub-electrode 152, so that the second conducting structure 24 can reduce the channel impedance (e.g., resistance) of a region where the transition touch sub-electrode 152 is positioned, and improve the charge conductivity of the region where the transition touch sub-electrode 152 is positioned.

For example, a square resistance of the second conducting structure 24 is lower than that of the transition touch sub-electrode 152, so that the channel impedance (e.g., the resistance) of the region where the transition touch sub-electrode 152 is positioned can be further reduced. For example, the second conducting structure 24 can be made of a metal material, and the transition touch sub-electrode 152 can be made of a transparent conducting material, so that the square resistance of the second conducting structure 24 is lower than that of the transition touch sub-electrode 152.

For example, as shown in FIG. 24, the second conducting structure 24 fully surrounds the opening region 421. For example, as shown in FIG. 24 to FIG. 27, the transition touch sub-electrode 152 includes the inner edge 1522 and the outer edge 1523; and compared to the inner edge 1522 of the transition touch sub-electrode 152, the second conducting structure 24 is closer to the outer edge 1523 of the transition touch sub-electrode 152, and extends along the outer edge 1523 of the transition touch sub-electrode 152.

For example, as shown in FIG. 24, FIG. 26A and FIG. 26B, the second conducting structure 24 and the connecting sub-electrode 31 (e.g., two connecting sub-electrodes 31) partially overlap in the direction perpendicular to the touch sensor 01, and two end portions of the second conducting structure 24 are respectively positioned on both sides of the connecting sub-electrode 31 (e.g., two connecting sub-electrodes 31); and in such a case, the second conducting structure 24 assists the charges in passing through a region of the transition touch sub-electrode 152 overlapping with the second conducting structure 24 in the direction perpendicular to the touch sensor 01, so that the possibility of poor touch in the region of the transition touch sub-electrode 152 overlapping with the second conducting structure 24 in the direction perpendicular to the touch sensor 01 can be reduced. For example, the second conducting structure 24 can reduce the possibility of poor touch caused by electrostatic discharge (e.g., electrostatic breakdown).

It should be noted that the disclosure is not limited to the case that the second conducting structure 24 fully surrounds the opening region 421, and in some examples, the second conducting structure 24 can partially surround the opening region 421.

For example, as shown in FIG. 26A and FIG. 27, the first conducting structure 23 and a portion of the second conducting structure 24 adjacent to the first conducting structure 23 have corresponding bent structures 231, respectively. For example, as shown in FIG. 26A and FIG. 27, a portion of the second conducting structure 24 close to the first conducting structure 23 and the first conducting structure 23 have the same extending direction. For example, as shown in FIG. 26A and FIG. 27, the first conducting structure 23 includes a plurality of first conducting line segments (e.g., straight line segments) sequentially connected, and the second conducting structure 24 includes a plurality of second conducting line segments (e.g., straight line segments) sequentially connected; the plurality of first conducting line segments and the plurality of second conducting line segments correspond one to one and are opposite to each other; and each of the plurality of first conducting line segments and the corresponding second conducting line segment have the same extending direction. For example, as shown in FIG. 26A and FIG. 27, two adjacent (e.g., any two adjacent) first conducting line segments intersect with each other, and two adjacent (e.g., any two adjacent) second conducting line segments intersect with each other; and the first conducting line segment and second conducting line segment that are adjacent to each other (e.g., any two adjacent) are in parallel with each other.

For example, as shown in FIG. 24, FIG. 26A and FIG. 27, the plurality of first conducting line segments sequentially connected form a portion of the second conducting structure 24, and are positioned on one side of the center of the opening region 421 in the first direction D1 away from the center of the opening region 422.

Figure 28:
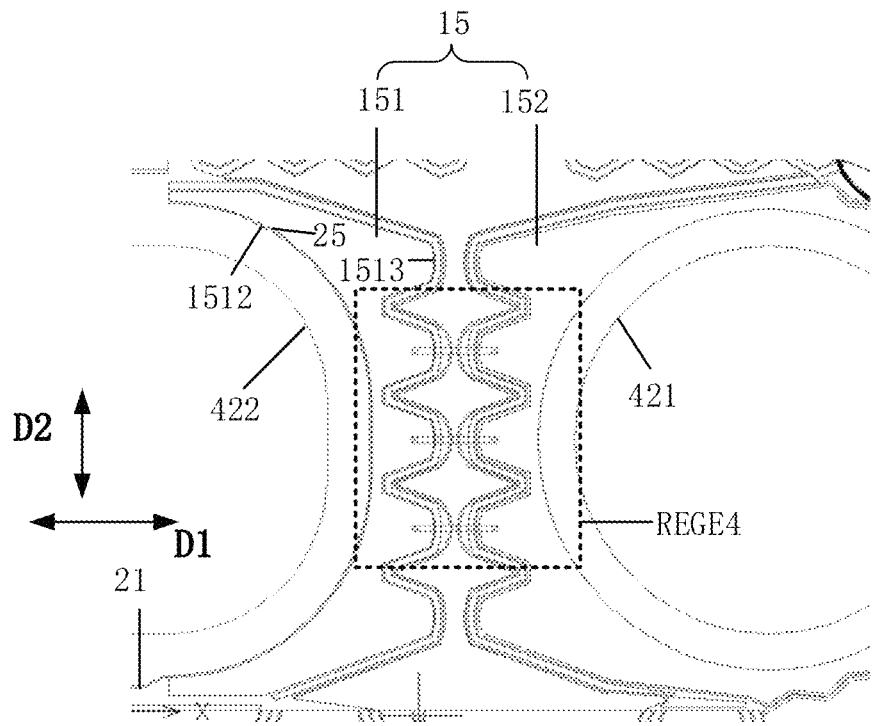
FIG. 28 is a plane schematic diagram of a partial region of the touch sensor shown in FIG. 24.

FIG. 28 is a plane schematic diagram of a partial region REGE2 of the touch sensor shown in FIG. 24. For example, as shown in FIG. 28, the touch sensor 01 further includes a third conducting structure 25, and the third conducting structure 25 is arranged on the surface of the transition touch sub-electrode 151. For example, the third conducting structure 25 is in direct contact with the transition touch sub-electrode 151. For example, as shown in FIG. 28, the third conducting structure 25 is electrically connected (e.g., connected in parallel) with the transition touch sub-electrode 151, so that the channel impedance (e.g., resistance) of a region where the transition touch sub-electrode 151 is positioned can be reduced, and the charge conductivity of the region where the transition touch sub-electrode 151 is positioned can be improved.

For example, the square resistance of the third conducting structure 25 is lower than that of the transition touch sub-electrode 151, so that the channel impedance (e.g., the resistance) of the region where the transition touch sub-electrode 151 is positioned can be further reduced. For example, the second conducting structure 25 can be made of a metal material, and the transition touch sub-electrode 151 can be made of a transparent conducting material, so that the square resistance of the second conducting structure 25 can be lower than that of the transition touch sub-electrode 151.

For example, as shown in FIG. 28, the transition touch sub-electrode 151 is arranged on one side of the center of the opening region 422 close to the opening region 421, and partially surrounds the opening region 422; the transition touch sub-electrode 151 includes a third side 1512 close to the opening region 422 and a fourth side 1513 away from the opening region 422; and the third conducting structure 25 extends at least along an edge of the transition touch sub-electrode 151 positioned on the third side 1512.

For example, as shown in FIG. 24 and FIG. 28, the transition touch sub-electrode 151 is electrically connected with a first portion 112 via the jumper conductor wire 21. For example, the third conducting structure 25 and the jumper conductor wire 21 are positioned in the same electrode layer (e.g., the second electrode layer (30), and are made of the same material; and for example, the third conducting structure 25 and the jumper conductor wire 21 are formed in the same patterning process, so that the structure and the manufacturing process of the touch sensor 01 can be simplified. For example, the third conducting structure 25 and the jumper conductor wire 21 are directly connected. For example, the third conducting structure 25 and the jumper conductor wire 21 are of an integrated structure, i.e., the third conducting structure 25 and the jumper conductor wire 21 are formed from the same material in the same patterning process. For example, there is no interface between the third conducting structure 25 and the jumper conductor wire 21.

For example, the disclosure is not limited to the case that the third conducting structure 25 only extends along the edge of the transition touch sub-electrode 151 positioned on the third side 1512, and in some examples, the third conducting structure 25 can also extend along an edge of the transition touch sub-electrode 151 positioned on the fourth side 1513.

FIG. 29A is a plane schematic diagram of a partial region REGE4 of the touch sensor shown in FIG. 28; and FIG. 29B is a sectional schematic diagram along an line EE' shown in FIG. 29A.

For example, as shown in FIG. 28, FIG. 29A and FIG. 29B, the touch sensor 01 further includes a fourth conducting structure 26, and the fourth conducting structure 26 is arranged on the surface of the transition touch electrode 16. For example, the fourth conducting structure 26 is in direct contact with the transition touch electrode 16.

For example, as shown in FIG. 28, FIG. 29A and FIG. 29B, the fourth conducting structure 26 is electrically connected (e.g., connected in parallel) with the transition touch electrode 16, and extends along at least one of two opposite edges of the transition touch electrode 16 in the first direction D1. For example, by arranging the fourth conducting structure 26 on the surface of the transition touch electrode 16 and enabling the fourth conducting structure 26 to be electrically connected (e.g., connected in parallel) with the transition touch electrode 16, the channel impedance (e.g., resistance) of a region where the transition touch electrode 16 is positioned can be reduced, and the charge conductivity of the region where the transition touch electrode 16 is positioned can be improved.

For example, a square resistance of the fourth conducting structure 26 is lower than that of the transition touch electrode 16, so that the channel impedance (e.g., the resistance) of the region where the transition touch electrode 16 is positioned can be further reduced. For example, the fourth conducting structure 26 can be made of a metal material, and the transition touch electrode 16 can be made of a transparent conducting material, so that the square resistance of the fourth conducting structure 26 can be lower than that of the transition touch electrode 16.

For example, as shown in FIG. 28, FIG. 29A and FIG. 29B, the transition touch electrode 16 includes a fifth side 166 close to the transition touch sub-electrode 151 and a sixth side 167 away from the transition touch sub-electrode 151 in the first direction D1; an edge of the transition touch electrode 16 positioned on the fifth side 166 includes a plurality of first protruding portions 161 protruding towards the transition touch sub-electrode 151; an edge of the transition touch electrode 16 positioned on the sixth side 167 includes a plurality of second protruding portions 162 protruding towards the transition touch sub-electrode 152; the edge of the transition touch sub-electrode 151 positioned on the fourth side 1513 (i.e., the edge close to the transition touch electrode 16) includes a plurality of first sunk portions 1511; the edge of the transition touch sub-electrode 152 close to the transition touch electrode 16 includes a plurality of second sunk portions 1521; and the plurality of first protruding portions 161 are correspondingly arranged in the plurality of first sunk portions 1511, and the plurality of second protruding portions 162 are correspondingly arranged in the plurality of second sunk portions 1521.

For example, as shown in FIG. 28, FIG. 29A and FIG. 29B, the fourth conducting structure 26 includes a first conducting sub-structure 261 and a second conducting sub-structure 262; the first conducting sub-structure 261 extends along the edge of the transition touch electrode 16 positioned on the fifth side 166, and includes a plurality of second bent structures 2611; the second conducting sub-structure 262 extends along the edge of the transition touch electrode 16 positioned on the sixth side 167, and includes a plurality of third bent structures 2621; and the plurality of second bent structures 2611 are correspondingly arranged in the plurality of first sunk portions 1511, and the plurality of third bent structures 2621 are correspondingly arranged in the plurality of second sunk portions 1521.

For example, as shown in FIG. 28, FIG. 29A and FIG. 29B, the first conducting sub-structure 261 and the second conducting sub-structure 262 respectively and partially overlap with the connecting sub-electrode 31 (e.g., two connecting sub-electrodes 31) in the direction perpendicular to the touch sensor 01, two end portions of the first conducting sub-structure 261 in the second direction D2 are respectively positioned on both sides of the connecting sub-electrode 31 (e.g., two connecting sub-electrodes 31) in the second direction D2, and two end portions of the second conducting sub-structure 262 in the second direction D2 are respectively positioned on both sides of the connecting sub-electrode 31 (e.g., two connecting sub-electrodes 31) in the second direction D2; in such a case, the first conducting sub-structure 261 and the second conducting sub-structure 262 assist the charges in passing through a region of the transition touch electrode 16 overlapping with the first conducting sub-structure 261 and the second conducting sub-structure 262 in the direction perpendicular to the touch sensor 01, so that the possibility of poor touch in the region of the transition touch electrode 16 overlapping with the first conducting sub-structure 261 and the second conducting sub-structure 262 in the direction perpendicular to the touch sensor 01 can be reduced. For example, the first conducting sub-structure 261 and the second conducting sub-structure 262 can reduce the possibility of poor touch caused by electrostatic discharge (e.g., electrostatic breakdown).

For example, the first conducting structure 23, the second conducting structure 24, the third conducting structure 25 and the fourth conducting structure 26 are made of the same material (e.g., a metal material) and formed in the same patterning process, so that the structure and the manufacturing process of the touch sensor 01 can be simplified. For example, the first conducting structure 23, the second conducting structure 24, the third conducting structure 25 and the fourth conducting structure 26 are positioned in the same electrode layer, and in direct contact with the same film layer.

For example, the jumper conductor wire 21, the jumper conductor wire 22, the first conducting structure 23, the second conducting structure 24, the third conducting structure 25 and the fourth conducting structure 26 are made of the same material (e.g., a metal material) and formed in the same patterning process, so that the structure and the manufacturing process of the touch sensor 01 can be further simplified, and the increase of manufacturing cost of the touch sensor 01 is avoided. For example, the jumper conductor wire 21, the jumper conductor wire 22, the first conducting structure 23, the second conducting structure 24, the third conducting structure 25 and the fourth conducting structure 26 are all positioned in the second electrode layer 30 shown in FIG. 13. For example, the jumper conductor wire 21, the jumper conductor wire 22, the first conducting structure 23, the second conducting structure 24, the third conducting structure 25 and the fourth conducting structure 26 are all in contact with the same film layer (e.g., all in contact with the insulating layer 35 shown in FIG. 13).

For example, as shown in FIG. 24 to FIG. 29A, the jumper conductor wire 21, the jumper conductor wire 22, the first conducting structure 23, the second conducting structure 24, the third conducting structure 25 and the fourth conducting structure 26 are all implemented as conductors, but the embodiments of the present disclosure are not limited thereto. For example, line widths of the above-mentioned conductors are within a range of 3 microns to 8 microns (e.g., 5 microns).

For example, at least one (e.g., all) of the first conducting structure 23, the second conducting structure 24, the third conducting structure 25 and the fourth conducting structure 26 can be implemented as a sheet metal electrode structure. For example, an average width of the sheet metal electrode structures is greater than 30 microns (e.g., 50 microns, 100 microns or 200 microns). For example, by implementing at least one of the first conducting structure 23, the second conducting structure 24, the third conducting structure 25 and the fourth conducting structure 26 as the sheet metal electrode structure, the channel impedance of the region where the transition touch electrode corresponding to at least one of the first conducting structure 23, the second conducting structure 24, the third conducting structure 25 and the fourth conducting structure 26 is positioned can be further reduced, and the charge conductivity of the region where the transition touch electrode corresponding to at least one of the first conducting structure 23, the second conducting structure 24, the third conducting structure 25 and the fourth conducting structure 26 is positioned can be further improved, so that the possibility of poor touch, caused by electrostatic discharge (e.g., electrostatic breakdown), in the region where the transition touch electrode corresponding to at least one of the first conducting structure 23, the second conducting structure 24, the third conducting structure 25 and the fourth conducting structure 26 is positioned can be further reduced, and the reliability of the region where the transition touch electrode corresponding to at least one of the first conducting structure 23, the second conducting structure 24, the third conducting structure 25 and the fourth conducting structure 26 is positioned can be promoted.

In an example, the second conducting structure 24 may be arranged on an overall surface of the transition touch sub-electrode 152, and is of the same or similar shape with the transition touch sub-electrode 152; the third conducting structure 25 can be arranged on the overall surface of the transition touch sub-electrode 151, and is of the same or similar shape with the transition touch sub-electrode 151; and the fourth conducting structure 26 can be arranged on the overall surface of the transition touch electrode 16, and is of the same or similar shape with the transition touch electrode 16.

For example, the first conducting structure 23 may be arranged on the overall surface of the transition touch electrode 14, and is of the same or similar shape with the transition touch electrode 14. For another example, the transition touch electrode 14 includes a first portion corresponding to the active display region of the display apparatus 03 and a second portion corresponding to the inactive display region (refer to FIG. 24) of the display apparatus 03; and the first conducting structure 23 can be arranged on the overall surface of the second portion of the transition touch electrode 14. For example, as shown in FIG. 24, the active display region of the display apparatus 03 surrounds (e.g., fully surrounds) the inactive display region of the display apparatus 03. For example, as shown in FIG. 24, the inactive display region of the display apparatus 03 corresponds to the opening region 421, the opening region 422 and a region between the opening region 421 and the opening region 422, and surrounds a transitional region of the opening region 421 and the opening region 422 and a region for arranging the jumper conductor wires 21 and 22 and the first conducting structure 23. For example, the inactive display region of the display apparatus 03 is not used for forming the display image.

It should be noted that although the touch sensor 01 of the display apparatus 03 shown in FIG. 24 to FIG. 28, FIG. 29A, FIG. 29B and other drawings is simultaneously provided with the first conducting structure 23, the second conducting structure 24, the third conducting structure 25 and the fourth conducting structure 26, the embodiments of the present disclosure are not limited thereto. For example, according to practical application demands, the touch sensor 01 of the display apparatus 03 shown in FIG. 24 to FIG. 28, FIG. 29A, FIG. 29B and other drawings may also be provided with any one, any two or any three of the first conducting structure 23, the second conducting structure 24, the third conducting structure 25 and the fourth conducting structure 26.

It should be noted in that in the touch sensor 01 provided by at least one embodiment of the present disclosure, the disclosure is not limited to the case that the distance between the first position 1452 and the second position 1453 is less than the maximum width of at least one of the plurality of second touch sub-electrodes 121 in the first direction D1.

In some examples, the touch sensor 01 includes the opening region 421, a plurality of first touch electrodes 11, a plurality of second touch electrodes 12 and the conducting structure 23. The center 012 of the opening region 421 and the center 011 of the touch sensor 01 do not coincide; the plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the plurality of first touch sub-electrodes 111 and the plurality of second touch sub-electrodes 121 together at least partially surround the opening region 421; each of one group of second touch electrodes 12 in the plurality of second touch electrodes 12 further includes the transition touch electrode 14; the transition touch electrode 14 extends in the second direction D2, and partially surrounds the opening region 421 along the second direction D2; the touch sensor 01 includes the first region 411, the second region 412 and the third region 413 which are sequentially laid out in the second direction D2; at least part of the transition touch electrode 14 and the opening region 421 are positioned in the second region; the resistance of the transition touch electrode 14 is higher than that of the second touch sub-electrode 121 in the first region 411; and the conducting structure 23 is positioned on the surface of the transition touch electrode 14, at least partially surrounds the edge of the opening region 421, and is electrically connected with the transition touch electrode 14.

For example, the area of the first touch sub-electrode 111 in the first region 411 is less than that of the first touch sub-electrode 111 in the third region 413, or the area of the second touch sub-electrode 121 in the first region 411 is less than that of the second touch sub-electrode 121 in the third region 413.

For example, the resistance of the transition touch electrode 14 is higher than that of the second touch sub-electrode 121 in the third region 413.

In some examples, the touch sensor 01 includes a plurality of first touch electrodes 11, a plurality of second touch electrodes 12 and a crack blocking ring 2. The plurality of first touch electrodes 11 respectively extend along the first direction D1, and at least one of the plurality of first touch electrodes 11 includes a plurality of first touch sub-electrodes 111 arranged side by side in the first direction D1 and electrically connected with each other; the plurality of second touch electrodes 12 respectively extend along the second direction D2 intersecting with the first direction D1, and at least one of the plurality of second touch electrodes 12 includes a plurality of second touch sub-electrodes 121 arranged side by side in the second direction D2 and electrically connected with each other; the plurality of first touch electrodes 11 are arranged side by side along the second direction D2, and the plurality of second touch electrodes 12 are arranged side by side along the first direction D1; the touch sensor has the opening region 421, and a transitional region 424 and a touch functional region 423 which are sequentially laid out from the center of the opening region 421 to the outside; the center of the opening region 421 and the center of the touch sensor do not coincide; the touch functional region 423 surrounds the transitional region 424; the plurality of first touch electrodes 11 and the plurality of second touch electrodes 12 are positioned in the touch functional region 423; the plurality of first touch sub-electrodes 111 and the plurality of second touch sub-electrodes 121 together at least partially surround the opening region 421; and the crack blocking ring 27 is positioned in the transitional region 424 and at least partially surrounds the opening region 421. For example, by arranging the crack blocking ring 27 in the transitional region 424 of the touch sensor 01, the possibility that cracks formed by perforating the display apparatus extend to the touch functional region of the touch sensor 01 can be reduced, so that the possibility of poorness of the touch sensor 01 caused by the cracks can be reduced. Exemplary illustration will be carried out below in connection with FIG. 30 to FIG. 36, FIG. 26A and FIG. 26B.

Figure 30:
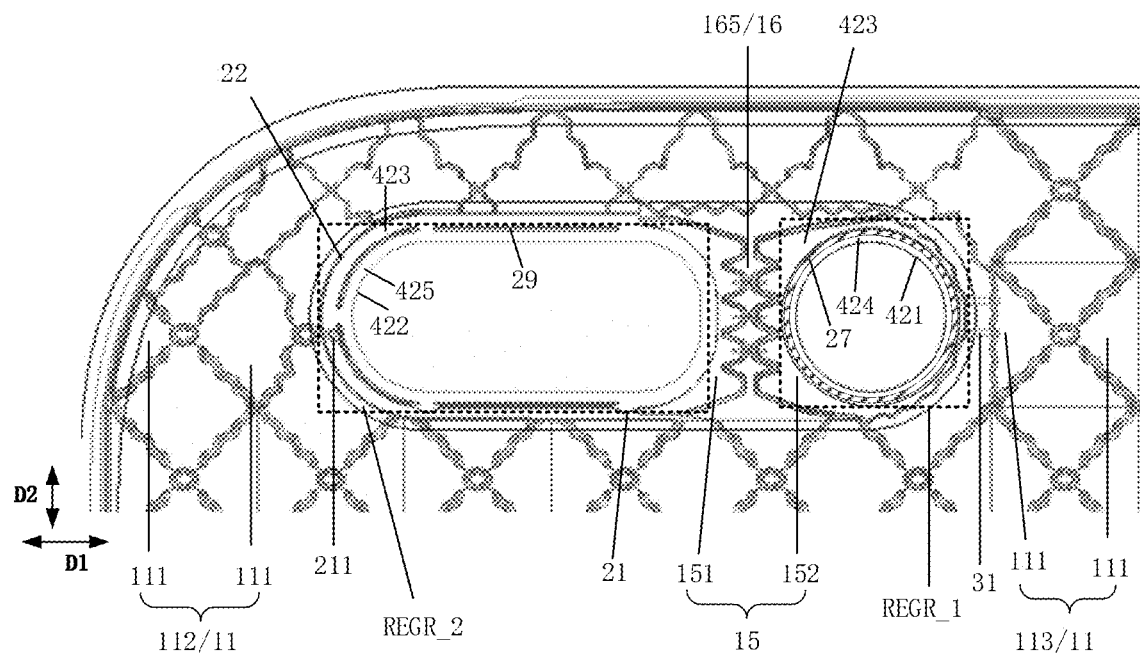
FIG. 30 is a related schematic diagram of the partial region included in the touch sensor of the display apparatus shown in FIG. 4.
Figure 31A:
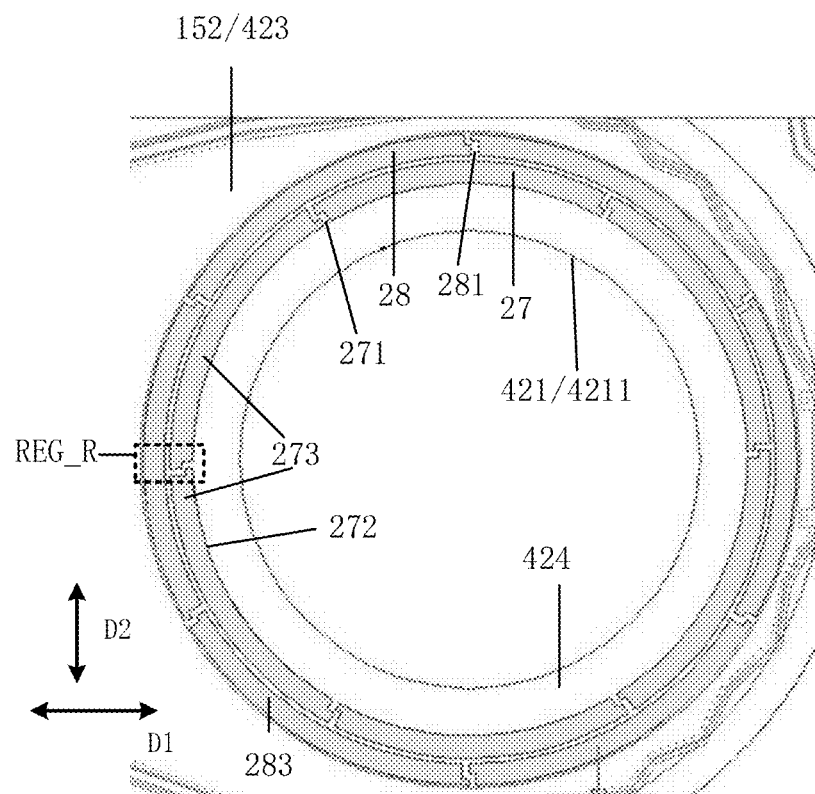
FIG. 31A is a plane schematic diagram of a partial region of the touch sensor shown in FIG. 30.
Figure 32:
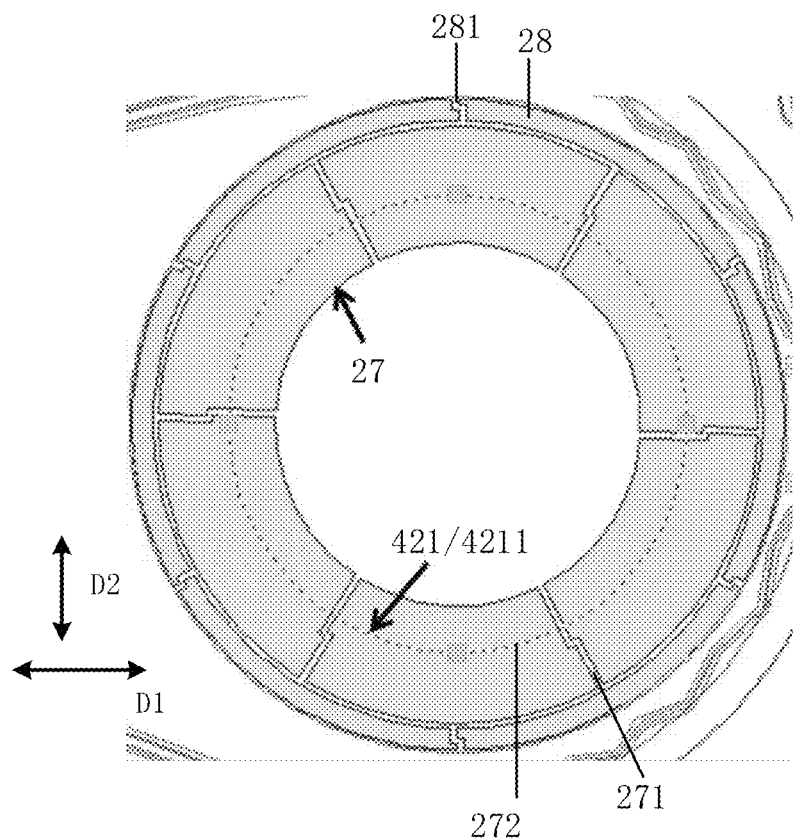
FIG. 32 is another plane schematic diagram of the partial region of the touch sensor shown in FIG. 30.
Figure 33:
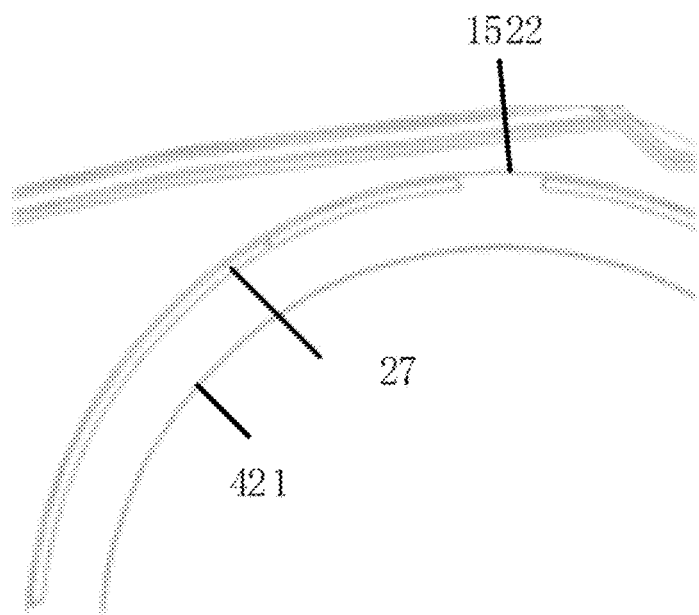
FIG. 33 is a plane schematic diagram of a portion of a crack blocking ring 27 provided by at least one embodiment of the present disclosure.

FIG. 30 is a related schematic diagram of the partial region REG1 included in the touch sensor 01 of the display apparatus 03 shown in FIG. 4; FIG. 31A is a plane schematic diagram of a partial region REGR1 of the touch sensor 01 shown in FIG. 30; FIG. 32 is another plane schematic diagram of the partial region REGR1 of the touch sensor 01 shown in FIG. 30; and FIG. 33 is a plane schematic diagram of a portion of the crack blocking ring 27 provided by at least one embodiment of the present disclosure.

For example, as shown in FIG. 30, the touch sensor 01 has the opening region 421, the opening region 422, the transitional region 424, a transitional region 425 and the touch functional region 423. For example, as shown in FIG. 30, the transitional region 424 and the touch functional region 423 are sequentially laid out from the center of the opening region 421 to the outside; the touch functional region 423 surrounds the transitional region 424; and the transitional region 424 surrounds the opening region 421. For example, the touch functional region 423 and the transitional region 424 are spaced from each other. For example, the touch functional region 423 and the transitional region 424 are spaced by an etching groove (which is not shown in FIG. 30, with reference to FIG. 26B) positioned between the touch functional region 423 and the transitional region 424.

For example, the touch functional region 423 is a region for arranging the touch electrode and the jumper conductor wire. For example, as shown in FIG. 30, the plurality of first touch electrodes 11, the plurality of second touch electrodes 12, the transition touch electrode 14, the transition touch electrode 15, the transition touch electrode 16, the jumper conductor wire 21 and the jumper conductor wire 22 are positioned in the touch functional region 423. For example, in the case that the touch sensor 01 is also provided with the first conducting structure 23, the second conducting structure 24, the third conducting structure 25 and the fourth conducting structure 26, the first conducting structure 23, the second conducting structure 24, the third conducting structure 25 and the fourth conducting structure 26 are respectively arranged on the corresponding transition touch electrodes, and thus, as shown in FIG. 30, FIG. 31A, FIG. 26B and FIG. 29B, the first conducting structure 23, the second conducting structure 24, the third conducting structure 25 and the fourth conducting structure 26 are also arranged in the touch functional region 423.

For example, as shown in FIG. 26B and FIG. 30 to FIG. 33, the crack blocking crack 27 is positioned in the transitional region 424 and at least partially surrounds (e.g., fully surrounds or partially surrounds) the opening region 421. for example, by arranging the crack blocking ring 27 at least partially surrounding the opening region 421 in the transitional region 424, the cracks caused by formation (laser cutting) of the opening region 421, can be inhibited from entering the touch functional region 423, so that poor touch caused by the crack can be inhibited.

For example, the crack blocking ring 27 is a metal ring. For example, metal has the excellent heat conduction characteristic, and by using the metal ring as the crack blocking ring 27, when laser perforation (laser cutting) is carried out on the display apparatus 03, a heat stress caused by laser can be reduced, and thus, the possibility of forming the cracks around the opening region 421 when laser perforation (laser cutting) is carried out on the display apparatus 03 can be reduced, so that an inhibiting effect of the crack blocking ring 27 on the cracks can be improved. For example, the metal has the excellent ductility characteristic, and thus, by using the metal ring as the crack blocking ring 27, the possibility that the cracks are further expanded in a subsequent laminating process can be reduced, so that the inhibiting effect of the crack blocking ring 27 on the cracks can be improved.

It should be noted that the crack blocking ring 27 shown in FIG. 30 is used for showing an approximate position of the crack blocking ring 27, but not used for limiting a specific position or a specific structure of the crack blocking ring 27. For example, examples of the specific position or the specific structure of the crack blocking ring 27 can refer to FIG. 31A to FIG. 33.

For example, as shown in FIG. 31A, an inner edge 272 of the crack blocking ring 27 surrounds the edge 4211 of the opening region 421, but the embodiments of the present disclosure are not limited thereto. In some examples, as shown in FIG. 32, the crack blocking ring 27 coincides with the edge 4211 of the opening region 421.

For example, as shown in FIG. 32, before the opening region 421 is formed (i.e., before perforation), a cutting line (i.e., corresponding to the edge 4211 of the opening region 421) surrounds an inner edge of a ring for forming the crack blocking ring 27; and after the opening region 421 is formed (i.e., after perforation), a portion of the ring positioned within the cutting line for forming the crack blocking ring 27 is cut off, and in such a case, the crack blocking ring 27 coincide with the edge 4211 of the opening region 421.

For example, the crack blocking ring 27 is a conducting ring, the crack blocking ring 27 has at least one fracture 271, and each of at least one fracture 271 has a tip; in such a case, electrostatic charges in a region of the touch sensor 01 corresponding to the crack blocking ring 27 can be discharged via the tip included in each of at least one fracture 271, so that the possibility of poor touch function caused by electrostatic breakdown in the active touch region around the opening region 421 can be reduced. For example, at least one fracture 271 is of a lightning shape, so that the electrostatic charges in the region of the touch sensor 01 corresponding to the crack blocking ring 27 can be discharged better. For example, the electrical conductivity of the crack blocking ring 27 is superior to those of the materials for forming the first touch sub-electrode 111 and the second touch sub-electrode 121, and in such a case, the electrostatic charges in the region of the touch sensor 01 corresponding to the crack blocking ring 27 can be discharged better.

For example, the crack blocking ring 27 has light shielding or light absorption performance, and in such a case, the crack blocking ring 27 can also reduce light emitted by a display panel and leaked into the opening region 421; and for example, in the case that a sensor (e.g., an imaging sensor) is arranged in the opening region 421, light incident to a light collecting surface of the sensor (e.g., the imaging sensor) can be reduced, so that a signal-to-noise ratio of an output signal (e.g., an image) of the sensor (e.g., the imaging sensor) can be increased.

For example, the crack blocking ring 27 is the metal ring. For example, the metal has the excellent electrical conductivity, and thus, by using the metal ring as the crack blocking ring 27, the electrostatic charges in the region of the touch sensor 01 corresponding to the crack blocking ring 27 can be discharged better; and the metal has light shielding performance, and thus, by using the metal ring as the crack blocking ring 27, the signal-to-noise ratio of the output image of the imaging sensor can also be increased.

For example, a ring width of the crack blocking ring 27 is greater than twice (e.g., six times, ten times, twenty times and thirty times) of the line width of the conductor (e.g., the jumper conductor wire 21 and the jumper conductor wire 21) included in the touch sensor 01. For example, the ring width of the crack blocking ring 27 is equal to 30 microns, 50 microns, 100 microns or 150 microns, but the embodiments of the present disclosure are not limited thereto. For example, by making the ring width of the crack blocking ring 27 greater than six times of the line width of the conductor (e.g., the jumper conductor wire 21 and the jumper conductor wire 21) included in the touch sensor 01, the crack blocking ability of the crack blocking ring 27 can be improved.

For example, the ring width of the crack blocking ring 27 is 0.004 millimeter to 0.9 millimeter. For example, as shown in FIG. 31A, the crack blocking ring 27 has at least two fractures 271; and at least two fractures 271 separate the crack blocking ring 27 into at least two blocking ring sub-portions 273 in a circumferential direction of the crack blocking ring 27.

Figure 31B:
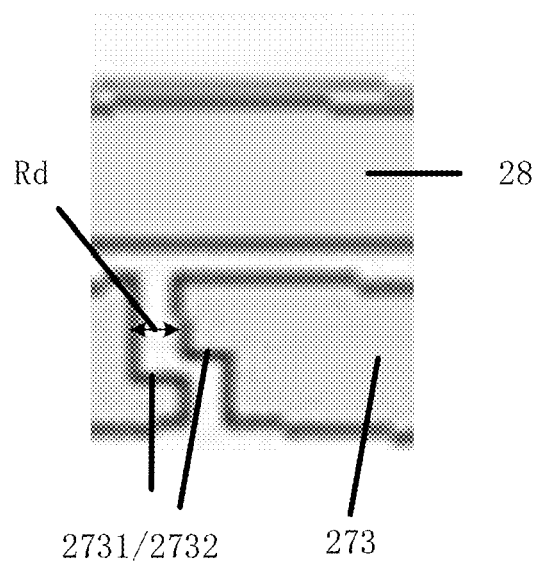
FIG. 31B is an enlarged diagram of a partial region REG_R shown in FIG. 30.

FIG. 31B is an enlarged diagram of a partial region REG_R shown in FIG. 30. It should be noted that for clarity, FIG. 31B carries out rotation treatment on the partial region REG_R shown in FIG. 30. For example, as shown in FIG. 31B, the distance Rd between adjacent edges of adjacent end portions of the at least two blocking ring sub-portions 273 in the circumferential direction of the crack blocking ring 27 is 0.008 millimeter to 0.030 millimeter. For example, as shown in FIG. 31B, the end portion of each of the at least two blocking ring sub-portions 273 in the circumferential direction of the crack blocking ring 27 has a step structure 2731. For example, the size of the step surface 2732 of the step structure 2731 in the circumferential direction of the crack blocking ring 27 is 0.004 millimeter to 0.015 millimeter.

For example, as shown in FIG. 31A and FIG. 32, the touch sensor 01 further includes a crack blocking ring 28 at least partially surrounding the crack blocking ring 27 and separated from the crack blocking ring 27, and the crack blocking ring 28 is positioned in the transitional region 424. For example, by enabling the touch sensor to further include the crack blocking ring 28 surrounding the crack blocking ring 27 and separated from the crack blocking ring 27, the possibility that the cracks formed when perforation is carried out on the display apparatus extend to the touch functional region of the touch sensor 01 can be further reduced, so that the possibility of poorness of the touch sensor 01 caused by the cracks can be further reduced.

For example, as shown in FIG. 31A and FIG. 32, the crack blocking ring 28 has at least one fracture 281, and at least one fracture 281 includes a tip. For example, the crack blocking ring 28 is a conducting ring (e.g., a metal ring). For example, by enabling the crack blocking ring 28 to be the conducting ring and enabling the crack blocking ring 28 to have at least one fracture 281, electrostatic charges accumulated in a region of the touch sensor 01 corresponding to the crack blocking ring 28 can be discharged via the tip included in the fracture 281, so that the possibility of poor touch function caused by electrostatic breakdown in the active touch region around the opening region 421 can be further reduced.

For example, at least one fracture 281 is of a lightning shape, so that the electrostatic charges in the region of the touch sensor 01 corresponding to the crack blocking ring 28 can be discharged better. For example, the electrical conductivity of the crack blocking ring 28 is superior to those of the materials for forming the first touch sub-electrode 111 and the second touch sub-electrode 121, and in such a case, the electrostatic charges in the region of the touch sensor 01 corresponding to the crack blocking ring 28 can be discharged better.

For example, as shown in FIG. 31A and FIG. 32, the fracture 271 and the fracture 281 are staggered mutually; and in such a case, the possibility that the cracks extend to the touch functional region of the touch sensor 01 via the fracture 271 and the fracture 281 can be avoided, so that the possibility of poorness of the touch sensor 01 caused by the cracks can be further reduced.

For example, as shown in FIG. 31A, a ring width of the crack blocking ring 28 is equal to that of the crack blocking ring 27, but the embodiments of the present disclosure are not limited thereto. For another example, as shown in FIG. 32, the ring width of the crack blocking ring 28 is less than that of the crack blocking ring 27.

For example, the ring width of the crack blocking ring 28 is 0.004 millimeter to 0.9 millimeter. For example, the distance between an inner edge of the crack blocking ring 28 and an outer edge of the crack blocking ring 27 in a radial direction of the crack blocking ring 27 is 0.004 millimeter to 0.1 millimeter. For example, as shown in FIG. 31A, the crack blocking ring 28 has at least two fractures 281; and at least two fractures 281 separate the crack blocking ring 28 into at least two blocking ring sub-portions 283 in a circumferential direction of the crack blocking ring 28. For example, as shown in FIG. 31A, an end portion of each of the at least two blocking ring sub-portions 283 in the circumferential direction of the crack blocking ring 28 has a step structure.

For example, as shown in FIG. 31A to FIG. 33, the edge 4211 of the opening region 421 is of a circle shape, the crack blocking ring 27 and the crack blocking ring 28 integrally are of a circular ring shape, but the embodiments of the present disclosure are not limited thereto; and for example, according to practical application demands, the edge 4211 of the opening region 421 is of a racetrack shape or other applicable shapes, and the crack blocking ring 27 and the crack blocking ring 28 can also integrally be of a racetrack shape or other applicable shapes.

It should be noted that the disclosure is not limited to the case that one or two crack blocking rings are arranged in the transitional region 424, and according to practical application demands, three or other applicable numbers of crack blocking rings can also be arranged in the transitional region 424.

Figure 34:
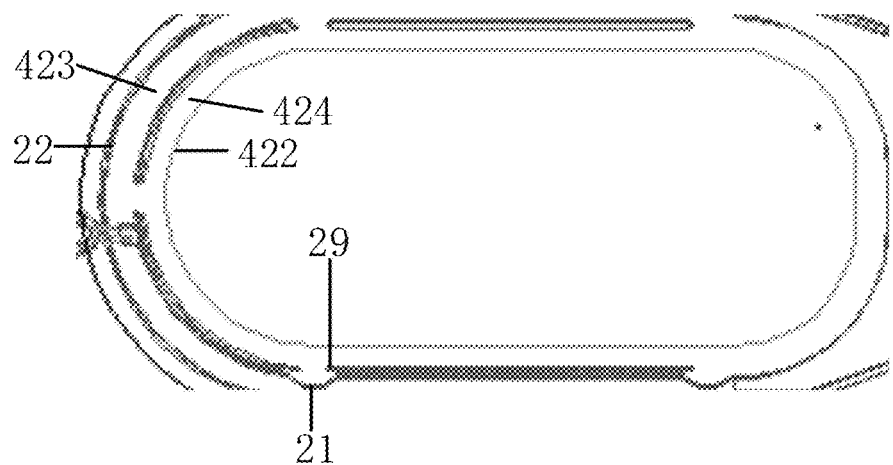
FIG. 34 is a plane schematic diagram of a partial region of the touch sensor shown in FIG. 30.
Figure 35:
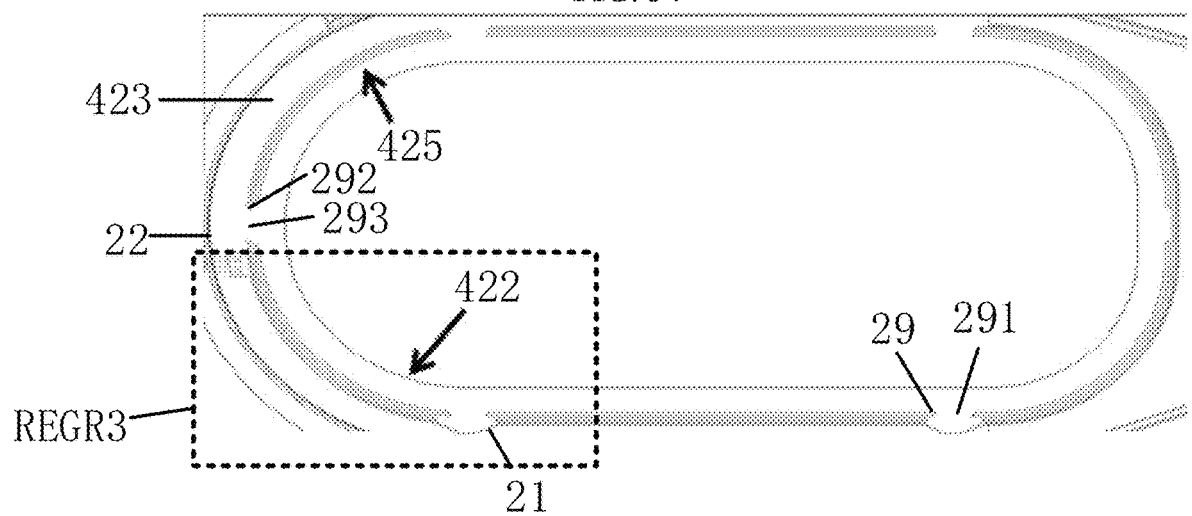
FIG. 35 is another plane schematic diagram of the partial region of the touch sensor shown in FIG. 30.

FIG. 34 is a plane schematic diagram of a partial region REGR2 of the touch sensor 01 shown in FIG. 30; FIG. 35 is another plane schematic diagram of the partial region REGR2 of the touch sensor 01 shown in FIG. 30; and FIG. 36 is a plane schematic diagram of a partial region REGR3 of the touch sensor 01 shown in FIG. 35.

For example, as shown in FIG. 30, FIG. 34 and FIG. 35, the transitional region 425 and the touch functional region 423 are sequentially laid out from the center of the opening region 422 to the outside. For example, as shown in FIG. 30, FIG. 34 and FIG. 35, the touch sensor 01 further includes a crack blocking ring 29 positioned in the transitional region 425. For example, as shown in FIG. 30, FIG. 34 and FIG. 35, the edge of the opening region 422 is of a racetrack shape; the crack blocking ring 29 is at least part of the racetrack shape, but the embodiments of the present disclosure are not limited thereto; and for example, according to practical application demands, the edge of the opening region 422 is of a circle shape or other applicable shapes, and the crack blocking ring 29 can also integrally be of a circular ring shape or other applicable shapes.

For example, the crack blocking ring 29 is a conducting ring (e.g., a metal ring); as shown in FIG. 30, FIG. 34 and FIG. 35, the crack blocking ring 29 includes at least one fracture 291, and at least one fracture 291 has a tip; and in such a case, the electrostatic charges in a region of the touch sensor 01 corresponding to the crack blocking ring 29 can be discharged via the tip included in the fracture 291, so that the possibility of poor touch function caused by electrostatic breakdown in the active touch region around the opening region 421 can be further reduced. For example, at least one fracture 291 is of a lightning shape, so that the electrostatic charges in the region of the touch sensor 01 corresponding to the crack blocking ring 29 can be discharged better. For example, the electrical conductivity of the crack blocking ring 29 is superior to those of the materials for forming the first touch sub-electrode 111 and the second touch sub-electrode 121, and in such a case, the electrostatic charges in the region of the touch sensor 01 corresponding to the crack blocking ring 29 can be discharged better. For example, the crack blocking ring 29 can have shielding or light blocking performance, and in such a case, the crack blocking ring 29 can also reduce the light emitted by the display panel and leaked into the opening region 422; and for example, in the case that a sensor (e.g., an imaging sensor) is arranged in the opening region 422, light incident to a light collecting surface of the sensor (e.g., the imaging sensor) can be reduced, so that a signal-to-noise ratio of an output signal (e.g., an image) of the sensor (e.g., the imaging sensor) can be increased.

For example, as shown in FIG. 30, FIG. 34 and FIG. 35, the crack blocking ring 29 partially surrounds the opening region 422, and is arranged in parallel with the transition touch sub-electrode 151 in the first direction D1.

In an example, as shown in FIG. 34, the crack blocking ring 29 and the transition touch sub-electrode 151 do not overlap in the second direction D2. In another example, as shown in FIG. 35, the crack blocking ring 29 is partially arranged between the opening region 422 and the transition touch sub-electrode 151, and the crack blocking ring 29 and the transition touch sub-electrode 151 at least partially overlap in the second direction D2.

For example, as shown in FIG. 30 and FIG. 34 to FIG. 36, the touch sensor 01 further includes a crack blocking ring 292 positioned in the transitional region 425 and at least partially surrounding the crack blocking ring 29. For example, as shown in FIG. 30, FIG. 34 and FIG. 35, the crack blocking ring 292 integrally is a racetrack-shaped ring. For example, as shown in FIG. 30, FIG. 34 and FIG. 35, the crack blocking ring 292 has a fracture 293, and the fracture 293 and the fracture 291 correspond to each other. For example, the crack blocking ring 292 is a conducting ring (e.g., a metal ring). For example, ring widths of the crack blocking ring 29 and the crack blocking ring 292 are 0.004 millimeter to 0.9 millimeter. For example, a distance between an inner edge of the crack blocking ring 292 and an outer edge of the crack blocking ring 29 is 0.004 millimeter to 0.1 millimeter.

For example, as shown in FIG. 30 and FIG. 34 to FIG. 36, in a radial direction of the opening region 422, at least one jumper conductor wire 21 is positioned between the jumper conductor wire 22 and the crack blocking ring 29. For example, as shown in FIG. 30 and FIG. 34 to FIG. 36, in the radial direction of the opening region 422, at least one jumper conductor wire 21 is positioned between the jumper conductor wire 22 and the crack blocking ring 292.

For example, the crack blocking ring (e.g., at least one of the crack blocking ring 27, the crack blocking ring 28, the crack blocking ring 29 and the crack blocking ring 292) and the jumper conductor wire (e.g., at least one of the jumper conductor wire 21 and the jumper conductor wire 22) are positioned in the same electrode layer (e.g., the second electrode layer 30), and are in direct contact with the same film layer.

For example, the crack blocking ring (e.g., at least one of the crack blocking ring 27, the crack blocking ring 28, the crack blocking ring 29 and the crack blocking ring 292) and the jumper conductor wire (e.g., at least one of the jumper conductor wire 21 and the jumper conductor wire 22) are made of the same material (e.g., the metal material) and formed in the same patterning process, so that the structure and the manufacturing process of the touch sensor 01 can be further simplified, and the increase of manufacturing cost of the touch sensor 01 is avoided.

Several points below need to be illustrated.

(1) It is not limited to the case that one or two crack blocking rings are arranged in the transitional region 425, and according to practical application demands, three or other applicable numbers of crack blocking rings can also be arranged in the transitional region 425.

(2) Although the crack blocking rings are arranged in both the transitional region 424 and the transitional region 425 of the touch sensor shown in FIG. 30, the embodiments of the present disclosure are not limited thereto. According to practical application demands, the crack blocking ring can also be not arranged in at least one of the transitional region 424 and the transitional region 425.

(3) For clarity, the crack blocking ring is not shown in the transitional region 424 of the touch sensor 01 of the display apparatus 03 shown in FIG. 6A to FIG. 9, FIG. 14A and FIG. 24, but those skilled in the art can understand that an applicable number of crack blocking rings with applicable shapes can be arranged in the transitional region 424 of the touch sensor 01 of the display apparatus 03 shown in FIG. 6A to FIG. 9, FIG. 14A and FIG. 24 according to practical application demands.

(4) Although the jumper conductor wires (the jumper conductor wires 21 and 22), the transition touch electrodes (the transition touch electrodes 15 and 16), the conducting structures (the first conducting structure 23, the second conducting structure 24, the third conducting structure 25 and the fourth conducting structure 26) and the crack blocking rings (the crack blocking rings 27, 28 and 29) are simultaneously arranged in the partial region REG1 included in the touch sensor 01 of the display apparatus 03 shown in FIG. 30 and the first region (the two-bridge design is adopted, the intersecting depth is increased, and the number of the dummy electrodes is reduced) of the touch sensor 01 are optimized, the embodiments of the present disclosure are not limited thereto. For example, according to practical application demands, for the touch sensor 01, only the first region of the touch sensor 01 may be optimized, but the jumper conductor wire, the transition touch electrode, the conducting structure and the crack blocking ring are not arranged; and for another example, according to practical application demands, for the touch sensor 01, the first region of the touch sensor 01 may be not optimized, but at least part (e.g., one to four) of the jumper conductor wire, the transition touch electrode, the conducting structure and the crack blocking ring are arranged.

For example, at least one embodiment of the present disclosure further provides a touch structure. As shown in FIG. 21 and FIG. 22A, the touch structure includes: the transition touch electrode 15 and the transition touch electrode 16. The transition touch electrode 15 includes the transition touch sub-electrode 151 and the transition touch sub-electrode 152 arranged side by side in the first direction D1 and electrically connected with each other; the transition touch electrode 16 is at least partially positioned between the transition touch sub-electrode 151 and the transition touch sub-electrode 152; the edge of the transition touch electrode 16 close to the transition touch sub-electrode 151 includes a plurality of first protruding portions 161 protruding towards the transition touch sub-electrode 151; the edge of the transition touch electrode 16 close to the transition touch sub-electrode 152 includes a plurality of second protruding portions 162 protruding towards the transition touch sub-electrode 152; the edge of the transition touch sub-electrode 151 close to the transition touch electrode 16 includes a plurality of first sunk portions 1511; the edge of the transition touch sub-electrode 152 close to the transition touch electrode 16 includes a plurality of second sunk portions 1521; the plurality of first protruding portions 161 are correspondingly arranged in the plurality of first sunk portions 1511; and the plurality of second protruding portions 162 are correspondingly arranged in the plurality of second sunk portions 1521.

For example, as shown in FIG. 21 and FIG. 22A, the first edge of the opening region 422 facing the opening region 421 is of the first shape; the second edge of the opening region 421 facing the opening region 422 is of the second shape; the edge of the transition touch sub-electrode 151 facing the first edge integrally is also of the first shape; the edge of the transition touch sub-electrode 152 facing the second edge integrally is also of the second shape; namely, the first edge of the opening region 422 facing the opening region 421 and the edge of the transition touch sub-electrode 151 facing the first edge are of the same shape (e.g., different in size); and the second edge of the opening region 421 facing the opening region 422 and the edge of the transition touch sub-electrode 152 facing the second edge are of the same shape (e.g., different in size).

For example, as shown in FIG. 21 and FIG. 22A, the plurality of first protruding portions 161 are arranged side by side in the second direction D2; the plurality of second protruding portions 162 are arranged side by side in the second direction D2; the edge of the transition touch electrode 16 close to the transition touch sub-electrode 151 further includes a plurality of third sunk portions 163; the edge of the transition touch electrode 16 close to the transition touch sub-electrode 152 further includes a plurality of fourth sunk portions 164; there is one third sunk portion 163 between two adjacent first protruding portions 161, and there is one fourth sunk portion 164 between two adjacent second protruding portions 162; the bottom of the third sunk portion 163 and the bottom of the fourth sunk portion 164 correspond to each other; and the distance between the bottom of the third sunk portion 163 and the bottom of the fourth sunk portion 164 in the first direction D1 is less than the size of any one of the plurality of first protruding portions 161 and the plurality of second protruding portions 162 in the first direction D1. It should be noted that the specific implementation mode and the technical effects of the touch structure provided by at least one embodiment of the present disclosure can refer to the examples shown in FIG. 21 and FIG. 22A, and are not repeated herein for simplicity.

For example, the opening region 421 or 422 is an example of the first opening region according to at least one embodiment of the present disclosure; the electrode portion 124 (or 126) is an example of a first electrode portion according to at least one embodiment of the present disclosure; the electrode portion 125 (or 127) is an example of a second electrode portion according to at least one embodiment of the present disclosure; the connecting sub-electrode 32 is an example of a first connecting sub-electrode according to at least one embodiment of the present disclosure; the connecting sub-electrode 31 is an example of a second connecting sub-electrode according to at least one embodiment of the present disclosure; the dummy electrode 132 is an example of the dummy electrode according to at least one embodiment of the present disclosure; and the bent structure 131 is an example of the bent structure according to at least one embodiment of the present disclosure.

Although the present disclosure has been described above in great detail with general descriptions and specific embodiments, on the basis of the embodiments of the present disclosure, some changes or improvements may be made, which is apparent to those skilled in the art. Therefore, all such changes or improvements without departing from the spirit of the present disclosure are within the scope requested to be protected by the present disclosure. The foregoing embodiments merely are exemplary embodiments of the present disclosure, and not intended to define the scope of protection of the present disclosure, and the scope of protection of the present disclosure is determined by the appended claims.

What is claimed is:

1. A touch sensor, comprising: a first opening region, a plurality of first touch electrodes and a plurality of second touch electrodes,
    wherein a center of the first opening region and a center of the touch sensor do not coincide;
    the plurality of first touch electrodes respectively extend along a first direction, and at least one of the plurality of first touch electrodes comprises a plurality of first touch sub-electrodes arranged side by side in the first direction and electrically connected with each other;
    the plurality of second touch electrodes respectively extend along a second direction intersecting with the first direction, and at least one of the plurality of second touch electrodes comprises a plurality of second touch sub-electrodes arranged side by side in the second direction and electrically connected with each other;
    the plurality of first touch electrodes are arranged side by side along the second direction, and the plurality of second touch electrodes are arranged side by side along the first direction; and
    the plurality of first touch sub-electrodes and the plurality of second touch sub-electrodes together at least partially surround the first opening region;
    the touch sensor has a first region, a second region and a third region which are sequentially laid out in the second direction,
    the first opening region is positioned in the second region; and
    an area of a first touch sub-electrode in the first region is less than that of a first touch sub-electrode in the third region, or an area of a second touch sub-electrode in the first region is less than that of a second touch sub-electrode in the third region;
    the at least one of the plurality of second touch electrodes is separated into a first electrode portion and a second electrode portion by the second region;
    the first electrode portion is positioned in the first region, and the second electrode portion is positioned in the third region; and
    a maximum size of the first electrode portion in the second direction is less than a maximum size of the second electrode portion in the second direction.

2. The touch sensor according to claim 1, wherein the size of the first electrode portion in the second direction is less than the size of the second touch sub-electrode, positioned in the third region and having a maximum size, in the second direction.

3. The touch sensor according to claim 1, wherein a distance between two adjacent second touch sub-electrodes in the first region in the second direction is less than a distance between two adjacent second touch sub-electrodes in the third region in the second direction.

4. The touch sensor according to claim 1, further comprising a first electrode layer and a connecting electrode layer,
    wherein the first electrode layer is different from the connecting electrode layer;
    the first electrode layer comprises the plurality of first touch electrodes, the plurality of second touch electrodes and a plurality of intermediate sub-electrodes;
    the connecting electrode layer comprises a plurality of first connecting sub-electrodes;
    at least one of the plurality of intermediate sub-electrodes is positioned in the third region, and arranged between two adjacent second touch sub-electrodes in the third region;

both ends of each first connecting sub-electrode in the third region are respectively, electrically connected with one corresponding second touch sub-electrode and one corresponding intermediate sub-electrode; and both ends of each first connecting sub-electrode in the first region are respectively, electrically connected with two adjacent second touch sub-electrodes.

5. The touch sensor according to claim 4, wherein an area of each first connecting sub-electrode in the first region is greater than an area of each first connecting sub-electrode in the third region.

6. The touch sensor according to claim 4, wherein a length of each first connecting sub-electrode in the first region is greater than a length of each first connecting sub-electrode in the third region.

7. The touch sensor according to claim 6, wherein a width of each first connecting sub-electrode in the first region is greater than a width of each first connecting sub-electrode in the third region.

8. The touch sensor according to claim 4, wherein the plurality of second touch electrodes comprise the plurality of first connecting sub-electrodes.

9. The touch sensor according to claim 4, wherein the first electrode layer further comprises a plurality of ring-shaped sub-electrodes;

at least one of the plurality of ring-shaped sub-electrodes is positioned in the third region;

at least one of the plurality of ring-shaped sub-electrodes is positioned between two adjacent first touch sub-electrodes, and surrounds an intermediate sub-electrode positioned between the two adjacent first touch sub-electrodes;

the connecting electrode layer further comprises a plurality of second connecting sub-electrodes;

in the plurality of first touch electrodes in the third region, two adjacent first touch sub-electrodes are electrically connected with each other via a ring-shaped sub-electrode positioned between the two adjacent first touch sub-electrodes and a corresponding third number of second connecting sub-electrodes; and two adjacent first touch sub-electrodes which at least one first touch electrode in the first region comprises are of an integrated structure and are directly, electrically connected.

10. The touch sensor according to claim 9, wherein the corresponding third number of second connecting sub-electrodes are arranged in two rows and two columns;

two first connecting sub-electrodes in a same column in the corresponding third number of second connecting sub-electrodes are used for electrically connecting one corresponding first touch sub-electrode and one corresponding ring-shaped sub-electrode;

extending directions of two first connecting sub-electrodes in a same column in the corresponding third number of second connecting sub-electrodes intersect with each other; and extending directions of two first connecting sub-electrodes in the same row in the corresponding third number of second connecting sub-electrodes intersect with each other.

11. The touch sensor according to claim 9, wherein the plurality of first touch electrodes comprise at least part of the plurality of second connecting sub-electrodes.

12. The touch sensor according to claim 1, wherein edges of the first touch sub-electrode and the second touch sub-electrode that are adjacent respectively have corresponding bent structures;

the first touch sub-electrode and the second touch sub-electrode that are adjacent in the first region intersect with each other and have a first intersecting depth;

the first touch sub-electrode and the second touch sub-electrode that are adjacent in the third region intersect with each other and have a second intersecting depth; and the first intersecting depth is greater than the second intersecting depth.

13. The touch sensor according to claim 1, comprising: a first opening region, a plurality of first touch electrode and a plurality of second touch electrodes, wherein a center of the first opening region and a center of the touch sensor do not coincide;

the plurality of first touch electrodes respectively extend along a first direction, and at least one of the plurality of first touch electrodes comprises a plurality of first touch sub-electrodes arranged side by side in the first direction and electrically connected with each other;

the plurality of second touch electrodes respectively extend along a second direction intersecting with the first direction, and at least one of the plurality of second touch electrodes comprises a plurality of second touch sub-electrodes arranged side by side in the second direction and electrically connected with each other;

the plurality of first touch electrodes are arranged side by side along the second direction, and the plurality of second touch electrodes are arranged side by side along the first direction; and the plurality of first touch sub-electrodes and the plurality of second touch sub-electrodes together at least partially surround the first opening region;

the touch sensor has a first region, a second region and a third region which are sequentially laid out in the second direction, the first opening region is positioned in the second region; and a distance between a first touch sub-electrode and a second touch sub-electrode that are adjacent in the first region is less than a distance between a first touch sub-electrode and a second touch sub-electrode that are adjacent in the third region.

14. The touch sensor according to claim 1, comprising: a first opening region, a plurality of first touch electrodes, a plurality of second touch electrodes and a plurality of first connecting sub-electrodes, wherein a center of the first opening region and a center of the touch sensor do not coincide;

the plurality of first touch electrodes respectively extend along a first direction, and at least one of the plurality of first touch electrodes comprises a plurality of first touch sub-electrodes arranged side by side in the first direction and electrically connected with each other;

the plurality of second touch electrodes respectively extend along a second direction intersecting with the first direction, and at least one of the plurality of second touch electrodes comprises a plurality of second touch sub-electrodes arranged side by side in the second direction and electrically connected with each other;

the plurality of first touch electrodes are arranged side by side along the second direction, and the plurality of second touch electrodes are arranged side by side along the first direction; and the plurality of first touch sub-electrodes and the plurality of second touch sub-electrodes together at least partially surround the first opening region;

the touch sensor has a first region, a second region and a third region which are sequentially laid out in the second direction, the first opening region is positioned in the second region;

adjacent second touch sub-electrodes in the first region are electrically connected via a corresponding first number of first connecting sub-electrodes; and adjacent second touch sub-electrodes in the third region are electrically connected via a corresponding second number of first connecting sub-electrodes, and the second number is greater than the first number.

15. The touch sensor according to claim 14, wherein two adjacent second touch sub-electrodes in the first region are electrically connected via two corresponding first connecting sub-electrodes arranged side by side in the first direction;

two adjacent second touch sub-electrodes in the third region are electrically connected via four corresponding first connecting sub-electrodes;

the four corresponding first connecting sub-electrodes are arranged in two rows and two columns;

two first connecting sub-electrodes in a same row in the four corresponding first connecting sub-electrodes are electrically connected with one corresponding second touch sub-electrode and one corresponding intermediate sub-electrode;

extending directions of two first connecting sub-electrodes in a same column in the four corresponding first connecting sub-electrodes intersect with each other; and extending directions of two first connecting sub-electrodes in the same row in the four corresponding first connecting sub-electrodes intersect with each other.

16. A display apparatus, comprising the touch sensor according to claim 1.

17. The display apparatus according to claim 16, further comprising an imaging sensor and a display panel, wherein the touch sensor, the display panel and the imaging sensor are sequentially arranged in a normal direction of a display surface of the display apparatus, and the imaging sensor is positioned on a non-display side of the display panel;

the touch sensor and the display panel respectively have opening regions; and the imaging sensor is configured to receive and process an optical signal passing through the first opening region of the touch sensor and the opening region of the display panel.

18. A touch sensor, comprising: a first opening region, a plurality of first touch electrodes and a plurality of second touch electrodes, wherein a center of the first opening region and a center of the touch sensor do not coincide;

the plurality of first touch electrodes respectively extend along a first direction, and at least one of the plurality of first touch electrodes comprises a plurality of first touch sub-electrodes arranged side by side in the first direction and electrically connected with each other;

the plurality of second touch electrodes respectively extend along a second direction intersecting with the first direction, and at least one of the plurality of second touch electrodes comprises a plurality of second touch sub-electrodes arranged side by side in the second direction and electrically connected with each other;

the plurality of first touch electrodes are arranged side by side along the second direction, and the plurality of second touch electrodes are arranged side by side along the first direction; and the plurality of first touch sub-electrodes and the plurality of second touch sub-electrodes together at least partially surround the first opening region;

the touch sensor has a first region, a second region and a third region which are sequentially laid out in the second direction, the first opening region is positioned in the second region; and an area of a first touch sub-electrode in the first region is less than that of a first touch sub-electrode in the third region, or an area of a second touch sub-electrode in the first region is less than that of a second touch sub-electrode in the third region;

the touch sensor further comprises a plurality of dummy electrodes, at least one of the plurality of dummy electrodes is arranged between the first touch sub-electrode and the second touch sub-electrode that are adjacent; and a number of the dummy electrodes between the first touch sub-electrode and the second touch sub-electrode that are adjacent in the first region is less than a number of the dummy electrodes between the first touch sub-electrode and the second touch sub-electrode that are adjacent in the third region.

19. The touch sensor according to claim 18, wherein a width of the dummy electrode between the first touch sub-electrode and the second touch sub-electrode that are adjacent in the first region is less than or equal to a width of the dummy electrode between the first touch sub-electrode and the second touch sub-electrode that are adjacent in the third region.

* * * * *